United States Patent [19]

Campbell, Jr. et al.

[11] 4,404,636

[45] Sep. 13, 1983

[54] PHASOR IMPEDANCE MEASURING TEST SET

[75] Inventors: Richard H. Campbell, Jr., Gilford; John B. Noyes, Laconia, both of N.H.

[73] Assignee: Wilcom Products, Inc., Laconia, N.H.

[21] Appl. No.: 252,260

[22] Filed: Apr. 8, 1981

[51] Int. Cl.$^3$ ............................................. G01R 27/00
[52] U.S. Cl. ................................. 364/482; 324/57 R; 324/62
[58] Field of Search .............................. 364/480-483, 364/550, 551; 324/62, 57 R; 333/17 M, 32, 124; 179/175.1 R, 175.3 R, 175.31 R, 174, 80, 78 R, 78 A

[56] References Cited

U.S. PATENT DOCUMENTS

| | | | |
|---|---|---|---|
| 3,284,705 | 11/1966 | Dobson | 324/57 |
| 3,624,496 | 11/1971 | Feinstein | 324/71 R |
| 3,678,379 | 7/1972 | Arvay et al. | 324/57 R |
| 3,786,349 | 1/1974 | Devenyi | 324/57 R |
| 3,904,859 | 9/1975 | Poncelet | 324/57 R |
| 3,986,108 | 10/1976 | Thomas | 324/60 |
| 4,013,949 | 3/1977 | Ice | 324/62 |
| 4,196,475 | 4/1980 | Hall | 324/57 R |

OTHER PUBLICATIONS

*Telephone Engineer & Management*, "The ABC's of ... Cable Fault Locating".
Cable Analyzer by Micro Computer Systems, Inc., Greensboro, N.C.

*Primary Examiner*—Gary Chin
*Attorney, Agent, or Firm*—Arnold, White & Durkee

[57] ABSTRACT

Test set apparatus for measuring the phasor impedance of a circuit under test, such as a telephone line. The test set apparatus also calculates for display the return loss of a circuit under test, against predetermined values of resistance or certain RC networks.

To measure phasor impedance, the test set apparatus includes a signal generator providing a measurement frequency signal to a constant current source having an individual battery power source. The current source is connectable to measurement terminals, which provide for connection of a circuit under test, and produces measurement current flow through the circuit under test. During an impedance measurement, the battery-powered current source is connected to the measurement terminals and isolated from ground, thereby permitting operation of the test set apparatus to measure the impedance to a balanced circuit in the presence of externally-induced longitudinal voltages.

6 Claims, 7 Drawing Figures

PHASOR IMPEDANCE MEASURING TEST SET

BACKGROUND OF THE INVENTION

The present invention relates to test set apparatus for analyzing circuit characteristics. More particularly, it relates to phasor impedance measuring test set apparatus for use in making measurements on electrical circuits including cable transmission systems, particularly telephone communication cables.

Telephone cable and communication network circuit analysis, including performance evaluation, troubleshooting of existing installations and acceptance testing of new installations for faults, is greatly facilitated by having knowledge of the electrical impedance and return loss looking into the two-wire ports of the cable or network circuit. For example, testing of subscriber loop performance is facilitated by having knowledge of the impedance on subscriber loops looking out from the central office.

Traditionally, the telephone industry has utilized return loss measurements as the accepted characteristic to quantify the impact of impedance mismatches on the design and operation of communications circuits and networks. Return loss is a measure of the signal power that will be reflected at a point of impedance discontinuity along a transmission path. In effect, return loss in one measure of the efficiency of signal propagation at impedance mismatches. For example, if the return loss at a selected point along a transmission line is 10 dB, then one-tenth of the incident signal power that appears at that point will be reflected toward the source; that is, "returned" toward the originating point. Nine-tenths or 90% of the incident signal power will propagate beyond the point of impedance mismatch.

Return loss measurements, although related to impedance, do not give an indication of the actual impedance values occurring at the point under consideration. The telephone industry has adopted measurement of return loss in their standard methods primarily because of the lack of practical instrumentation to measure impedance directly. Existing apparatus for measuring impedance have been in the form of balanced bridges, such as the familiar Wheatstone bridge, or other similar apparatus, such as level tracer instruments. These types of apparatus have been too time-consuming to use and lacked the ability to measure impedance in the presence of unwanted signals that normally occur on practical telecommunications circuits.

Accordingly, there has developed a need for improved test set apparatus for measuring impedance, which is suitable for use in telephone cable and network circuit analysis testing.

SUMMARY OF THE INVENTION

The present invention provides a test set instrument for analyzing the characteristics of a circuit. Specifically, a test set is provided for measuring the phasor impedance of a circuit under test, and for calculating return loss of a circuit under test. As used herein, "circuit" and "circuit under test" specifically include a circuit which is balanced with respect to ground such as a loaded or unloaded cable transmission system, a telephone circuit, a telephone cable, a subscriber loop line, and telephone termination equipment.

In accordance with one aspect of the invention, the resistive and reactive components of the phasor impedance of a circuit under test are measured at a measurement frequency selected by direct entry through keyboard input. A microcomputer calculates the magnitude and phase of the measured phasor impedance, and a display readout of the phasor impedance in absolute value and phase angle is made. Alternatively, the measured resistive and reactive components of the phasor impedance are displayed.

In accordance with another aspect of the invention, a test set is provided for calculating the return loss of a circuit under test. The test set measures at a selected measurement frequency the impedance of the circuit under test. A microcomputer calculates the return loss for display. Further in accordance with this aspect of the invention, a plurality of keyboard selectable return loss calculation program subroutines, each comprising an instruction set serving upon command to instruct predetermined computation processing by the microcomputer's CPU, are stored in a memory accessed by the CPU. The stored program subroutines provide for calculation of return loss against the impedance at the measurement frequency of a predetermined RC network configuration with either predetermined or user-selected values of resistance and capacitance.

As yet another aspect of the present invention, in a test set providing for measurement of the impedance of a circuit under test, which includes a signal generator producing a test signal of a selected measurement frequency, provision is made for direct entry of a selected measurement frequency value into the test set, store and recall of a plurality of measurement frequency values, and user-controlled step changes in the test signal frequency. Entry of test parameter information, including measurement frequency values, into the test set is by keyboard input, with a memory storing entered test signal frequency information and a microcomputer controlling the signal generator.

As a further aspect of the present invention, there is provided in a test set apparatus for measuring the impedance of a balanced circuit, which includes a current source driven by a signal generator to produce measurement current flow through a circuit under test and a measurement circuit to detect the resulting voltage drop, a battery power source for supplying power individually to the current source so as to isolate it from ground and permit test set operation in the presence of externally-induced longitudinal voltages.

With the present invention, direct measurement of the phasor impedance of a telecommunications circuit can be made rapidly and in the presence of the unwanted signals that appear in practice. Further, the invention allows for the measurement of the phasor impedance of active circuits, that is, on dc-powered circuits. The invention further allows for definition of the performance of a circuit under test in terms of the return loss, while also quantifying the actual phasor impedance in terms of its resistive and reactive components. The component quantities help the user to determine the cause of good or poor return losses and, therefore, provide the user with more complete information with which to take corrective action. For example, with a test set in accordance with the present invention, it can be determined whether the impedance of a circuit under test has a high or low resistive component and to what degree the impedance reactance is capacitive or inductive. With this information, impedance compensation or "buildout" can proceed more directly than is possible with the more restrictive return loss information typically available. Also, impedance measurements can be made on circuits exhibiting high longitudinal balance. Longitudinal balance is important on telecommunications circuits because it determines the degree to which interfering signals, particularly those derived from the influence of adjacent power distribution systems, will be converted to unwanted noise or cause harm to electronic equipment attached to the telephone cables. The higher the longitudinal balance, the better. Telephone line circuits exhibiting high longitudinal balance have a high degree of symmetry in the impedance from the tip conductor to ground and from the ring conductor to ground. The present invention provides test set apparatus which is highly balanced and, therefore, will not interfere with or degrade the longitudinal balance achieved on transmission cable circuits.

The present invention, although particularly well-suited for telecommunications applications, also provides similar advantages to the electronics industry in general. This is because the present invention provides the ability to measure phasor impedances directly at any selected frequency in the audio band, even in the presence of unwanted signals, and on active circuits.

These and other aspects and capabilities of the present invention will become better understood from the detailed description of an illustrative embodiment which follows.

BRIEF DESCRIPTION OF THE DRAWINGS

A written description setting forth the best mode presently known for carrying out the present invention, and of the manner of implementing and using it, is provided by the following detailed description of a preferred embodiment which is illustrated in the attached drawings wherein.

DETAILED DESCRIPTION OF AN ILLUSTRATIVE EMBODIMENT

A. Test Set Apparatus

Figure 1:
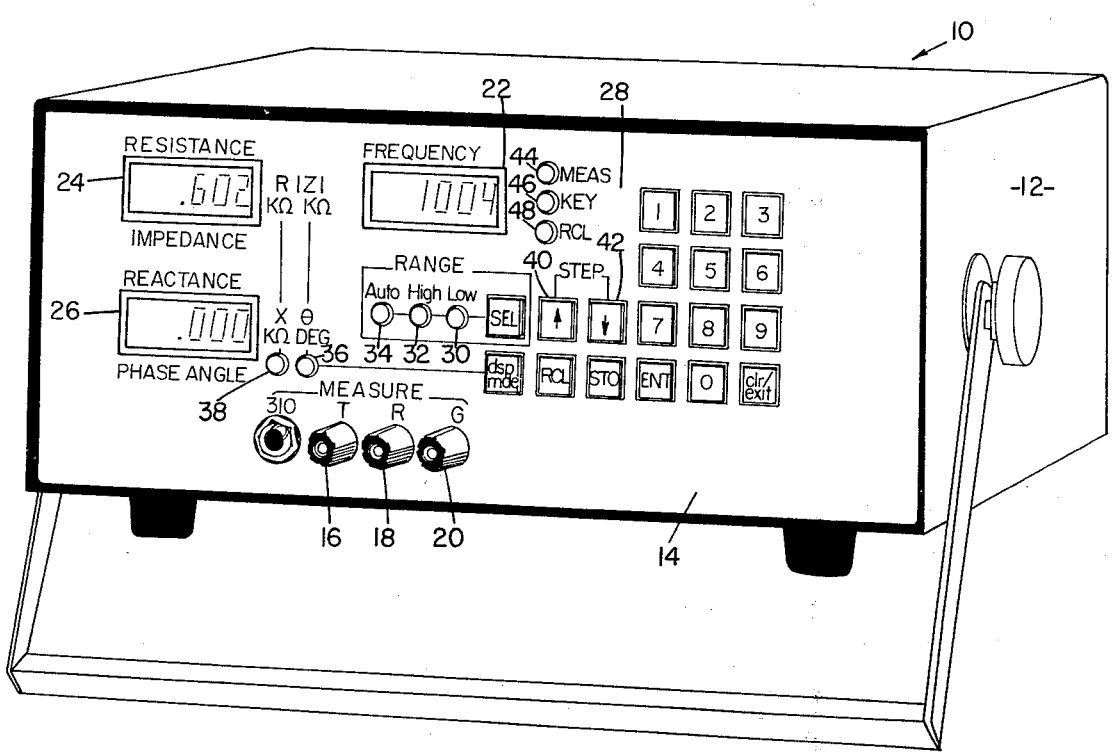
FIG. 1 is a pictorial perspective view of the test set apparatus in accordance with the present invention.

The phasor impedance measuring test set 10 as a packaged instrument is illustrated in FIG. 1. The test set 10 includes a housing 12 having a front panel 14. On the front panel are connectors 16, 18 and 20 which serve as measurement terminals for connection to a circuit under test. In the case of a circuit under test being a telephone cable pair, connectors 16 and 18 are connectable to the tip and ring lines. Accordingly, on the front panel, connector 16 is marked T and connector 18 is marked R. Connector 20 serves as a ground connection and is marked G on the front panel.

The front panel of test set 10 also includes three displays 22, 24 and 26. Display 22 shows the frequency in Hertz during measurement. Displays 24 and 26 show either resistance and reactance in kilohms, respectively, or impedance in kilohms and phase angle in degrees, respectively.

A numeric and function selection keyboard 28 is provided on front panel 14. Keys 0-9 enter digits 0-9 into the frequency display 22. Keying the first digit stops all measurement operation and places the test set in the key entry mode. The numeric keys are also used for designating memory storage locations for entered measurement frequency values. The ENT key places the test set in the measure mode after a frequency has been keyed into the frequency display. The SEL key selects the impedance range for measurement. Successive keying of the SEL key cycles the impedance range through Low, High and Auto. Light emitting diode indicators 30, 32 and 34 are provided to indicate the range. The DM key establishes the display mode by changing the impedance display between rectangular and polar notation. Light emitting diodes 36 and 38 indicate the display mode. The Step keys 40, 42 are effective to change the test signal measurement frequency in increments or decrements of a predetermined number of Hertz. The STO key, followed by depression of a numeric key, stores the displayed measurement frequency value in a storage register. As many as ten frequencies can be stored in locations designated 0-9. The RCL key, when followed by depression of a numeric key, recalls a measurement frequency value from the designated storage register location. Additional light emitting diode indicators 44, 46 and 48 are provided on front panel 14 to show measurement mode operation, measurement frequency entry mode, and measurement frequency recall mode, respectively.

Figure 2:
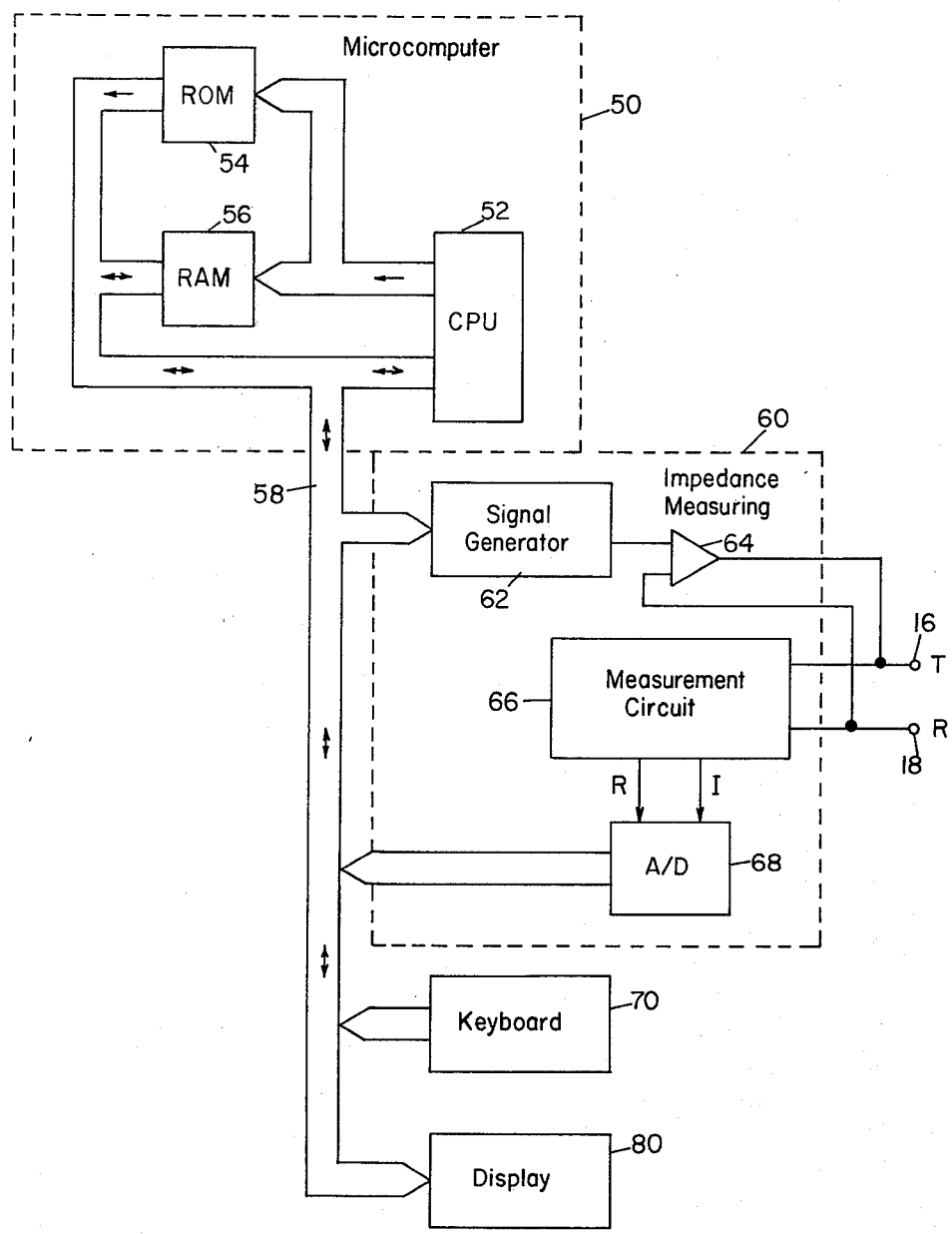
FIG. 2 is a generalized block diagram of the test set apparatus.

Turning now to FIG. 2, there is provided a functional block diagram of test set 10. Generally, the apparatus comprises a microcomputer 50, impedance measuring means 60, keyboard input means 70 and display 80. Microcomputer 50 includes interconnected central processing unit (CPU) 52 and memory, including read only memory (ROM) 54 and random access memory (RAM) 56. A program including a plurality of keyboard-selectable subroutines is stored in memory. The main program routine and each of the subroutine programs comprises an instruction set adapted upon command to initiate predetermined control and processing actions by the CPU. Specifically, the CPU generates digital control signals to the impedance measuring means 60 of the test set and generates digital measurement data for readout on display 80. Microcomputer 50 communicates with other portions of the test set apparatus via a system bus 58.

Impedance measuring means 60 provides for measurement, at a selected measurement frequency of the impedance of a circuit under test connected to measurement terminals 16, 18. Impedance measuring means 60 includes a signal generator 62 for generating a test signal of a selected measurement frequency. The test signal frequency is selected by entry of a measurement frequency value on the front panel keyboard 70. The generated test signal is applied to a current source 64, which produces measurement current flow through a circuit under test. A measurement circuit 66 connected to the measurement terminals detects in-phase and quadrature components of the voltage drop that results from measurement current flow, and produces voltages proportional to the resistive and reactive components of the impedance. Analog-to-digital converter apparatus converts the detected voltage drop components into digital values proportions to the resistive and reactive components of the phasor impedance of a circuit under test. The digital values are returned over bus 58 to microcomputer 50. Based upon the resistive and reactive impedance component values, microcomputer 50 calculates an absolute magnitude value and phase angle of the phasor impedance.

Keyboard 70 and display 80 have already been generally discussed in connection with the description of the front panel of test set 10. Further description of the keyboard and display sections will be provided in connection with the discussion of FIG. 7.

Figure 3:
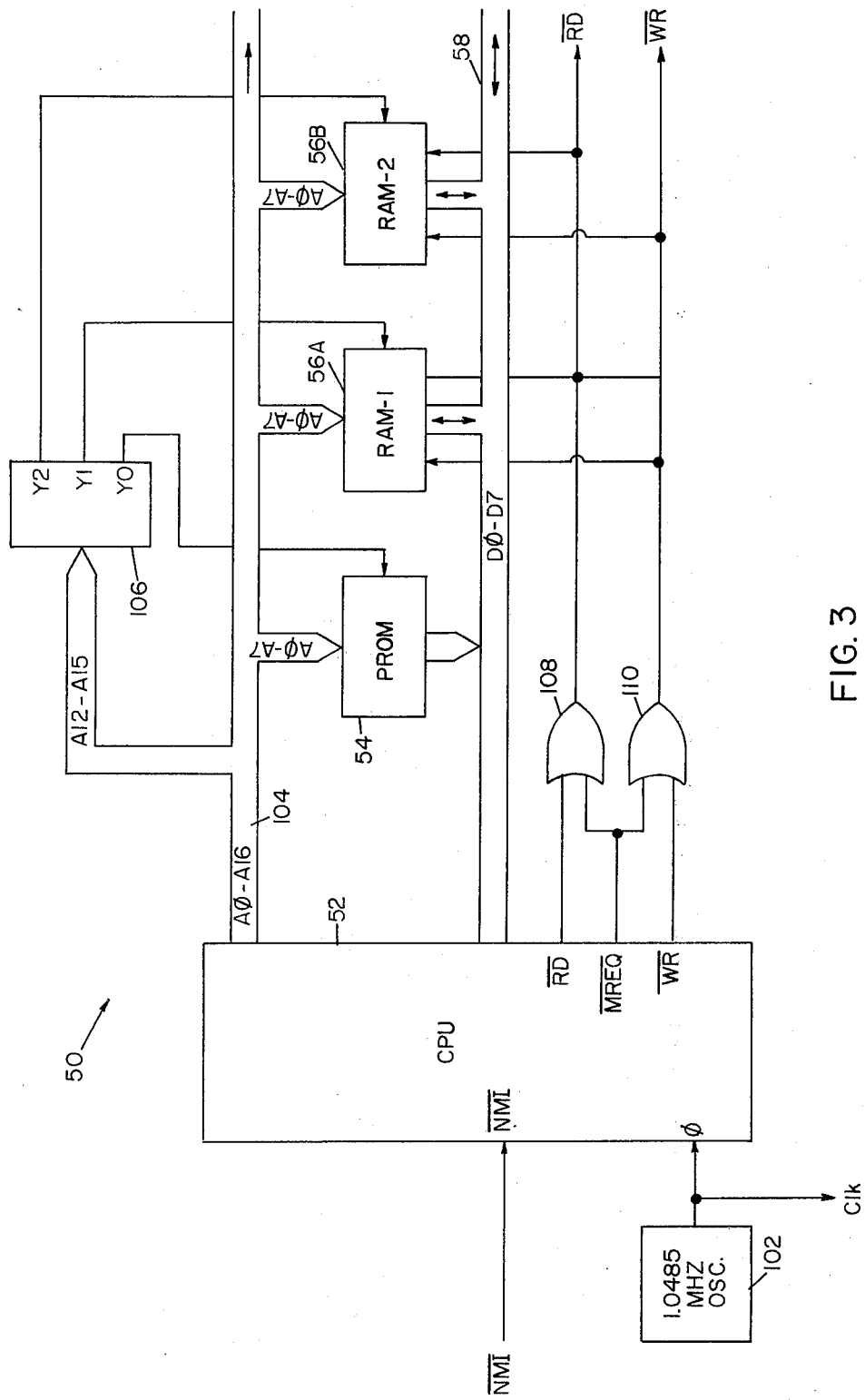
FIG. 3 is a simplified schematic diagram of the microcomputer portion of the test set apparatus diagrammed in FIG. 2.

Turning now to FIG. 3, there is presented a more detailed diagram of microcomputer 50. An oscillator 102 provides the necessary clock input to the CPU. Another input to the CPU is the interrupt request input designated $\overline{NMI}$. This signal input causes the CPU to go to a designated location in its operating program. Memory 54 is shown to be in the form of programmable read-only memory. ROM 54 is addressed by a 12-bit address on lines A0–A11 of 16-bit address bus 104 and by one of two enable signals generated by decoder 106. Random access memory 56 includes memory chips RAM-1 and RAM-2. Again, eight bits of address, A0–A7, from address bus 104 and an enable output from decoder 106 provide the memory chip and location selection addressing for RAMs 56A and 56B. The read and write signals ($\overline{RD}$ and $\overline{WR}$) for RAM 56 are produced from signals generated by the CPU and combined by logic comprising OR gates 108, 110. Digital data read out of memory, writtin into memory input/output to the CPU, and input/output to other portions of the test set apparatus is carried over bus 58, which consists of eight bits, D0–D7.

Figure 4:
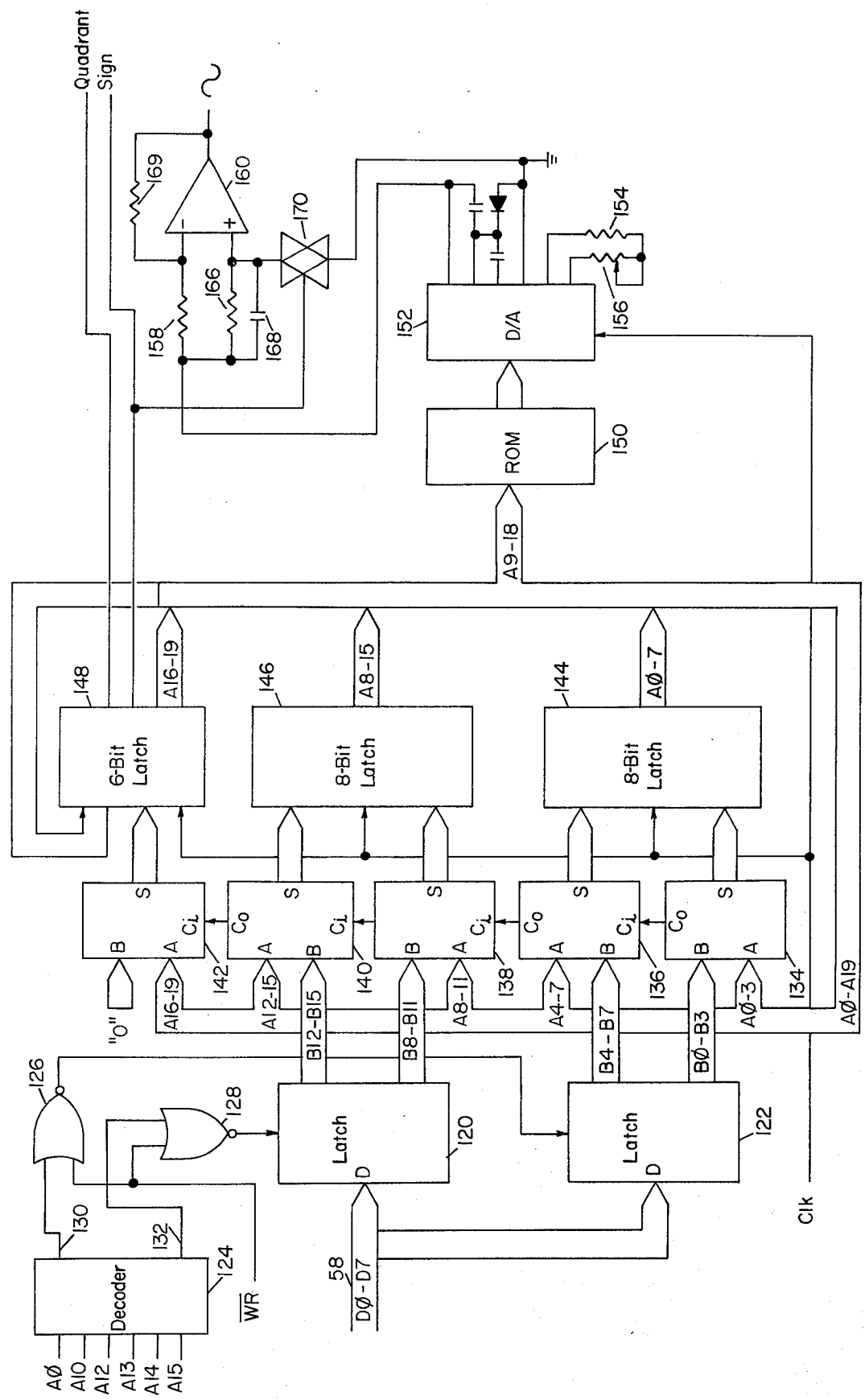
FIG. 4 is a simplified schematic diagram of the signal generator of the impedance measuring portion of the test set apparatus diagrammed in FIG. 2.

Referring next to FIG. 4, the signal generator of the impedance measuring means is schematically diagrammed. A digital input control word from microcomputer 50, representing the desired test signal measurement frequency, is loaded into latches 120, 122. The desired measurement frequency is represented by a 16-bit binary number. Because bus 58 is only 8 bits, the binary measurement frequency value must be loaded into the latches in two parts. The first part is the higher order bits, which are loaded into latch 120, and the second part is the lower order bits, which are loaded into latch 122. To appropriately synchronize the loading of the two parts of the binary measurement frequency value, decoder 124 and logic comprising NOR gates 126, 128 is included. Address bits A0, A10, and A12–A15 are applied to decoder 124 which generates a binary output on output decode lines 130, 132. After data has been set up at the latch inputs and address decoder 124 has enabled the appropriate one of gates 126 or 128 for issuance of a load pulse, the $\overline{WR}$ signal is issued from CPU 52. The 16-bit binary measurement frequency value is made available from latches 120, 122 as binary Word B.

Word B is applied as one input to an accumulator circuit comprising a series of interconnected full adders 134, 136, 138, 140 and 142. Word B is added to Word A, which is a binary value stored in latches 144, 146 and 148, and made available over lines A0–A19. Word A is the previous sum output from the full adders. Latches 144, 146 and 148 are clocked by the CLK signal from oscillator 102 in FIG. 3 to load and maintain the sum output of the adders.

The accumulator capacity is 20 bits; and the frequency of CLK is 1.0485 MHz or $2^{20}$ Hz. Accordingly, if the measurement frequency value input were 1 Hz, such that the accumulator latches content increases in value by one on each clock pulse, $2^{20}$ clock pulses would be required for the accumulator content to go from zero to full count. In time, this would take one second. Similarly, if the measurement frequency input value is for 100 Hz, the accumulator content would increase from zero to full count 100 times a second.

The accumulator output, i.e., the outputs from latches 144–148, may be used to determine the instantaneous value of a sine wave at each clock pulse. While a full 20-bit accumulator is required to obtain 1 Hz resolution in the frequency input, 11 bits provides sufficient accuracy in producing the instantaneous levels of a sine wave. Accordingly, the nine least significant bits from the accumulator are not used. Also, the symmetry of a sine wave permits the use of a half-wave sine look-up table in the form of ROM 150, which has a 10-bit input and an 8-bit output.

Also available from latch 148 are quadrant and sign bits. The sign bit (SIGN) is the most significant bit from the accumulator and is in-phase with two sweeps through the addresses of the look-up table in ROM 150. That is, the sign bit is a square wave signal that corresponds in frequency and phase to the desired output signal, with each half-cycle of the output being produced by one sweep through the addresses of ROM 150. The quandrant bit (QUAD), however, is a square wave at twice the output frequency that goes through a complete cycle during each sweep through the ROM 150 addresses. The SIGN and QUAD signals are produced by feeding latch outputs A19 and A18, respectively, back to two available latch inputs, thereby introducing a time delay of one clock interval corresponding to the delay in the input latches in D/A converter 152.

The digital outputs from ROM 150 are applied as the input to an 8-bit digital-to-analog (D/A) converter 152. Level adjustment for the output of D/A converter 152 is provided by a series combination of resistor 154 and potentiometer 156. The level-adjusted output of D/A converter 152, a full-wave rectified sine wave, is applied through resistor 158 to the inverting input of operational amplifier 160. The output from D/A converter 152 is also applied to an RC network of resistor 166 and capacitor 168, which is connected to the non-inverting input of operational amplifier 160. The non-inverting input of operational amplifier 160 is also connected to a transmission gate 170 controlled by the sign bit (SIGN) from latch 148.

By control of transmission gate 170 by the sign bit, operational amplifier 160 changes in gain between an inverting gain of one and a non-inverting gain of one. Thus, the half sine wave signal (at twice the output frequency), from D/A converter 152 is inverted during one half-cycle of the output signal and not inverted in the other half-cycle. Accordingly, a sine wave output at the desired measurement frequency is produced by the signal generator in FIG. 4.

Figure 5:
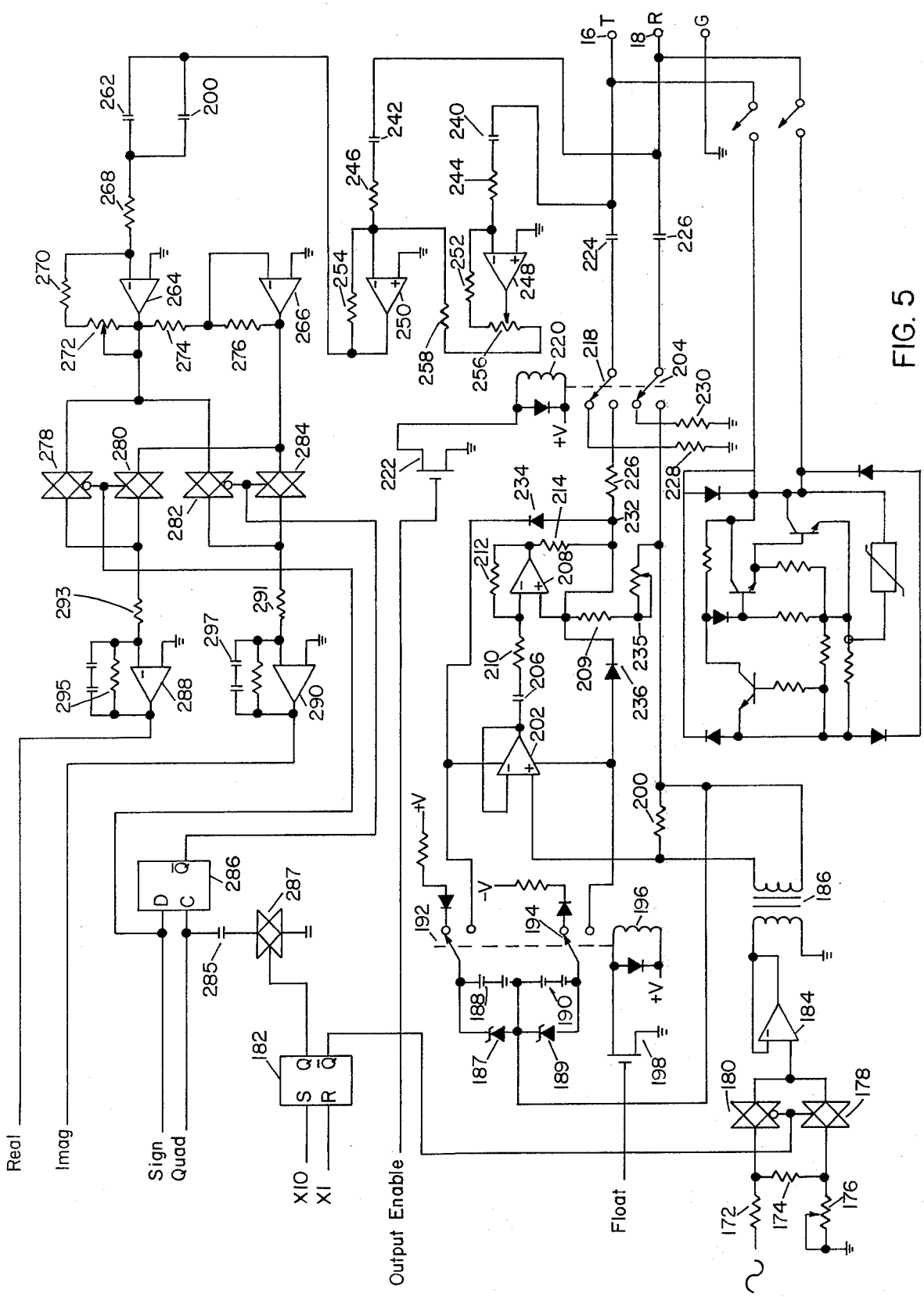
FIG. 5 is a simplified schematic diagram of the measurement circuit portion of the test set apparatus diagrammed in FIG. 2.

The test signal generated by the signal generator of FIG. 4 is applied to current source circuitry in FIG. 5. Specifically, the test signal is applied to an input network of resistors 172, 174 and 176. Connected to the input resistor network are transmission gates 178, 180, which are controlled by the $\overline{Q}$ output of S/R flip-flop 182. Depending upon the state of flip-flop 182, one of the transmission gates is "closed" and the other is "opened". Closure of one of the transmission gates rather than the other will alter the effective voltage divider ratio of the resistor input network, and change the level of the signal applied to buffer amplifier 184. In this manner, as will become more fully appreciated, the impedance measurement range may be changed between the high and low ranges.

The buffered signal is coupled through transformer 186 to a battery-powered current source circuit. The battery power source comprises interconnected battery banks 188, 190. Relay contacts 192, 194 controlled by relay coil 196 alternately connect the battery source between a charging circuit and the constant current source circuitry. Relay coil 196 is driven by field effect transistor 198 which receives a control input designated FLOAT.

A resistor 200 is connected across the secondary winding of transformer 186. One end of resistor 200 connects to a non-inverting buffer amplifier 202, and the other end of resistor 200 connects to relay contact 204. The output of buffer amplifier 202 is coupled by capacitor 206 to a current source built around operational amplifier 208. Op-amps 202 and 208 are part of a dual amplifier package; accordingly, both are powered from the battery power source. The signal coupled through capacitor 206 is applied via resistor 210 to the inverting input of amplifier 208 to which a feedback resistor 212 connects from the amplifier output. The output current signal is applied through output resistor 214 and protective resistor 216 to relay contact 218. Positive feedback from the output end of resistor 214 is applied to the non-inverting input of amplifier 208. The combination of negative and positive feedback is arranged to produce a constant output current, independent of the impedance through which the current may flow so long as the maximum output voltage capability of amplifier 208 is not exceeded. The closure of relay contacts 204, 218 is controlled by relay coil 220, which is in turn controlled by a field effect transistor driver 222. A signal designated OUTPUT ENABLE is applied to the gate of field effect transistor driver 222 to effect the opening and closing of the relay contacts.

As will be noted, relay contacts 204, 218 are coupled to the measurement terminals 16, 18 (i.e., the tip and ring lines) by DC blocking capacitors 224, 226. When relay contacts 204, 218 are open, capacitors 224, 226 are connected in series, respectively, with resistors 228, 230 to ground.

Connected between the battery power source and node 232 are diodes 234 and 236. These diodes provide protection against electrical transients appearing on measurement terminal 16, by routing the same into the battery.

A test signal, a sinusoidal current of the form $I \sin \omega t$ (where $\omega = 2\pi f$, and f is the measurement frequency), is thus applied to a circuit under test connected to measurement terminals 16 and 18. This establishes measurement current flow through the unknown impedance of a circuit under test. The voltage appearing across the measurement terminals is detected by a measurement circuit, with the voltage being coupled through DC blocking capacitors 240, 242, and through isolating resistors 244, 246, to a differential input/single-ended output amplifier circuit comprising operational amplifiers 248, 250. Feedback resistor 252 and a balancing potentiometer 256 are provided for amplifier circuit 248. The output from amplifier 248 is applied via resistor 258 to the inverting input of amplifier 250, which also has a feedback resistor 254 connected thereto.

The output voltage signal from the single-ended output amplifier circuit is coupled through capacitors 260, 262 to gain control amplifier circuit 264 and a unity-gain inverter circuit 266. The voltage signal coupled through capacitors 260, 262 is applied to the inverting input of an operational amplifier via input resistor 268. A feedback resistor 270 and gain adjustment potentiometer 272 establish the gain for circuit 264, which provides additional amplification to the voltage signal. The amplified output voltage signal from circuit 264 is applied by resistor 274 to the inverting input of the operational amplifier of circuit 266. A feedback resistor 276 connects between the output and the inverting input of the operational amplifier. Resistors 274 and 276 are chosen to be of equal value, thereby establishing a gain of one through circuit 266. The output of circuit 266 is, however, inverted from the output of circuit 264.

Accordingly, the output of circuit 264 may be designated as $+V$ and the output of circuit 266 designated as $-V$.

The output voltage signals from circuits 264, 266 are applied to transmission gates 278, 280 and 282, 284. Specifically, the output of circuit 264 is applied to transmission gates 278, 282, and the output signal from circuit 266 is applied to transmission gates 280, 284. Transmission gates 278, 280 are controlled by the SIGN bit signal from the signal generator. As will be recalled, SIGN is a square wave signal in-phase with the signal generator sinusoidal signal output. It is to be recognized, however, that transmission gates 278, 280 conduct on opposite half cycles of the SIGN square wave. Thus, when SIGN is "high", gate 280 conducts; and when SIGN is "low", transmission gate 278 conducts.

Transmission gates 282, 284 are controlled by a signal generated by the $\overline{Q}$ output of D-type flip-flop 286. The clock input to flip-flop 286 is the quadrant signal, QUAD, from the signal generator. The D input of flip-flop 286 is SIGN. The signal from the $\overline{Q}$ output of flip-flop 286 will correspond to the SIGN square wave; however, it will be shifted by 90°, providing a quadrature signal with respect to the signal generator output sign and the measurement current.

The outputs of transmission gates 278, 280 are connected together, and the outputs of transmission gates 282, 284 are connected together. Accordingly, both pairs of transmission gates are connected as single-pole, double-throw electronic switches.

As will be recalled, the output from the current source to the measurement terminals may be expressed as $I \sin \omega t$. When this current passes through the phasor impedance, Z, of a circuit under test, the resulting voltage drop, which appears across the measurement terminals, may be expressed as:

$V = IR \sin \omega t + IX \cos \omega t$ where R is the resistive (or Real) component of Z, X is the reactive (or Imaginary) component, and $\omega$ is $2\pi f$, where f is the measurement frequency. A voltage proportional to V appears at the output of circuit 264, and a voltage proportional to $-V$ at the output of circuit 266.

Switching between V and $-V$ with transmission gates 278, 280 and 282, 284 has the effect of multiplying the input by 1 in one switch position and by $-1$ in the other. This is the same as multiplying by a rectangular time function alternating between values of +1 and −1 with dimensionless units. For the in-phase SIGN square wave which controls gates 278, 280, the function is given by:

$$\text{SIGN} = \frac{4}{\pi}\left(\sin \omega t + \frac{1}{3}\sin 3\omega t + \frac{1}{5}\sin 5\omega t + \ldots\right).$$

When V is multiplied by this quantity, through switching action of gates 278, the following results:

$$V_{out} = \frac{4}{\pi} IR \left(\sin^2 \omega t + \frac{1}{3}\sin \omega t \sin 3\omega t + \frac{1}{5}\sin \omega t \sin 5\omega t + \ldots\right) +$$

$$\frac{4}{\pi} IX \left(\cos \omega t \sin \omega t + \frac{1}{3}\cos \omega t \sin 3\omega t + \frac{1}{5}\cos \omega t \sin 5\omega t + \ldots\right).$$

Applying trigonometric identities, this expression may be re-written:

$$V_{out} = \frac{4}{\pi} IR \left(\frac{1}{2} - \frac{1}{2}\cos 2\omega t + \frac{1}{6}\cos 2\omega t - \frac{1}{6}\cos 4\omega t + \frac{1}{10}\cos 4\omega t - \frac{1}{10}\cos 6\omega t + \ldots\right) +$$

$$\frac{4}{\pi} IX \left(\frac{1}{2}\sin 2\omega t + \frac{1}{6}\cos 2\omega t + \frac{1}{10}\cos 4\omega t + \frac{1}{10}\cos 6\omega t + \ldots\right).$$

When the ac components (or time-dependent terms) of this expression are removed by the low-pass filter action of filter circuit 288, the only remaining term is:

$$V_{out} = \frac{2}{\pi} IR$$

Thus, a voltage output is provided from circuit 288 which is proportional to the resistive component of the impedance being measured and independent of the reactive component.

Similarly, for the quadrature square wave, which controls gates 282, 284, the function is given by the expression:

$$\frac{4}{\pi}\left(\cos \omega t - \frac{1}{3}\cos 3\omega t + \frac{1}{5}\cos 5\omega t - \ldots\right).$$

Multiplying this by V, applying trigonometric identities, and eliminating ac terms, the following results:

$$V_{out} = \frac{2}{\pi} IX$$

Thus, the voltage output of circuit 290 is proportional to the reactive component of the impedance being measured and independent of the resistive component.

Figure 6:
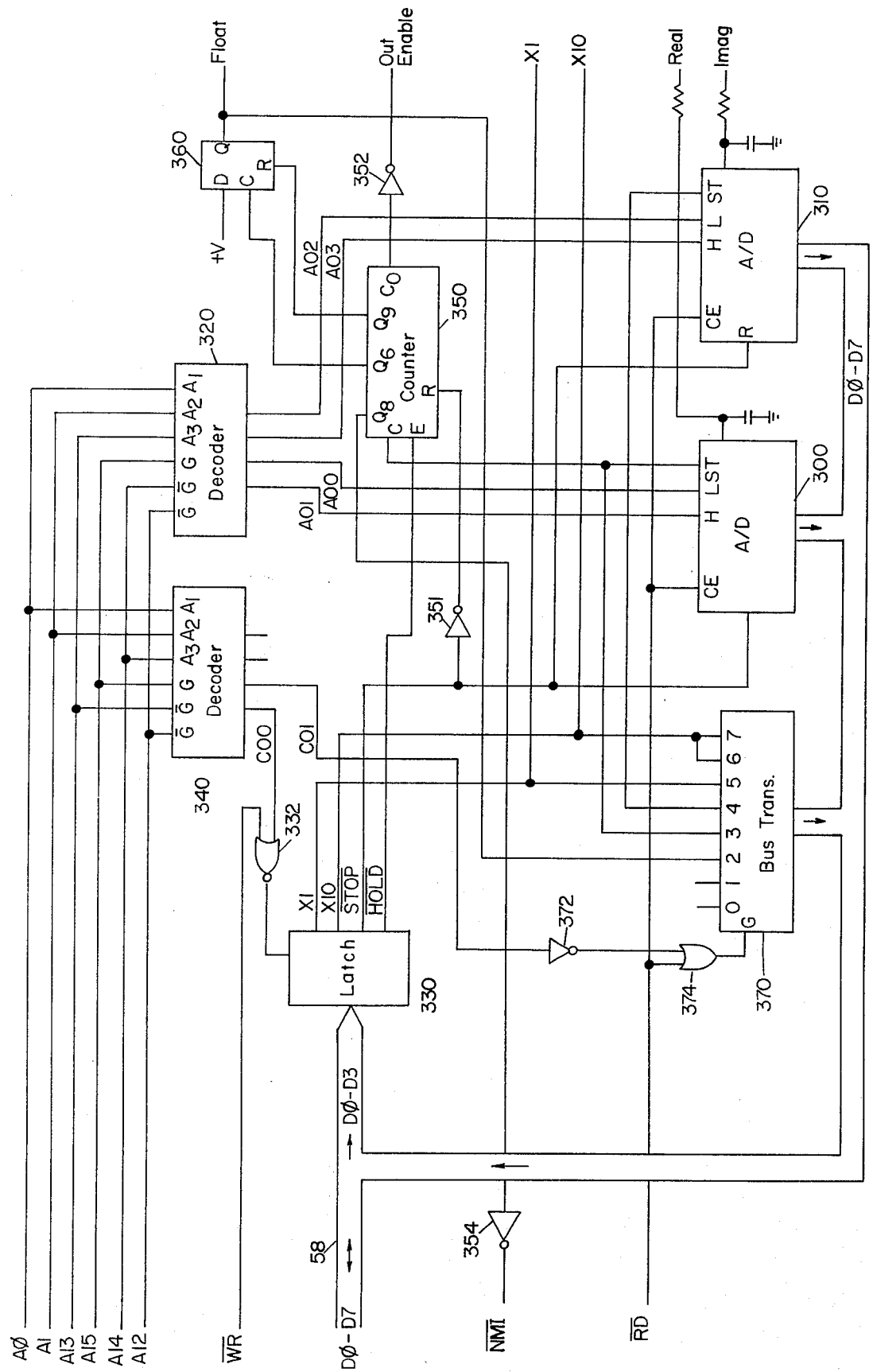
FIG. 6 is a simplified schematic diagram of the analog-to-digital converter portion of the test set apparatus diagrammed in FIG. 2.

The voltage signals proportional to the real and imaginary impedance components are applied to respective analog-to-digital converters 300, 310 in FIG. 6. Digital values representative of the real and imaginary proportional voltages are output over bus lines D0–D7. Because of the limited bus size, however, the real and imaginary digital values must be separately read by the microcomputer. Accordingly, decoder 320 is provided. Decoder 320 receives a code over address lines A0, A1, and A12–A15. Based upon the address inputs, decoder 320 generates the appropriate signals over lines A00, A01, A02 and A03 to select the appropriate A/D converter for data output to the microcomputer. After selection of converter 300 or 310, the microcomputer outputs the $\overline{RD}$ signal, which puts converted data on bus 58.

The FLOAT, OUTPUT ENABLE, and range control signals X1, X10 inputs to the circuit in FIG. 5 are generated by portions of the circuit shown in FIG. 6. Beginning with the range control signals X1, X10, those signals are determined by the microcomputer and loaded in latch 330. Also loaded into latch 330 are data bits designated $\overline{STOP}$ and $\overline{HOLD}$. Data is loaded into latch 330 by a strobe signal generated by NOR gate 332. Decoder 340, receiving the same address lines as decoder 320, produces a control output C00, which is one input to NOR gate 332. The other input to gate 332 is the $\overline{WR}$ signal generated by the microcomputer. Accordingly, when the microcomputer enters commands into latch 330, the microcomputer sets up the data at the latch inputs, outputs the appropriate address to decoder 340, and issues the WR strobe.

The FLOAT and OUT ENABLE signals are generated by circuitry comprising Johnson counter 350 and flip-flop 360. Counter 350 is enabled by the $\overline{HOLD}$ output from latch 330, and as long as the $\overline{HOLD}$ output is "high", counter 350 is enabled. Clock pulses for stepping counter 350 through its repeating cycle are derived from the status output of A/D converter 300. A/D converter 300 contains its own clock oscillator, which also provides timing for A/D converter 310. The status output of A/D converter 300 goes high during each conversion and low when conversion is complete. Thus counter 350 counts the number of complete conversions performed by A/D converter 300. As counter 350 is stepped through its output states, the carry output $C_o$ goes "low" beginning with the fifth clock pulse of each repeating cycle, signifying five complete A/D conversions. Inverter 352 inverts the "low" condition to a "high" condition which corresponds to the issuance of OUT ENABLE. This signal causes relay contacts 204, 218 in FIG. 5 to close, connecting the current source circuitry to the measurement terminals. At the next clock pulse, the $Q_6$ decoded output of counter 350 goes "high" and clocks flip-flop 360. This sets the Q output "high" and issues the FLOAT signal which causes the battery power source in FIG. 5 to be connected to the current source circuitry. Once the current source is both supplied with electrical power and connected to the measurement terminals, measurement current flow is established in the unknown impedance of a circuit under test connected to the measurement terminals. After being clocked twice more (i.e., two more complete data conversions), counter 350 produces a "high" condition on the $Q_8$ output. This is inverted by inverter 354 to generate the $\overline{NMI}$ interrupt signal to CPU 52 in FIG. 3. After the microcomputer receives the NMI signal, digital data from A/D converters 300, 310 is read by the microcomputer. When the ninth clock pulse in a cycle is received by counter 350, the $Q_9$ output issues a reset signal to flip-flop 360, removing the battery power source from the current source circuitry. At the end of the ninth clock pulse, $C_o$ goes "high", disconnecting the current source circuitry from the measurement terminals.

The microcomputer can interrogate as to the status of the A/D converters and the measurement control circuitry and commands. This is accomplished by bus transceiver 370. When the microcomputer interrogates status, decoder 340 is provided with an appropriate address to place a "high" condition on the C01 decode output line. This signal is inverted by inverter 372 and provides an input to OR gate 374. The second input to OR gate 374 is the $\overline{RD}$ signal from the microcomputer. When the appropriate address is applied to decoder 340 and the $\overline{RD}$ signal is issued, bus transceiver 370 places the data input information onto bus 58. This information comprises the range selection bits X1, X10, the FLOAT bit from flip-flop 360, and the status outputs from A/D converters 300 and 310.

Figure 7:
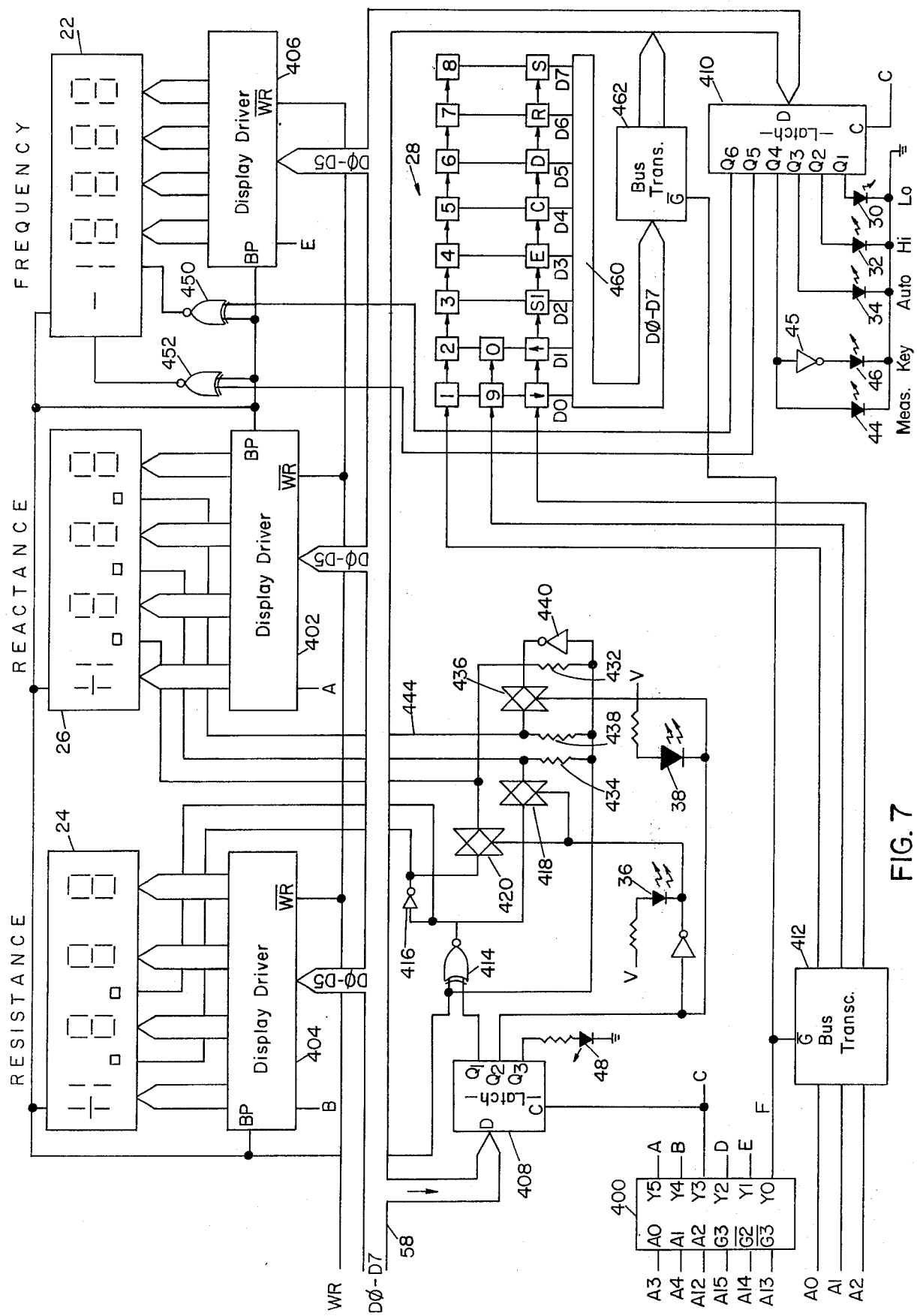
FIG. 7 is a simplified schematic diagram of the keyboard and display portions of the test set apparatus diagrammed in FIG. 2.

With reference now to FIG. 7, implementations of the display and keyboard portions of the test set apparatus block diagram in FIG. 2 will be described. Keyboard information and data for display are brought in and out over bus 58. Control over the various portions of the keyboard and display circuitries by the microcomputer is provided through decoder 400, which receives address lines A3, A4 and A12–A15. Decoded output A from decoder 400 enables display driver 402 for operation. Similarly, decoder 400 output B enables display driver 404, and decoder 400 output E enables display driver 406. When decoder 400 output C is selected, it provides a clock signal for latches 408 and 410. Finally, when decoder output F is selected, bus transceiver 412 provides address signals on lines A0, A1, and A2 for scanning the keyboard.

Considering first the operation of the display, data for display is provided over lines D0–D5 sequentially to each of the display drivers 402, 404 and 406. The display drivers generate the appropriate output signals to produce several digits of seven segment display readout. Suitably, the displays 22, 24 and 26 are liquid crystal displays and display drivers 402, 404 and 406 are adapted for driving such displays.

In addition to the seven-segment digit display portions, displays 24 and 26 include selectable decimal point displays. Accordingly, circuitry must be provided to receive information from the microcomputer regarding appropriate decimal point location and effect selective turn-on of the appropriate decimal point in each display. Data representing the appropriate decimal points for display on displays 24 and 26 are output by the microcomputer over bus 58 to latch 408. The $Q_1$ output of latch 408 is applied as one input to Exclusive-NOR gate 414. The other input to gate 414 is a signal from a back plane oscillator included within display driver 404. The output of gate 414 is applied directly to the indicated decimal point in display 24. The output gate 414 is also applied as an input to inverter 416. The output of inverter 416 is applied to the other of the decimal points in display 24.

When the output from $Q_1$ of latch 408 to gate 414 is a "0", the output of gate 414 will drive the decimal point to which it connects out-of-phase with the back plane oscillator signal. This decimal point is to be driven when the number for display 24 is 10.00–99.99. When $Q_1$ is a "1", the output of inverter 416 will drive the decimal to which it connects out-of-phase with the back plane oscillator signal. This decimal point is driven when the number for display is 0.000–9.999.

The output of gate 414 is also applied to transmission gate 418. Similarly, the output of inverter 416 is also connected to transmission gate 420. Both transmission gate 418 and 420 are controlled by inverter 422. Input to inverter 422 is from $Q_2$ of latch 408. This output is a display mode (DSPLY MODE) signal. Inverter 422, when its output is in the low or "0" state, also drives light emitting diode 36, which serves as an indicator that the display mode is in polar form. The $Q_2$ output of latch 408, when in the low or "0" state, drives directly a light emitting diode 38 which serves to indicate the display as being in rectangular form. The $Q_2$ output of latch 408 also provides a control signal to transmission gate 430.

When then $Q_2$ output of latch 408 is "high", and the output of inverter 422 is low, the impedance display mode is in polar form. Transmission gates 418 and 420 are nonconducting, such that the back plane oscillator signal is supplied by resistors 432, 434 to respective ones of the decimal points in display 26. Since the decimal point displays require drive signals which are out-of-phase with the back plane oscillator, those decimal points will not be turned-on.

When $Q_2$ of latch 408 is "high", transmission gate 436 will be conducting. The back plane oscillator signal, inverted by inverter 440, is then passed through transmission gate 436 to line 444. Accordingly, the display segment driven by line 444 is driven through resistor 442 out-of-phase with the back plane oscillator signal, and will, therefore, be visible.

It, of course, follows that when the $Q_2$ output of latch 408 is "low", the output of inverter 442 is "high" and transmission gates 418, 420 are conducting. Also, light emitting diode indicator 36 is turned-on to indicate the impedance display as being in rectangular form; and, transmission gate 436 is non-conducting. Thus, depending upon the condition of the $Q_1$ output of latch 408, gate 414 or inverter 416 will drive the appropriate decimal point in display 26. The decimal point display driven by line 444, however, will not be visible since it is driven through resistor 438 in-phase with the back plane oscillator signal. The remaining output of latch 408, the $Q_3$ output, drives light emitting diode 48 to indicate that the set is operating in the measurement frequency recall mode.

The remaining light emitting diode indicators on the front panel are driven by the outputs of latch 410. Specifically, the $Q_1$–$Q_4$ outputs of latch 410 drive the Measurement, Key, Auto, Hi, and Lo light emitting diode indicators on the front panel. Latch 410 is loaded with data sent over bus 58 from microcomputer 50. As described previously, the clock signal to latch 410 is derived from the C signal from decoder 400.

In addition to the data for appropriately driving the front panel light emitting diodes, there are also loaded into latch 410 two bits of data which are output from the $Q_5$ and $Q_6$ outputs to Exclusive-NOR gates 450, 452.

Gate 450 drives the tens of thousands digit in frequency display 22, which either is blanked or displays a 1. Gate 452 drives the minus sign indicator in display 22.

Considering now the keyboard 28 shown in FIG. 7, the keys are connected to a keyboard bus 460 of eight bits, D0–D7, to correspond with bus 58. Data on bus 460 is output through transceiver 462 onto bus 58 when an enable signal is generated by the F output of decoder 400. At the same time bus transceiver 462 is enabled, bus transceiver 412 is also enabled permitting the address on lines A0, A1, and A2 to be brought in to keyboard 28. The microcomputer, while the bus transceivers are enabled, sequentially enables each row of keys in the keyboard. As each row is enabled for output onto bus 460, if any one of the keys is depressed, a digital code representative of the key value is output through bus transceiver 462 onto bus 58 to be read into memory by the microcomputer. After a prescribed period of time during which the keyboard is scanned by the microcomputer, the bus transceivers are disabled.

B. Use and Operation of the Test Set Apparatus

Test set 10 measures the resistive and reactive components of impedance of a circuit under test. The measurement results are displayable in either rectangular or polar form. The test set also calculates for display the return loss of a circuit under test against predetermined standards at a selected measurement frequency.

The frequency range of the signal generator is 20 Hz to 19,999 Hz, selectable in 1 Hz increments. The current source produces at the measurement terminals 50 microamperes of measurement current for high range impedances and 500 microamperes for low range impedances. The measurement circuit detects voltage components of the resulting voltage drop across the terminals which are in-phase and quadrature with the measurement current. In rectangular display form, the impedance ranges are: R: 0 to 1.999 and 0 to 19.99 kilohms, X: 0 to ±1.999 and 0 to ±19.99 kilohms. In polar display form, the impedance ranges are: Z: 0 to 1.999 and 0 to 19.99 kilohms, $\theta$: 0 to ±90°.

When turned on, test set 10 automatically measures impedance at a measurement frequency of 1004 Hz and displays in rectangular form the phasor impedance being measured at the T and R terminals. If it is desired to measure at a different frequency, for example, 2000 Hz, keystrokes on keyboard 28 of 2-0-0-0 are entered. The frequency display 22 will then read 2000. When the first digit (2) is keyed, impedance measurement stops, with the measurement indicator (LED 44) going out and the key indicator (LED 46) coming on. In the key entry mode, the frequency display 22 shows the key entries. If an error is made in entering the new frequency, the clear key, CLR, may be depressed to permit re-entry of a new value. After the appropriate keystrokes are made for specifying the new measurement frequency, the enter key, ENT, is depressed. This returns the test set apparatus to the measurement mode, and the test set is then measuring and displaying impedance at the new measurement frequency.

A one Hz measurement frequency step change is effected by depression of the Step keys 40 or 42. If key 40 is depressed, the displayed frequency is increased by one Hz. Each time key 40 is depressed, the frequency will be so increased. Thus, after the test set is turned on and 1004 Hz is displayed, if key 40 is depressed four times, frequency display 22 will read 1008 Hz. Key 42 functions in a similar manner to decrease the measurement frequency by one Hz. Depression of key 42 results in a display of 1007 Hz.

The increment or decrement step can be changed to a different size. For a 100 Hz step change, keystrokes of 1-0-0 are made, whereupon frequency display 22 will read 100 Hz. The test set is again in the key entry mode and impedance measurement has stopped. If the ENT key were depressed, the test set would begin measuring impedance at 100 Hz. Instead, by depressing key 40, the frequency display will read 1107 Hz, and the test set will measure impedance at this new measurement frequency. If key 40 is depressed twice more, the measurement frequency will be twice incremented by 100 Hz, and the frequency display will read 1307 Hz. By depressing key 42 three times, the measurement frequency will be decremented three step changes of 100 Hz each, with the frequency display then becoming 1007 Hz. The keyed step change size will return to one Hz if the RCL, STO, or CLR keys are depressed.

If the user wants to measure the impedance of several circuits at different measurement frequencies, the desired measurement frequency values can be stored for recall. For example, suppose it is desired to measure impedance at 404 Hz, 1004 Hz, and 2804 Hz without having to enter them for each measurement. To store a measurement frequency value for 404 Hz, make the following keystrokes: 4-0-4-ENT-STO-1. Similarly, to store a measurement frequency value for 1004 Hz, make the keystrokes: 1-0-0-4-ENT-STO-2. To store the value for 2804 Hz, key in: 2-8-0-4-ENT-STO-3. There is now stored a 404 Hz value at location #1, a 1004 Hz value at location #2, and a 2804 Hz value at location #3. Additional frequency values could be stored at locations #4, 5, 6, 7, 8, 9, and 0. To change a stored measurement frequency value, enter the new value at the desired location.

To recall the measurement frequency value stored in a location for output to the signal generator, depress the RCL key and the numeric key representing the location number. For example, to recall the 404 Hz measurement frequency value in storage location #1, make keystrokes of: RCL-1. When the RCL key is depressed, the test set enters the recall mode in which the depression of a numeric key is interpreted as a recall command to the specified storage register location rather than as the first digit of a new measurement frequency value. The test set immediately begins measuring impedance at the recalled measurement frequency, as indicated by the measurement indicator, LED 44, on the front panel. The recall indicator, LED 48, also stays on, however, indicating that the test set remains in the recall mode. Therefore, to recall the next stored measurement frequency value, the only keystroke required is depression of numeric key 2. The frequency display then reads 1004. Similarly, depression of numeric key 3 results in a display of 2804. To exit the recall mode, the CLR key is depressed, whereupon the frequency display reads 0. Impedance measurement also stops, and the test set enters the key entry mode.

To step through several stored measurement frequency values which have been stored in successive locations, enter the recall mode by keying: RCL-1. Then depress the increment Step key 40. This causes a step to storage register location #2. Another depression of the increment Step key 40 will cause the measurement frequency value in the next higher storage register location, in this case #3, to be recalled. The decrement Step key 42 may be similarly utilized to back through the storage locations.

Test set 10 has two measurement ranges, high (Hi) and low (Lo). At test set turn on, the range selection is in the Auto mode. To change range, depress the SEL key. When the range is changed, the display decimal points move to accommodate the value, thus changing the resolution of the measurement. For example, consider a 600 ohm resistor in series with a 2.2 microfarad capacitor connected to the measurement terminals and a 1004 Hz measurement frequency. In the Lo range, and in the rectangular form display mode, display 24 reads 0.600 kilohms and display 26 reads −0.072 kilohms. If the range is changed to Hi, display 24 reads 0.60 and display 26 reads −0.07.

The test set normally displays impedance in rectangular form, i.e., R and X. If it is preferred to have the impedance displayed in terms of magnitude and phase angle, the display mode key DM is depressed. The 600 ohm resistor in series with the 2.2 microfarad capacitor, at 1004 Hz, has an impedance of 604 ohms at a phase angle of −6.8°. Display 24 then reads 0.604 kilohms and display 26 reads −06.8°. In order to return to display of the rectangular form, the user need only depress the DM key.

Test set 10 can also calculate for display the return loss of a circuit under test at a selected measurement frequency. The calculated value of return loss in dB is displayed on display 26. Return loss is defined as:

$$\text{Return loss} = 20 \log \left| \frac{Z + Z_{ref}}{Z - Z_{ref}} \right|$$

where Z is the phasor impedance of a circuit under test and $Z_{ref}$ is a reference phasor impedance. In test set 10, the microcomputer utilizing a program instruction set calculates return loss in accordance with the above definition for return loss. The phasor impedance Z utilized in the calculation is the measured impedance of a circuit under test connected to the measurement terminals. The microcomputer, of course, calculates the measured phasor impedance by appropriate scaling of the digital values produced by analog-to-digital conversion of the in-phase and quadrature components of the voltage drop across the measurement terminals, which voltages are representative of the resistive and reactive impedance components of the circuit under test. The reference phasor impedance, $Z_{ref}$, is either a predetermined value of resistance stored in memory or the impedance of an RC network modeled in the microcomputer and calculated at the measurement frequency by the microcomputer. Furthermore, the RC network, while being of predetermined configuration, may have the values of resistance and capacitance prescribed by the user through keyboard input.

To provide for return loss calculations against a variety of reference phasor impedances, the microcomputer has stored in memory a plurality of keyboard selectable program subroutines. Each of the program subroutines comprises an instruction set serving upon command to instruct predetermined computation processing by the microcomputer CPU to calculate return loss. The program subroutines are as follows:

| Program Subroutine No. | Return Loss vs. |
|---|---|
| 101 | 600 ohms & 2.16 microfarads |
| 102 | 900 ohms & 2.16 microfarads |
| 103 | 600 ohm resistance |
| 104 | 900 ohm resistance |
| 105 | RC network configured with series resistor $R_1$ and capacitor $C_2$ in parallel with capacitor $C_3$ ($R_1$, $C_2$ and $C_3$ values being user selected.) |
| 106 | Previous impedance measurement |
| 901 | Display values of $R_1$, $C_2$, and $C_3$. |

To run a program subroutine, keys 1 and 3 together are depressed. This puts the test set in the program mode. The frequency display 22 will read P - - - . To enter Program 101, which calculates return loss against 600 ohms in series with 2.16 microfarads, follow with the keystrokes of: 1-0-1. The display 22 will then read P101. Next, depress the ENT key and make a frequency entry, for example 1000 Hz, by making the keystrokes of: 1-0-0-0-ENT. The frequency display will alternate between the frequency and the program number. The calculated return loss in dB is displayed on display 26. Return loss programs 102, 103 and 104 are all entered in the same way as P101.

Program subroutine 105 provides for return loss calculation against the modeled RC network user-keyed component values. All resistance values are entered in ohms and capacitance values in nanofarads. For zero capacitance, an open circuit, depress the ENT key without any value. For infinite capacitance, a short circuit, depress keys 1-9-9-9-9-ENT.

As an example, to measure return loss of a circuit under test against 600 ohms in series with 2.16 microfarads with a shunt capacitor of 0.15 microfarad, make the following keystrokes with the resulting read out in display 22:

| Keystroke | Display | |
|---|---|---|
| 1-3 (together) | P--- | |
| 1-0-5-ENT | E-1- | (The test set is ready for entry of $R_1$) |
| 6-0-0-ENT | E-2- | (The test set is ready for entry of $C_2$) |
| 2-1-6-0-ENT | E-3- | (The test set is ready for entry of $C_3$) |
| 1-5-0-ENT | 0 | (The test set is ready for entry of measurement frequency) |
| 1-0-0-0-ENT | P105 | 1000 (Display alternates between frequency and program number) |

The microcomputer in accordance with the instruction set of Program 105 calculates the phasor impedance of the RC network of user selected values at the measurement frequency. This gives a reference phasor impedance value. Then, using the measured phasor impedance of the circuit under test, the microcomputer calculates the return loss.

To check the values of $R_1$, $C_2$, and $C_3$, Program 901 is used. The keystrokes required are as follows: 1-3 together, then 9-0-1-ENT. Display 22 then displays each component value for one second and afterwards returns to executing Program 105.

Program 106 permits calculation of return loss against a precision network, for example, a cable made with the Wilcom T240 artificial cable kit. In making this type of test, the test set first measures the phasor impedance of the precision network at a selected frequency. Then, the test set enters Program 106. To do this, the precision network is connected to the T and R measurement terminals and an impedance measurement is made. With the network still connected, the following keystrokes are made: 1-3 together followed by 1-0-6-ENT. A return loss of 60.0 dB will be displayed, since the network is being tested against itself and 60.0 dB is the maximum value of return loss the test set can display. Next, the network is disconnected and the circuit under test is connected, whereupon the return loss is calculated and displayed.

Test set 10 can further calculate for display weighted-average return loss over prescribed frequency ranges. Also, test set 10 can perform calculations to determine the minimum value of return loss in the frequency range and the frequency at which it occurs.

Return loss may be defined as follows:

$$\text{Return loss} = 10 \log \frac{\text{Incident Power}}{\text{Reflected Power}}$$

For a two wire circuit, return loss can be defined as a function of the circuit phasor impedance and a reference phasor impedance, as noted previously, by the equation:

$$\text{Return loss} = 20 \log \left| \frac{Z + Z_{ref}}{Z - Z_{ref}} \right|$$

By expressing the phasor impedances in rectangular form, the following equation results:

$$\text{Return loss} = -10 \log \left[ \frac{(R - R_{ref})^2 + (X - X_{ref})^2}{(R + R_{ref})^2 + (X + X_{ref})^2} \right]$$

In making a weighted-average return loss calculation, the return power ration bracketed in the last expression has to be weighted and accumulated. Weighting of the return power ratio for each measurement frequency suitably is in accordance with Bell System Technical Reference PUB-41009, which is hereby incorporated by reference. The weighted return power ratios are summed and stored. To obtain weighted average, the sum is divided by the sum of the weighting factors which were taken at each measurement frequency. The log of the weighted-average return power ratio is then calculated and the result multiplied by $-10$ to provide the weighted-average return loss over the measurement frequency range.

In determining the minimum value of return loss in a measurement frequency range, unweighted return power ratios are calculated and stored. To determine the minimum return loss, the maximum value of return power ratio is found. For interpolation between return power ratio data points, a parabolic curve-fitting routine describing the general quadratic form $y = ax^2 + bx + c$ is used. By fitting the data points to the curve, an approximate maximum return power ratio value and the approximate frequency at which it occurs can be determined.

To provide for weighted-average return loss calculations, and for determination of the minimum value of return loss, over a prescribed range of frequencies, the microcomputer has stored in memory a plurality of keyboard selectable program subroutines. Each of the program subroutines comprises an instruction set serving upon command to instruct predetermined computation processing by the microcomputer CPU.

If desired, the basic return loss calculation subroutines may be linked with the weighted-average return loss calculation subroutines.

The program subroutines for directing the test set apparatus in making a weighted-average return loss determination on a circuit under test instruct the making of a series of phasor impedance measurements at prescribed, spaced-apart frequencies. The phasor impedances measured are used in calculating return loss impedance ratio against predetermined reference impedance standards. Return loss impedance ratio as used herein is defined as follows:

$$\frac{Z + Z_{ref}}{Z - Z_{ref}}$$

The inverse square of the return loss impedance ratio for each phasor impedance measurement is determined, which yields the ratio of return power to incident power (i.e., the "return power ratio").

In addition to program subroutines for weighted-average return loss determination, the test set apparatus includes in memory a program subroutine for making unweighted return loss determinations for display. Under the direction of this instruction set, the unweighted return power ratios calculated at the measurement frequencies are summed and averaged for the number of measurements. The result is then multiplied by $-10$ to yield the average return loss over the frequency range.

Yet another program is provided in the test set apparatus for making weighted and unweighted-average return loss determinations against a precision network, for example, a cable made with the Wilcom T240 artificial cable kit. In making this type of test, the test set first measures the phasor impedance of the precision network at a plurality of measurement frequencies in a frequency range, and stores the measurement values. These stored values are thereafter used as the reference impedance values in the return loss impedance ratios.

The program subroutines described above are designated as follows:

| Program Subroutine No. | Program Function |
| --- | --- |
| 500 | Calculates Echo Return Loss (ERL), Singing Return Loss Low (SRL LO) and Singing Return Loss High (SRL HI) weighted per Bell System Technical Publication No. 41009. The measurements of complex impedance are taken in 100 Hz increments across the band of interest, 3800 to 200 Hz. The data is weighted versus frequency and averaged on a power basis. The results are then displayed sequentially (SRL LO, SRL HI and ERL). |
| 501 | Calculates ERL only. Frequency range 2500-200 Hz. |
| 502 | Calculates SRL LO only. Frequency range 1000-200 Hz. |
| 503 | Calculates SRL HI only. Frequency range 3800-1700 Hz. |
| 504 | Calculates ERL and SRL HI on an unweighted basis. For ERL, the frequency range is 500 to 2500 Hz. For SRL HI, the frequency range is 2000 Hz to 3000 Hz. The results are displayed sequentially as in program 500. |
| 505 | Finds the minimum return loss measured |

-continued

| Program Subroutine No. | Program Function |
|---|---|
| | during a sweep from 3800 Hz to 200 Hz in 100 Hz steps. When the sweep is completed, the lowest calculated return loss and the frequency at which it occurs are displayed. |
| 506 | Makes an external reference impedance run on an external network and stores its impedance versus frequency for use as the impedance standard. This program can be used in conjunction with the other programs as discussed in the 500 program. |
| 507 | Calculates Average Power Return Loss (APRL). The frequency is stepped from 3400 Hz to 200 Hz. APRL is a weighted Return Loss Measurement which estimates the listener echo performance, particularly around the environment of Local Digital Central Offices. |
| In all of the return loss routines defined above, the test set stops at the end of each cycle and waits for the "ENT" command before a repeat is made. The following program allows for continuous repeating of the last return loss measurement routine. | |
| 509 | Sets the repeat function for return loss measurements. The Repeat-Cycle Time is set to twice the measure time of the program in use. To exit from the 509 program, simply press CLR/EXIT. |

In all the above frequency range sweeps, 2600 Hz will be skipped to avoid exciting the circuit under test at the SF signalling frequency. The data at 2600 Hz will be calculated from an interpolation routine.

Where applicable, the calculated results are displayed sequentially SRL LO, SRL HI, followed by ERL. The data are "identified" in the RESISTANCE/IMPEDANCE display using the following abbreviations:

"SLL" for SRL LO (singing return loss low)
"SLH" for SRL HI (singing return loss high)
"EHO" for ERL (echo return loss)

Abbreviations used in the 505 and 507 programs, respectively, are:

"SPL" for (minimum return loss during a frequency sweep) "LOS" APRL (average power return loss)

The return loss measurements in dB are displayed in the REACTANCE/PHASE ANGLE display in sequence with the "identifying" display entries. The program number is displayed in the FREQUENCY display.

All of the return loss measurements using programs 500–507 are made using a preset reference of 900 ohms in series with 2.16 microfarads. If a different standard such as 600 ohms and 2.16 microfarads is required, program 101 is entered, then one of the "500" series programs is entered. Measurement is now with a reference to a 600 ohm and 2.16 microfarad standard. Any "100" series program or any external network can be used as the reference for return loss measurements. External networks must be stored, first, using program 506. The CLR/EXIT key or the ON/OFF switch will remove the stored information.

In lieu of an external network, the operation of the test set using programs 500–507 can be observed by connecting a resistor between the T and R terminals. 600 ohms nominal is a good value.

To run a program with the present reference, keys 1 and 3 together are depressed. The frequency display 22 will read P - - - . The test is in the program mode. Next enter the program number. For example, for program 500, make keystrokes of: 5-0-0. The display will then read P500. Next, depress the ENT key. The MEAS indicator will come on for several seconds. When the MEAS indicator goes out, the RESISTANCE/IMPEDANCE window will display SLL, SLH and EHO sequentially for a few seconds each. During the same time intervals the REACTANCE/PHASE ANGLE window will display the dB values for these return loss measurements, SRL LO, SRL HI and ERL, respectively. The cycle can be repeated by pressing the ENT key after twice the measure time has lapsed as observed on the MEAS LED. Of course, if the selected program calculates one value, i.e., P503, only SLH (SRL HI) will be calculated and displayed.

Return loss programs 500 through 505, plus 507, are all entered using the above procedure. Programs 506 and 509 are used in conjunction with these programs.

Program 509 is used in place of engaging the ENT key each time you want the measure cycle repeated. It is entered prior to entering the selected return loss program as follows.

Press CLR/EXIT when the MEAS lamp goes out to remove the previous program. To repeat a program continuously, first press keys 1 and 3 together. The FREQUENCY display will read P - - - . Next, make keystrokes of 5-0-9-ENT. Then, enter the return loss program to be repeated. The measure cycle will keep repeating until CLR/EXIT key is depressed.

C. Detailed Program Listing

The following listing is of all the specific steps for carrying out the operational functions and procedures described above.

```
1  0000       ;        2/10/00       JBN
2  0000       ;SER#75 F305V;FOR NEW HARDWARE  RTN LOSS.
3  0000       ;///////////////////////////////////////
4  0000       ;STATS CTL WORD=B0 FIRST DIGIT  B1=OTHER DIGITS
5  0000       ;B3=CLEAR MEM  B5=RECALL MEM  B6=UP/DOWN  B7=STORE
6  0000       ;///////////////////////////////////////
7  0000       ;OUTPANEL WORD B0=M/F LED B1=LOW  B2=HIGH  B3=AUTO
8  0000       ;B4=(1)  B6=OVERFLOW
9  0000       ;///////////////////////////////////////
10 0000       ;ANGRG WORD,B0=UNSTOP,B1=UNUSED B2=X10 B3 X1
11 0000       ;///////////////////////////////////////
12 0000       ;ADSRT B0=X1/X10 B1=OVERRANGE B2=OUTPUT RELAY
13 0000       ;B3=STATUS REAL B4=STATUS IM B5=X1 B6=X10
14 0000       ;///////////////////////////////////////
15 0000       ;PANEL  B2=RCL LED B3=POLAR B6=DEC POINT
16 0000       ;///////////////////////////////////////
```

```
17 0000          ;SWMO B0=FLASH B1=ER1 B2=EC1 B3=EC3 B4=PTR,ECC3 B5=F1C.
18 0000          ;B6=REPEAT RTN LOSS B7=COMPARE EXT REF
19 0000          ;////////////////////////////////////////////////////
20 0000   12FF   STACK   EQU    12FFH
21 0000   8001   KYB1    EQU    8001H    ;KEY SCCAN
22 0000   8002   OUTRL   EQU    8002H    ;OUTPUT RESTANCE DISPLAY
23 0000   8008   OUTFR   EQU    8008H    ;OUTPUT FREQ DISPLAY
24 0000   800B   OUTIM   EQU    800BH    ;OUTPUT IMAG DISPLAY
25 0000   8010   OUTPL   EQU    8010H    ;LEDS,DEC POINT,ARROW
26 0000   8013   PANEL   EQU    8013H    ;DP,Z OR X,RCL
27 0000   7000   FREQ    EQU    7000H    ;FREQ CTL IN
28 0000   C000   ANRG    EQU    0C000H   ;A/D CONTROL
29 0000   A000   RLLOW   EQU    0A000H   ;A/D
30 0000   A001   RLHI    EQU    0A001H   ;A/D HIGH BYTE
31 0000
32 0000   A002   IMLOW   EQU    0A002H
33 0000   A003   IMHI    EQU    0A003H   ;IMAG HIGH BYTE
34 0000   C001   ADSRT   EQU    0C001H   ;A/D STATUS
35 0000   D0E1   CONST:  EQU    0D0E1H   ;CONSOLE STATS
36 0000   D0E2   CONOT:  EQU    0D0E2H   ;CONSOLE OUT
37 0000
38 0000                          ;DATA STORAGE BELOW
39 0000   1000           ORG    1000H    ;RAM START
40 1000          ENTER:  DS     02       ;DIGIT POINTER
41 1002          PRIN1:  DS     01       ;MSD
42 1003          PRIN2:  DS     01
43 1004          PRIN3:  DS     01
44 1005          PRIN4:  DS     01
45 1006          PRIN5:  DS     01
46 1007          FRBIN:  DS     02       ;LAST FREQ BIN
47 1009          BINRL   DS     02       ;A/D BIN
48 100B          BINIM:  DS     02       ;A/D BIN
49 100D          STATS   DS     01       ;STATUS WORD
50 100E   1010           ORG    1010H    ;STORE START
51 1010          STORE   DS     02       ;MEM STORE
52 1024          OUTRM   DS     01       ;HOLDS OUTPANEL WORD
53 1025          OTRM1   DS     01       ;NEXT 5 HOLD FREQ DATA
54 1026          OTRM2   DS     01
55 1027          OTRM3   DS     01
56 1028          OTRM4   DS     01
57 1029          OTRM5   DS     01
58 102A          RLRAM   DS     04       ;REAL BCD DATA
59 102E          IMRAM   DS     04       ;IMAG BCD DATA
60 1032          RNGE    DS     02       ;RANGE COND
61 1034          LSTRC   DS     02       ;LAST MEM RECALLED
62 1036          STEPS   DS     02       ;STEP SIZE
63 1038          ZRAM:   DS     04       ;STORE Z DATA
64 103C          PHRAM:  DS     04       ;STORE DEGREES
65 1040          ALTRM:  DS     01       ;2ND PANEL LEDS & DP
66 1041          FLTRL:  DS     04       ;FLOAT REAL
67 1045          FLTIM:  DS     04       ;FLOAT IMAG
68 1049          PEBIN:  DS     02       ;BINARY PHASE
69 104B          ZBIN:   DS     02       ;BINARY VALUES
70 104D          FLZ:    DS     04       ;FLOATING Z
71 1051          FLTFR:  DS     04       ;FLOAT FREQ
72 1055          RTNLO:  DS     02       ;BIN RTN LOSS
73 1057          FLTIR:  DS     04       ;FLOAT IMAG REF
74 105B          RRAM:   DS     02       ;R1 IN BIN
75 105D          CRAM:   DS     02       ;BIN IMAG
76 105F          FLTRF:  DS     04       ;FLOAT REAL REF
77 1063          TEMP3:  DS     04       ;STORAGE
78 1067          SWLO:   DS     01       ;LOG SWITCH
79 1068          CODER:  DS     04       ;CODE RAM
80 106C          SWMO:   DS     01       ;MODE SWITCH B2
81 106D          CRAM2:  DS     02       ;C2 IN BIN
82 106F          FLTX1:  DS     04       ;C1 IN XC
83 1073          FLTX2:  DS     04       ;C2 IN XC
84 1077          FLTR1:  DS     04       ;R IN FLOAT
85 107B          FLIPI:  DS     04       ;POLAR INPUT
86 107F          FLTPR:  DS     04       ;POLAR INPUT R
87 1083          FLTPH:  DS     04       ;PHASE
88 1087          FLASH:  DS     01       ;ALT BITS
89 1088          PRINT:  DS     01       ;CARD IN,STATS
90 1089   1089   RAM     SET    $
```

```
 91 1069    0000              ORG     0000H
 92 0000 31FF10               LXI     SP,STACK
 93 0003 C3A800               JMP     INITL
 94 0006    0008              ORG     0008H
 95 0008 C33500      RST1:    JMP     MUL      ;CALL    MULTIPLY
 96 000B 0E0A0A0A    MPROG:   DB      0EH,0AH,0AH,0AH
 97 000F    0010              ORG     0010H
 98 0010 C31800      RST2:    JMP     LOD      ;LOAD FLTP ACC'
 99 0013 0F0F0F0F    MSGBK:   DB      0FH,0FH,0FH,0FH;BLANK
100 0017    0018              ORG     0018H
101 0018 C3EC0B      RST3:    JMP     STR      ;STORE FLTP AT HL
102 001B 9E6E630B    FLIT9:   DB      9EH,6EH,63H,0BH
103 001F    0020              ORG     0020H
104 0020 C3770C      RST4:    JMP     AD       ;CALL    ADD
105 0023 0E0A030A    MSG0:    DB      0EH,0AH,03H,0AH
106 0027    0028              ORG     0028H
107 0028 C32803      RST5:    JMP     CLEAR    ;CALL    CLEAR
108 002B 0B0A020A    MSGE:    DB      0BH,0AH,02H,0AH
109 002F    0030              ORG     0030H
110 0030 C30500      RST6:    JMP     UPPNL    ;UPDATE DISPLAYS
111 0033 0B0A010A    MSGE1:   DB      0BH,0AH,01,0AH
112 0037    0038              ORG     0038H
113 0038 E1          RST7:    POP     H        ;RST STACK
114 0039 C3FE00               JMP     KSCAN
115 003C E1          ERROR:   POP     H        ;CORRECT STACK
116 003D EF          ERR1     RST     5;CLEAR
117 003E 215200               LXI     H,MSG    ;OUTPUT MESSAGE
118 0041 112610      EMSG     LXI     D,OTRM2
119 0044 010400               LXI     B,24
120 0047 EDB0                 LDIR
121 0049 F7                   RST     6
122 004A AF                   XRA     A
123 004B 320010               STA     ENTER
124 004E 320D10               STA     STATS
125 0051 FF                   RST     7
126 0052 00B0D0E     MSG:     DB      0CH,0BH,0DH,0EH
127 0056 0F0D000F    MSGL:    DB      0FH,0DH,00H,0FH  ; L?
128 005A 0F0C010F    MSGHI:   DB      0FH,0CH,01H,0FH  ;H1
129 005E 23490FDA    F2PI:    DB      23H,49H,0FH,0DAH
130 0062 82000000    FTWO:    DB      82H,0,0,0
131 0066    0066              ORG     0066H    ;NMI
132 0066 D9                   EXX     ;EXCHANGE REG
133 0067 08                   EXAF
134 0068 C31905               JMP     INTAR
135 006B 11EC03      FRONE:   LXI     D,23ECH  ;1004HZ
136 006E ED530713             SDED    FRBIN    ;STORE IT
137 0072 ED530073             SDED    FREQ     ;OUT
138 0076 EF                   RST     5;CLEAR
139 0077 212510               LXI     H,OTRM1  ;MSD
140 007A EB                   XCHG
141 007B CDCE04               CALL    BINBC    ;CONVERT
142 007E F7                   RST     6
143 007F F7                   RST     6
144 0080 F7                   RST     6;UPPNL  ;UPDATE DISPLAY
145 0081 06FF                 MVI     B,0FFH
146 0083 CDB301               CALL    DELAY
147 0086 3E40                 MVI     A,40H;RESET USART
148 0088 32E1DC               STA     CONST
149 008B 3ECE                 MVI     A,0CEH;SET UP
150 008D 32E1D0               STA     CONST
151 0090 F7                   RST     6
152 0091 3E37                 MVI     A,37H
153 0093 32E1D0               STA     CONST;SET UP
154 0096 3AE1D0               LDA     CONST
155 0099 FE80                 CPI     80H;IS CARD IN
156 009B 2005                 JRNZ    NCARD
157 009D 3E80                 MVI     A,80H
158 009F 328812'              STA     PRINT;SET BIT 7
159 00A2 3E05        NCARD:   MVI     A,05H    ;X10
160 00A4 320000               STA     ANGRG    ;START A/D
161 00A7 FF                   RST     7
162 00A8 AF          INITL:   XRA     A        ;A=0
163 00A9 320010               STA     SYM0
164 00AC 320010               STA     PRINT
165 00AF 210010               LXI     H,ENTER
```

```
166 00B2 060E              MVI    B,0EH     ;# OF PASSES
167 00B4 77       LOOP:    MOV    M,A
168 00B5 23                INX    H
169 00B6 10FC              DJNZ   LOOP
170 00B8 211010             LXI    H,STORE
171 00BB 223410             SHLD   LSTRG
172 00BE 218423             LXI    H,902     ;9200HVS
173 00C1 225B10             SHLD   RRAM
174 00C4 217005             LXI    H,2160    ;2160NF
175 00C7 225D10             SHLD   CRAM
176 00CA 210000             LXI    H,0       ;0NF
177 00CD 226D10             SHLD   CRAM2
178 00D0 212410             LXI    H,OUTRM
179 00D3 0600              MVI    B,30H
180 00D5 77       SETUP:   MOV    M,A
181 00D6 23                INX    H
182 00D7 10FC              DJNZ   SETUP
183 00D9 3E0D              MVI    A,0DH     ;AUTO MEAS LEDS
184 00DB 322410             STA    OUTRM
185 00DE 3E49              MVI    A,49H     ;INITAL RANGE COND
186 00E0 323310             STA    1033H
187 00E3
188 00E3 3EAA              MVI    A,0AAH
189 00E5 328710             STA    FLASH
190 00E8 3E60              MVI    A,60H
191 00EA 321830             STA    PANEL
192 00ED 3E0F              MVI    A,0FH
193 00EF 323B10             STA    ZRAM
194 00F2 323C10             STA    PHRAM
195 00F5 322A10             STA    RLRAM
196 00F8 322E10             STA    IMRAM
197 00FB C36B00             JMP    FRONE
198 00FE 218810   KSCAN:   LXI    H,PRINT
199 0101 7E                MOV    A,M
200 0102 FE81              CPI    81H;PRINTER ON & READY
201 0104 CA87EE             JZ     PTR
202 0107 212130   BKSCN:   LXI    H,KYB1    ;LOAD KEYBOARD ADDRESS
203 010A 0E00              MVI    C,0
204 010C 7E       KBLP1:   MOV    A,M       ;GET ROW 1
205 010D 0608              MVI    B,8
206 010F 1F       KBLP2:   RAR
207 0110 0C                INR    C
208 0111 3820              JRC    VLDCR     ;KEY # IN C
209 0113 05                DCR    B
210 0114 20F9              JRNZ   KBLP2     ;NOT DONE
211 0116 CB05              RLCR   L         ;3302 3304
212 0118 3E04              MVI    A,04
213 011A BD                CMP    L         ;3304 YET?
214 011B 20EF              JRNZ   KBLP1     ;NO
215 011D 7E                MOV    A,M       ;CONTROL IN
216 011E 0F                RRC
217 011F DA9623             JC     INCDN
218 0122 0F                RRC
219 0123 DA9C23             JC     INCUP
220 0126 0F                RRC
221 0127 DA5B24             JC     RANGE
222 012A 0F                RRC
223 012B DA5F22             JC     ENT
224 012E 0F                RRC
225 012F DA9801             JC     CLRKB
226 0132 0F                RRC
227 0133 DABD01             JC     DMODE
228 0136 0F                RRC
229 0137 DA2101             JC     STRCL
230 013A 0F                RRC
231 013B DAB401             JC     STSTR
232 013E FF                RST    7
233 013F CDCF21   VLDCR:   CALL   KDBNC     ;DEBOUNCE
234 0142 79                MOV    A,C
235 0143 FE0A              CPI    10
236 0145 CC2303             CZ     ZERO      ;10=0
237 0148 4F                MOV    C,A       ;SAVE
238 0149 3ACD10             LDA    STATS     ;KEYBOARD STATUS TO A
239 014C C347              BIT    A,0
240 014E CAF601             JZ     DIGT1     ;FIRST DIGIT
```

```
241 0151 CB4F              BIT    A,1
242 0153 C22022            JNZ    DIGIT    ;OTHERS
243 0156 211D10            LXI    H,STORE  ;LOAD STORE START
244 0159 F5                PUSH   PSW
245 015A 79                MOV    A,C      ;# IN A
246 015B 87                ADD    A        ;X2
247 015C 85                ADD    L        ;2A +STORE
248 015D 6F                MOV    L,A      ;HL ADDRESS
249 015E F1                POP    PSW      ;RETURN STATUS
250 015F CB6F              BIT    A,5      ;RECALL
251 0161 C27501            JNZ    RECAL
252 0164 CB7F              BIT    A,7      ;STORE ?
253 0166 2896              JRZ    KSCAN    ;ERROR
254 0168 ED5B7710          LDED   FRBIN    ;DE FREQ BINARY
255 016C 73                MOV    M,E      ;STORE LOW
256 016D 23                INX    H
257 016E 72                MOV    M,D      ;HIGH
258 016F AF                XRA    A
259 0170 322D10            STA    STATS
260 0173 F7                RST    6;UPPNL
261 0174 FF                RST    7
262 0175 223410   RECAL:   SHLD   LSTRC    ;STORE LAST
263 0178 5E                MOV    E,M      ;GET LOW
264 0179 23                INX    H
265 017A 56                MOV    D,M      ;HIGH
266 017B CD4B23            CALL   LIMIT
267 017E C3A022            JMP    OUT2
268 0181 CDCF01   STRCL:   CALL   KDBNC
269 0184 CD4F04            CALL   STOP
270 0187 3E21              MVI    A,21H
271 0189 322D10            STA    STATS
272 018C 3A4010            LDA    ALTRM
273 018F CBD7              SETB   A,2
274 0191 324010            STA    ALTRM
275 0194 321B10            STA    PANEL
276 0197 FF                RST    7
277 0198 CDCF01   CLRKB:   CALL   KDBNC
278 019B CD4F04   EXIT:    CALL   STOP
279 019E 212410            LXI    H,OUTRM
280 01A1 CBF6              SETB   M,6      ;RESET OVERFLOW
281 01A3 CB86              RESB   M,0
282 01A5 214010            LXI    H,ALTRM
283 01A8 CB96              RESB   M,2
284 01AA AF                XRA    A
285 01AB 326C10            STA    SWM0
286 01AE 322D10            STA    STATS
287 01B1 EF                RST    5;CLEAR
288 01B2 F7                RST    6;UPPNL
289 01B3 FF                RST    7
290 01B4 CDCF01   STSTR:   CALL   KDBNC
291 01B7 3E81              MVI    A,81H
292 01B9 322D10            STA    STATS
293 01BC FF                RST    7
294 01BD CDCF01   DMODE:   CALL   KDBNC
295 01C0 214010            LXI    H,ALTRM
296 01C3 CB5E              BIT    M,3
297 01C5 2804              JRZ    SET1
298 01C7 CB9E              RESB   M,3
299 01C9 1802              JMPR   ODMOD
300 01CB CBDE     SET1:    SETB   M,3
301 01CD F7       ODMOD:   RST    6;UPPNL
302 01CE FF                RST    7
303 01CF 0614     KDBNC:   MVI    B,20
304 01D1 CDE301            CALL   DELAY
305 01D4 7E                MOV    A,M
306 01D5 FE05              CPI    05
307 01D7 CA8E27            JZ     PROG
308 01DA B7                ORA    A
309 01DB 20F2              JRNZ   KDBNC
310 01DD 0614              MVI    B,20
311 01DF CDE301            CALL   DELAY
312 01E2 C9                RET
313 01E3 C5       DELAY:   PUSH   B
314 01E4 E5                PUSH   H
315 01E5 D5                PUSH   D
```

```
316 01E6 21B0FF    DELP3:  LXI     H,0FFB0H
317 01E9 110100            LXI     D,01
318 01EC 19        DELP4:  DAD     D
319 01ED 30FD              JRNC    DELP4
320 01EF 05                DCR     B
321 01F0 20F4              JRNZ    DELP3
322 01F2 D1                POP     D
323 01F3 E1                POP     H
324 01F4 C1                POP     B
325 01F5 C9                RET
326 01F6 CD4F04    DIGT1:  CALL    STOP
327 01F9 C5                PUSH    B
328 01FA EF                RST     5;CLEAR
329 01FB 210210            LXI     H,PBIN1
330 01FE C1                POP     B
331 01FF 71                MOV     M,C
332 0200 AF                XRA     A
333 0201 B9                CMP     C
334 0202 CAFE00            JZ      KSCAN
335 0205 79                MOV     A,C
336 0206 322010            STA     CTRM5
337 0209 3A0D10            LDA     STATS
338 020C CBCF              SETB    A,1
339 020E CBC7              SETB    A,0
340 0210 320D10            STA     STATS
341 0213 23                INX     H
342 0214 220010            SHLD    ENTER
343 0217 212410            LXI     H,OUTRM
344 021A CB86              RESB    M,0
345 021C CBF6              SETB    M,6
346 021E F7                RST     6
347 021F FF                RST     7
348 0220 2A0010    DIGIT:  LHLD    ENTER   ;LOAD POINTER
349 0223 3E06              MVI     A,6
350 0225 BD                CMP     L
351 0226 DA6603            JC      OVRFL   ;TO MANY DIGITS
352 0229 C23702            JNZ     NTOVF
353 022C 3E01              MVI     A,01
354 022E E5                PUSH    H
355 022F 210210            LXI     H,PBIN1
356 0232 BE                CMP     M
357 0233 E1                POP     H
358 0234 C26603            JNZ     OVRFL
359 0237 71        NTOVF:  MOV     M,C     ;STORE #
360 0238 7D                MOV     A,L
361 0239 D601              SUI     1
362 023B 4F                MOV     C,A     ;# OF DIGITS
363 023C 23                INX     H
364 023D 220010            SHLD    ENTER
365 0240 0600              MVI     B,0
366 0242 212A10            LXI     H,ALRAM ;LSD DISPLAY RAM
367 0245 ED42              DSBC    B       ;# OF DIGITS DISPLAYED
368 0247 110210            LXI     D,PBIN1 ;START OF KEYBOAR ENTERTS
369 024A EB                XCHG
370 024B ED30              LDIR
371 024D F7                RST     6;UPPNL-
372 024E FF                RST     7
373 024F 210D10    ER106:  LXI     H,STATS
374 0252 CB86              RESB    M,0
375 0254 AF                XRA     A
376 0255 320010            STA     ENTER
377 0258 ED5B0712          LDED    FRBIN
378 025C C3A002            JMP     OUT2
379 025F CDCF01    ENT:    CALL    KDBNC   ;DEBOUNCE
380 0262 110210            LXI     D,PBIN1 ;FIRST DIGIT
381 0265 2A0210            LHLD    ENTER   ;POINTER
382 0268 3A6C10            LDA     SWM0
383 026B 0F                RRC
384 026C 0F                RRC
385 026D DA9008            JC      ER1
386 0270 0F                RRC
387 0271 DAB608            JC      EC1
388 0274 0F                RRC
389 0275 DAD308            JC      EC2
390 0278 0F                RRC            ;BIT    4
```

```
391 0279 DA7010          JC       ECC3
392 027C 7D      B126:   MOV      A,L
393 027D FE00            CPI      0
394 027F CA3D20          JZ       ERR1
395 0282 D602            SUI      2
396 0284 CDAD04          CALL     BCDBN         ;# IN A
397 0287 EB              XCHG
398 0288 CD7603          CALL     ELMIT
399 028B 210D10          LXI      H,STATS
400 028E CB66            BIT      M,4
401 0290 C2CA07          JNZ      EPOINT
402 0293 AF              XRA      A
403 0294 77              MOV      M,A
404 0295 320010          STA      ENTER
405 0298 3A6C10          LDA      SWMO
406 029B CB6F            BIT      A,5
407 029D C24F22          JNZ      ER126
408 02A0 ED530710 OUT2:  SDED     FRBIN         ;LAST FR
409 02A4 ED532070        SDED     FREQ
410 02A8 EF              RST      5;CLEAR
411 02A9 212410          LXI      H,OUTRM
412 02AC CBC6            SETB     M,0           ;FR LED
413 02AE 23              INX      H             ;MSD POINTER
414 02AF EB              XCHG
415 02B0 CDC604          CALL     BINBC
416 02B3 F7              RST      6;UPPNL
417 02B4 2A0710          LHLD     FRBIN
418 02B7 CDBB0F          CALL     CONFL
419 02BA CDEA0F          CALL     LADC
420 02BD 215110          LXI      H,FLTFR
421 02C0 DF              RST      3
422 02C1 CD2604          CALL     START
423 02C4 FF              RST      7
424 02C5 212410  UPPNL:  LXI      H,OUTRM
425 02C8 CBA6            RESB     M,4
426 02CA 23              INX      H
427 02CB AF              XRA      A
428 02CC BE              CMP      M
429 02CD CC1E23          CZ       CLR1
430 02D0 200D            JRNZ     NTBLK
431 02D2 0603            MVI      B,03
432 02D4 0E0F            MVI      C,0FH
433 02D6 23      BLANK:  INX      H
434 02D7 BE              CMP      M
435 02D8 2005            JRNZ     NTBLK
436 02DA 71              MOV      M,C
437 02DB 05              DCR      B
438 02DC B8              CMP      B
439 02DD 20F7            JRNZ     BLANK
440 02DF 110990  NTBLK:  LXI      D,OUTFR
441 02E2 212610          LXI      H,OTRM2
442 02E5 CD3023          CALL     DSPLY
443 02E8 3A2410  NTFR:   LDA      OUTRM
444 02EB 321030          STA      OUTPL
445 02EE 3A4010          LDA      ALTRM
446 02F1 CB5F            BIT      A,3
447 02F3 321930          STA      PANEL
448 02F6 2013            JRNZ     ALTOT
449 02F8 212A10          LXI      H,RLRAM
450 02FB 110200          LXI      D,OUTRL
451 02FE CD3023          CALL     DSPLY
452 0301 212E10          LXI      H,IMRAM
453 0304 110890          LXI      D,OUTIM
454 0307 CD3023          CALL     DSPLY
455 030A C9              RET
456 030B 213810  ALTOT:  LXI      H,ZRAM
457 030E 110090          LXI      D,OUTRL
458 0311 CD3023          CALL     DSPLY
459 0314 213C10          LXI      H,PHRAM
460 0317 110890          LXI      D,OUTIM
461 031A CD3023          CALL     DSPLY
462 031D C9      NTALZ:  RET
463 031E 23      CLR1:   DCX      H
464 031F CBE6            SETB     M,4
465 0321 23              INX      H
```

```
466 0322 C9                      RET
467 0323 DE0A     ZERO:  SBI     12
468 0325 C9              RET
469 0326 212410   CLEAR: LXI     H,OUTRM
470 0329 CBE6            SETB    M,4     ;1=0
471 032B 23              INX     H
472 032C 0605            MVI     B,05    ;LOAD BYTE CTR
473 032E AF              XRA     A
474 032F 77       LPCR:  MOV     M,A     ;OUT0
475 0330 23              INX     H       ;NEXT
476 0331 10FC            DJNZ    LPCR
477 0333 C9              RET
478 0334 0604     IMPZO: MVI     B,04    ;LOAD BYTE CTR
479 0336 AF              XRA     A
480 0337 77       LPZ:   MOV     M,A
481 0338 23              INX     H
482 0339 10FC            DJNZ    LPZ
483 033B C9              RET
484 033C 7E       DSPLY: MOV     A,M     ;IN FIRST
485 033D F630            ORI     30H     ;CONDITION MSD
486 033F 12              STAX    D       ;OUT MSD
487 0340 23              INX     H
488 0341 7E              MOV     A,M     ;NEXT DIGIT
489 0342 F620            ORI     20H
490 0344 12              STAX    D
491 0345 23              INX     H
492 0346 7E              MOV     A,M
493 0347 F610            ORI     10H
494 0349 12              STAX    D
495 034A 23              INX     H
496 034B 7E              MOV     A,M
497 034C 12              STAX    D
498 034D C9              RET
499 034E E5       LIMIT: PUSH    H
500 034F CB7A            BIT     D,7
501 0351 202D            JRNZ    ERR
502 0353 AF              XRA     A
503 0354 211F4E          LXI     H,4E1FH ;19999
504 0357 ED52            DSBC    D
505 0359 3825            JRC     ERR
506 035B 211300          LXI     H,13H   ;20
507 035E ED52            DSBC    D
508 0360 301E            JRNC    ERR
509 0362 E1              POP     H
510 0363 C9              RET
511 0364 E1       ERRHI: POP     H
512 0365 E1              POP     H
513 0366 EF       OVRFL: RST     5;CLEAR
514 0367 215A00          LXI     H,MSGHI
515 036A C34100          JMP     EMSG
516 036D E1       ERRLO: POP     H
517 036E E1              POP     H
518 036F EF              RST     5;CLEAR
519 0370 215600          LXI     H,MSGL
520 0373 C34100          JMP     EMSG
521 0376 E5       BLMIT: PUSH    H
522 0377 211300          LXI     H,13H
523 037A ED52            DSBC    D
524 037C 30EF            JRNC    ERRLO
525 037E E1              POP     H
526 037F C9              RET
527 0380 E1       ERR:   POP     H
528 0381 E1              POP     H
529 0382 FF              RST     7
530 0383 212410   LASTS: LXI     H,OUTRM ;CHECK ENTRY
531 0386 CB46            BIT     M,0
532 0388 2821            JRZ     NSTEP
533 038A 1833            JMPR    NNEW
534 038C CDCF21   INCUP: CALL    KDBNC
535 038F 210D10          LXI     H,STATS
536 0392 CBF6            SETB    M,6     ;SET UP BIT
537 0394 1808            JMPR    STEP
538 0396 CDCF21   INCDN: CALL    KDBNC
539 0399 210D10          LXI     H,STATS
540 039C CBB6            RESB    M,6     ;RESET UP BIT
```

```
541 039E C36E      STEP:   BIT     M,5        ;RCL MODE
542 03A0 203F              JRNZ    RCLSP      ;INC TO NEXT MEM LOCATION
543 03A2 CB56              BIT     M,2
544 03A4 20DD              JRNZ    LASTS
545 03A6 CB46              BIT     M,0        ;ANY DIGIT ENTRYS
546 03A8 CA0D04             JZ      INC1       ;NO INC BY 1
547 03AB 110210     NSTEP:  LXI     D,PBIN1
548 03AE 2A2010             LHLD    ENTER      ;POINTER
549 03B1 7D                 MOV     A,L
550 03B2 D602               SUI     2          ;# OF DIGITS IN A
551 03B4 FE04               CPI     4          ;MAX
552 03B6 D40A04             CNC     REDU3      ;SET MAX
553 03B9 CDAD04             CALL    BCDBN
554 03BC 223610             SHLD    STEPS
555 03BF 2A3610     NNEW:   LHLD    STEPS
556 03C2 EB                 XCHG
557 03C3 2A0710             LHLD    FRBIN      ;LAST FR
558 03C6 19                 DAD     D          ;ADD RESULT IN HL
559 03C7 E5                 PUSH    H
560 03C8 210D10             LXI     H,STATS
561 03CB CBD6               SETB    M,2
562 03CD CB86               RESB    M,0
563 03CF CB8E               RESB    M,1
564 03D1 CB76               BIT     M,6
565 03D3 E1                 POP     H
566 03D4 CC1E04             CZ      DOWN
567 03D7 112510             LXI     D,OTRM1
568 03DA EB                 XCHG
569 03DB CD4E03     OUT:    CALL    LIMIT
570 03DE C3A022             JMP     OUT2
571 03E1 7E         RCLSP:  MOV     A,M        ;STATUS
572 03E2 ED5B3410            LDED    LSTRC      ;LAST RECALLED MEM
573 03E6 CB77               BIT     A,6
574 03E8 280C               JRZ     RCLDN
575 03EA 7B                 MOV     A,E
576 03EB FE22               CPI     22H
577 03ED CC2604             CZ      SETLO      ;BACK TO MEM 0
578 03F0 13                 INX     D
579 03F1 13                 INX     D
580 03F2 EB                 XCHG
581 03F3 C37501             JMP     RECAL
582 03F6 7B         RCLDN:  MOV     A,E
583 03F7 FE10               CPI     10H
584 03F9 CC0204             CZ      SETHI      ;BACK TO MEM 9
585 03FC 1B                 DCX     D
586 03FD 1B                 DCX     D
587 03FE EB                 XCHG
588 03FF C37501             JMP     RECAL
589 0402 112410     SETHI:  LXI     D,1024H    ;MEM 9
590 0405 C9                 RET
591 0406 110E10     SETLO:  LXI     D,100EH    ;MEM 0
592 0409 C9                 RET
593 040A 3E03       REDU3:  MVI     A,3
594 040C C9                 RET
595 040D CB7E       INC1:   BIT     M,7        ;STORE MODE
596 040F C2FE02             JNZ     KSCAN
597 0412 ED5B0710           LDED    FRBIN
598 0416 13                 INX     D          ;+1
599 0417 CB76               BIT     M,6
600 0419 CC2304             CZ      DOW1
601 041C 18BD               JMPR    OUT
602 041E ED52       DOWN:   DSBC    D
603 0420 ED52               DSBC    D
604 0422 C9                 RET
605 0423 1B         DOW1:   DCX     D
606 0424 1B                 DCX     D
607 0425 C9                 RET
608 0426 212410     START:  LXI     H,OUTRM
609 0429 CB5E               BIT     M,3
610 042B 2013               JRNZ    STRTH
611 042D CB56               BIT     M,2
612 042F 200F               JRNZ    STRTH
613 0431 CBCE       STRTL:  SETB    M,1
614 0433 CB96               RESB    M,2
```

```
615 0435 214010            LXI   H,ALTRM
616 0438 CBB6              RESB  M,6
617 043A 3E09              MVI   A,29
618 043C 320000            STA   ANGRG
619 043F C9                RET
620 0440 C3D6     STRTH:   SETB  M,2
621 0442 CB8E              RESB  M,1
622 0444 214010            LXI   H,ALTRM
623 0447 CBF6              SETB  M,6
624 0449 3E05              MVI   A,05H
625 044B 320000            STA   ANGRG
626 044E C9                RET
627 044F 210100   STOP:    LXI   H,ADSRT;A/DSTATUS
628 0452 CB56     OTCK:    BIT   M,2
629 0454 20FC              JRNZ  OTCK
630 0456 AF                XRA   A
631 0457 320000            STA   ANGRG
632 045A C9                RET
633 045B CDCF01   RANGE:   CALL  KDBNC
634 045E CD4F04            CALL  STOP
635 0461 ED4B3210           LBCD  RNGE    ;LOAD   RANGE WORD
636 0465 C5                PUSH  B
637 0466 F1                POP   PSW     ;AF
638 0467 17                RAL
639 0468 F5                PUSH  PSW
640 0469 C1                POP   B       ;A,WITH FLAGS IN BC
641 046A ED433210           SBCD  RNGE
642 046E CB47              BIT   A,0     ;RANGE STILL IN A TEST AUTO
643 0470 202A              JRNZ  AUTO
644 0472 C357              BIT   A,2
645 0474 2013              JRNZ  HI
646 0476 212410   LOW:     LXI   H,OUTRM
647 0479 CBCE              SETB  M,1     ;LOW LED
648 047B CB96              RESB  M,2     ;HIGH LED
649 047D CB9E              RESB  M,3     ;AUTO
650 047F 7E                MOV   A,M
651 0480 321030            STA   OUTPL
652 0483 C347              BIT   A,0
653 0485 C42624            CNZ   START
654 0488 FF                RST   7
655 0489 212410   HI:      LXI   H,OUTRM
656 048C CBD6              SETB  M,2
657 048E CB8E              RESB  M,1
658 0490 CB9E              RESB  M,3
659 0492 7E                MOV   A,M
660 0493 321050            STA   OUTPL
661 0496 C347              BIT   A,0
662 0498 C42624            CNZ   START
663 049B FF                RST   7
664 049C 3A2410   AUTO:    LDA   OUTRM
665 049F CBDF              SETB  A,3
666 04A1 322410            STA   OUTRM
667 04A4 321090            STA   OUTPL
668 04A7 C347              BIT   A,0
669 04A9 C42624            CNZ   START   ;START IF NOT MEAS
670 04AC FF       SKIPS:   RST   7
671 04AD 4F       BCDBN:   MOV   C,A     ;BCD BIN
672 04AE 210000            LXI   H,00
673 04B1 1A       AGAIN:   LDAX  D       ;DE POINTS TO MS BCD DIGIT
674 04B2 13                INX   D       ;A HAS # OF BCD DIGITS < 5
675 04B3 D5                PUSH  D
676 04B4 1600              MVI   D,00
677 04B6 5F                MOV   E,A
678 04B7 19                DAD   D
679 04B8 0D                DCR   C       ;LAST DIGIT
680 04B9 2809              JRZ   BCOUT
681 04BB E5                PUSH  H
682 04BC 29                DAD   H       ;X2
683 04BD 29                DAD   H       ;X4
684 04BE D1                POP   D       ;X1
685 04BF 19                DAD   D       ;X5
686 04C0 29                DAD   H       ;10
687 04C1 D1                POP   D       ;NEXT DIGIT
688 04C2 18ED              JMPR  AGAIN
```

```
689 04C4 D1         BCOUT:  POP    D           ;RESTORE STACK
690 04C5 C9                 RET
691 04C6 C11227     BINBC:  LXI    B,12000     ;BIN# IN HL
692 04C9 CDE504             CALL   BDIGT       ;DE POINTS TO MSD BCD LOCATION
693 04CC 01E803     BIN32:  LXI    B,1000      ;DE+1=NEXT DIGIT
694 04CF CDE504             CALL   BDIGT       ;BCD# MUST =00000 TO START
695 04D2 016400     BINB3:  LXI    B,100
696 04D5 CDE504             CALL   BDIGT
697 04D8 010A00             LXI    B,10
698 04DB CDE504             CALL   BDIGT
699 04DE 010100             LXI    B,1
700 04E1 CDE504             CALL   BDIGT
701 04E4 C9                 RET
702 04E5 ED42       BDIGT:  DSBC   B
703 04E7 FAF004             JM     ADDIN
704 04EA EB                 XCHG
705 04EB 34                 INR    M
706 04EC EB                 XCHG
707 04ED F2E504             JP     BDIGT
708 04F0 09         ADDIN:  DAD    B
709 04F1 13                 INX    D
710 04F2 AF                 XRA    A           ;RESET CARRY FLAG
711 04F3 C9                 RET
712 04F4 ED5B0718   LOWFR:  LDED   FRBIN
713 04F8 216300             LXI    H,99        ;HZ
714 04FB ED52               DSBC   D           ;<?
715 04FD C9                 RET
716 04FE 2101C0     HOLDN:  LXI    H,ADSRT
717 0501 CB5E               BIT    M,3
718 0503 20F9               JRNZ   HOLDN
719 0505 CB76               BIT    M,6
720 0507 2804               JRZ    HLOW
721 0509 3E07               MVI    A,7
722 050B 1802               JMPR   HDLY
723 050D 3E0B       HLOW:   MVI    A,0BH
724 050F 3200C0     HDLY:   STA    ANGR3
725 0512 01FF00             LXI    B,0FFH
726 0515 CDL301             CALL   DELAY
727 0518 C9                 RET
728 0519 CDF404     INTAR:  CALL   LOWFR
729 051C D4FE04             CNC    HOLDN
730 051F 218810             LXI    H,PRINT
731 0522 CBCE               SETP   M,2
732 0524 2A02A0             LHLD   RLLOW
733 0527 CBEC               SETB   H,5
734 0529 220910             SHLD   BINRL
735 052C 2101C0             LXI    H,ADSRT
736 052F CB66       WAIT:   BIT    M,4
737 0531 20FC               JRNZ   WAIT
738 0533 2A02A0             LHLD   IMLOW
739 0536 220B10             SHLD   BINIM
740 0539 3A2410             LDA    OUTRM
741 053C CB5F               BIT    A,3
742 053E C2E429             JNZ    FNDRG
743 0541 2A0310     DATA:   LHLD   BINIM
744 0544 CD680A             CALL   COND
745 0547 214510             LXI    H,FLTIM
746 054A
747 054A DF                 RST    3           ;STR FLOAT #
748 054B 2A0910             LHLD   BINRL
749 054E CD680A             CALL   COND
750 0551 214110             LXI    H,FLTRL
751 0554 DF                 RST    3           ;STR FLOAT #
752 0555 212E10             LXI    H,IMRAM
753 0558 E5                 PUSH   H
754 0559 CD3403             CALL   IMPZO
755 055C 214510             LXI    H,FLTIM
756 055F D7                 RST    2           ;LOD
757 0560 CD932F             CALL   VFIX
758 0563 D1                 POP    D           ;IMRAM
759 0564 CDCC04             CALL   BINB2
760 0567 212A10             LXI    H,RLRAM
761 056A CD3403             CALL   IMPZO
762 056D 214110             LXI    H,FLTRL
763 0570 D7                 RST    2           ;LOD
```

```
764 0571 CD9B0F          CALL    VFIX
765 0574 112A10          LXI     D,RLRAM
766 0577 D5              PUSH    D
767 0578 CDCC04          CALL    BINB2
768 057B E1              POP     H
769 057C 3A0A10          LDA     100AE       ;BINRL-1
770 057F CD352A          CALL    SNCOR
771 0582 212E10          LXI     H,IMRAM
772 0585 3A0C10          LDA     100CH       ;BINIM+1
773 0588 F5              PUSH    PSW
774 0589 CD352A          CALL    SNCOR
775 058C F1              POP     PSW
776 058D CB6F            BIT     A,5
777 058F 200D            JRNZ    NMINS
778 0591 214510          LXI     H,FLTIM
779 0594 E5              PUSH    H
780 0595 D7              RST     2           ;LOD
781 0596 CDFD0B          CALL    ABS
782 0599 CDFA0B          CALL    CHS
783 059C E1              POP     H
784 059D DF              RST     3           ;STR FLOAT #
785 059E 3A6C10  NMINS:  LDA     SWMO
786 05A1 CB47            BIT     A,2
787 05A3 C27706          JNZ     CALC        ;SET RTN LOSS
788 05A6 214110          LXI     H,FLTRL
789 05A9 D7              RST     2           ;LOD
790 05AA 217F10          LXI     H,FLTPR
791 05AD DF              RST     3           ;STR FLOAT #
792 05AE 214510          LXI     H,FLTIM
793 05B1 D7              RST     2           ;LOD
794 05B2 217F10          LXI     H,FLTPI
795 05B5 DF              RST     3           ;STR FLOAT #
796 05B6 CD4106          CALL    POLAR
797 05B9 218310          LXI     H,FLTPH
798 05BC DF              RST     3           ;STR FLOAT #
799 05BD 213D0E          LXI     H,FTEN
800 05C0 CF              RST     1
801 05C1 CD9B0F          CALL    VFIX
802 05C4 224910          SHLD    PHBIN
803 05C7 214D10          LXI     H,FLZ
804 05CA D7              RST     2           ;LOD
805 05CB CD9B0F          CALL    VFIX
806 05CE 224B10          SHLD    ZBIN
807 05D1 11CF07          LXI     D,7CFH
808 05D4 ED52            DSBC    D
809 05D6 D2BF09          JNC     ZOVER
810 05D9 213810  CORR:   LXI     H,ZRAM
811 05DC E5              PUSH    H
812 05DD E5              PUSH    H           ;SAVE
813 05DE CD3403          CALL    IMPZO
814 05E1 D1              POP     D           ;ZRAM
815 05E2 2A4B10          LHLD    ZBIN
816 05E5 CDCC04          CALL    BINB2
817 05E8 213C10          LXI     H,PHRAM
818 05EB E5              PUSH    H
819 05EC E5              PUSH    H           ;SAVE
820 05ED CD3403          CALL    IMPZO
821 05F0 D1              POP     D           ;PHRAM
822 05F1 2A4910          LHLD    PHBIN
823 05F4 CDCC04          CALL    BINB2
824 05F7 E1              POP     H           ;PHRAM
825 05F8 3A0C10          LDA     100CH
826 05FB CD850A          CALL    SNCOR
827 05FE E1              POP     H           ;ZRAM
828 05FF 3A0A10          LDA     100AH
829 0602 CD352A          CALL    SNCOR
830 0605 3A6C10  HERE:   LDA     SWMO
831 0608 CB47            BIT     A,0
832 060A 2810            JRZ     OUTD
833 060C 3A8710          LDA     FLASH
834 060F 07              RLC
835 0610 328710          STA     FLASH
836 0613 3813            JRC     OUTD
837 0615 110B30          LXI     D,OUTFR
```

```
838 0618 216210            LXI    H,CODER
839 0E1B CD3C03            CALL   DSPLY
840 061E 212410            LXI    H,OUTRM
841 0621 CBE6              SETB   M,4
842 0E23 CDB322            CALL   NTFR
843 0626 1801              JMPR   NORPT
844 0628 F7       OUTD:    RST    6;UPPNL
845 0E29 210100  NORPT:    LXI    H,ADSRT
846 062C CB5E              BIT    M,3
847 062E 20F9              JRNZ   NORPT
848 0630 CB76              BIT    M,6
849 0632 2804              JRZ    BKLO
850 0634 3E05              MVI    A,05
851 0636 1802              JMPR   OUTI
852 0638 3E09    BKLO:     MVI    A,09
853 063A 320000  OUTI:     STA    ANGRG
854 063D 08                EXAF
855 063E D9                EXX
856 063F ED45              RETN
857 0641 217310  POLAR:    LXI    H,FLTPI ;INPUT X
858 0644 E5                PUSH   H       ;SAVE
859 0645 D7                RST    2       ;LOD
860 0646 E1                POP    H       ;USE IT
861 0647 CF                RST    1       ; IXI
862 0648 219510            LXI    H,TEMP  ;SAVE II
863 064B DF                RST    3       ;STR FLOAT #
864 064C 217F10            LXI    H,FLTPR ;INPUT Y
865 064F E5                PUSH   H
866 0650 D7                RST    2       ;LOD
867 0651 E1                POP    H
868 0652 CF                RST    1       ;RXR
869 0653 219510            LXI    H,TEMP
870 0656 E7                RST    4               ;FLOAT ADD      ;XXR+IXI
871 0657 CD402F            CALL   SQRT
872 065A 214D10            LXI    H,FLZ
873 065D DF                RST    3       ;STR FLOAT #
874 065E 217F10            LXI    H,FLTPI
875 0661 D7                RST    2       ;LOD
876 0662 217F10            LXI    H,FLTPR
877 0665 CD5B2C            CALL   DIV     ;DIV    ;TAN
878 0668 CDFD23            CALL   ABS
879 066B 219510            LXI    H,TEMP
880 066E DF                RST    3       ;STR FLOAT #
881 066F CDE12E            CALL   ARCTAN
882 0672 213310            LXI    H,FLTPE
883 0675 DF                RST    3       ;STR FLOAT #
884 0676 C9                RET            ;Z IN FLTZ ANGLE IN FLTPE
885 0677 2A5D10  CALC:     LHLD   CRAM
886 067A CDDD06            CALL   CAP
887 067D 21EF10            LXI    H,FLTX1
888 0680 DF                RST    3
889 0681 2A6D10            LHLD   CRAM2
890 0684 CDDD7E            CALL   CAP
891 0687 217310            LXI    H,FLTX2
892 068A DF                RST    3
893 068B 2A5310            LHLD   RRAM
894 068E CDCC06            CALL   REST
895 0691 217710            LXI    H,FLTR1
896 0694 DF                RST    3
897 0695 21EC10            LXI    H,SWMO
898 0698 CB6E              BIT    M,5;  P106
899 069A 2003              JRNZ   ALLIN
900 069C CD2A07            CALL   CALZN
901 069F CDA22A  ALLIN:    CALL   RLOSS
902 06A2 211300            LXI    H,MSGBE ;OUT CODE INTO ZRAM
903 06A5 113810            LXI    D,ZRAM
904 06A8 013400            LXI    3,24
905 06AB EDB0              LDIR
906 06AD 213C10            LXI    H,PHRAM
907 06B0 CD3403            CALL   IMPZO
908 06B3 113C10            LXI    D,PHRAM
909 06B6 2A5510            LHLD   RTNLO
910 06B9 CDCC04            CALL   BINB2
911 06BC 3E05              MVI    A,05
```

```
912 063F 323C10            STA    PHRAM    ;-RAM
913 06C1 323B10            STA    ZRAM     ;+
914 06C4 214010            LXI    H,ALTRM
915 06C7 CBDE              SETB   M,3
916 06C9 C30526            JMP    HERE
917 06CC AF       REST:    XRA    A
918 06CD E5                PUSH   H
919 06CE 110000             LXI    D,0
920 06D1 ED52              DSBC   D
921 06D3 2846              JRZ    DLOW1
922 06D5 E1                POP    H
923 06D6 CDBB0F            CALL   CONFL
924 06D9 CDEA0F            CALL   LADC
925 06DC C9                RET
926 06DD                   ;////////////////////////////////
927 06DD                   ;      1X10T9
928 06DD                   ; --------------
929 06DD                   ;   2 X PI X FR X CAP<NF>
930 06DD                   ;////////////////////////////////
931 06DD E5      CAP:      PUSH   H;SAVE BINCAP
932 06DE E5                PUSH   H
933 06DF AF                XRA    A
934 06E0 111F4E            LXI    D,4E1FH;19999
935 06E3 ED52              DSBC   D
936 06E5 3033              JRNC   DLOW
937 06E7 AF                XRA    A
938 06E8 E1                POP    H
939 06E9 110000            LXI    D,00
940 06EC ED52              DSBC   D
941 06EE 2821              JRZ    DHIGH
942 06F0 E1                POP    H
943 06F1 CDBB0F            CALL   CONFL
944 06F4 CDEA0F            CALL   LADC
945 06F7 CDFA0B            CALL   CHS;+TO-
946 06FA 215110            LXI    H,FLTFR
947 06FD CF                RST    1;MUL
948 06FE 215E00            LXI    H,F2PI
949 0701 CF                RST    1
950 0702 219510            LXI    H,TEMP
951 0705 DF                RST    3
952 0706 211B00            LXI    H,FLTT9
953 0709 D7                RST    2;LOD
954 070A 219510            LXI    H,TEMP
955 070D CD5B0C            CALL   DIV;DIV
956 0710 C9                RET
957 0711 E1      DHIGH:    POP    H
958 0712 211B00            LXI    H,FLTT9
959 0715 D7                RST    2
960 0716 CDFA0B            CALL   CHS
961 0719 C9                RET
962 071A E1      DLOW:     POP    H
963 071B E1      DLOW1:    POP    H
964 071C 21DD0E            LXI    H,FONE
965 071F D7                RST    2
966 0720 211B00            LXI    H,FLTT9
967 0723 CD5B0C            CALL   DIV
968 0726 CDFA0B            CALL   CHS
969 0729 C9                RET
970 072A                   ;////////////////////////////////
971 072A                   ;  R<X2X2>    -J<<RR>X2+X1X2<X1+X2>>
972 072A                   ; -------    --------------------
973 072A                   ;RR+<X1+X2>SQ   RR+<X1+X2>SQ
974 072A                   ;  =RF+JXF
975 072A                   ;////////////////////////////////
976 072A 216F10  CALZM:    LXI    H,FLTX1
977 072D E5                PUSH   H
978 072E D7                RST    2
979 072F 217310            LXI    H,FLTX2
980 0732 E5                PUSH   H
981 0733 E7                RST    4
982 0734 216310            LXI    H,TEMP3
983 0737 DF                RST    3
984 0738 E1                POP    H;FLTX2
985 0739 CF                RST    1
```

```
986  073A E1              POP    H;FLTX1
987  073B CF              RST    1
988  073C 219910          LXI    H,TEMP2
989  073F E5              PUSH   H
990  0740 DF              RST    3
991  0741 217310          LXI    H,FLTX2
992  0744 D7              RST    2;LOD
993  0745 217710          LXI    H,FLTR1
994  0748 E5              PUSH   H
995  0749 CF              RST    1
996  074A E1              POP    H;R1
997  074B CF              RST    1
998  074C 219910          LXI    H,TEMP2
999  074F E5              PUSH   H
1000 0750 E7              RST    4;ADD
1001 0751 E1              POP    H;T2
1002 0752 DF              RST    3
1003 0753 217710          LXI    H,FLTR1
1004 0756 E5              PUSH   H
1005 0757 D7              RST    2;LOD
1006 0758 E1              POP    H;R1
1007 0759 CF              RST    1;MUL
1008 075A 219510          LXI    H,TEMP
1009 075D E5              PUSH   H
1010 075E DF              RST    3
1011 075F 216310          LXI    H,TEMP3
1012 0762 E5              PUSH   H
1013 0763 D7              RST    2;LOD
1014 0764 E1              POP    H;T3
1015 0765 CF              RST    1;MUL
1016 0766 E1              POP    H;TT
1017 0767 E7              RST    4
1018 0768 216310          LXI    H,TEMP3
1019 076B DF              RST    3;STR
1020 076C 217710          LXI    H,FLTR1
1021 076F D7              RST    2;LOD
1022 0770 217310          LXI    H,FLTX2
1023 0773 E5              PUSH   H
1024 0774 CF              RST    1
1025 0775 E1              POP    H;X2
1026 0776 CF              RST    1
1027 0777 216310          LXI    H,TEMP3
1028 077A CD5B2C          CALL   DIV;DIV
1029 077D 215F10          LXI    H,FLTRF
1030 0780 DF              RST    3
1031 0781 E1              POP    H;T2
1032 0782 D7              RST    2
1033 0783 216310          LXI    H,TEMP3
1034 0786 CD5B2C          CALL   DIV
1035 0789 215710          LXI    H,FLTIR
1036 078C DF              RST    3;STR
1037 078D C9              RET
1038 078E 06FF    PROG:   MVI    B,0FFH
1039 0790 CDE321          CALL   DELAY
1040 0793 E1              POP    H
1041 0794 CD4104          CALL   STOP
1042 0797 214010          LXI    H,ALTRM
1043 079A C3DE            SETB   M,3
1044 079C 210D10          LXI    H,STATS
1045 079F 3E10            MVI    A,10H
1046 07A1 77              MOV    M,A
1047 07A2 010400          LXI    B,24
1048 07A5 C5              PUSH   B
1049 07A6 C5              PUSH   B
1050 07A7 211300          LXI    H,MSGBK
1051 07AA E5              PUSH   H
1052 07AB 113810          LXI    D,ZRAM
1053 07AE EDB0            LDIR
1054 07B0 E1              POP    H;BLANK
1055 07B1 C1              POP    B;24
1056 07B2 113010          LXI    D,PHRAM
1057 07B5 EDB0            LDIR
1058 07B7 EF              RST    5;CLEAR
1059 07B8 C1              POP    B;24
```

```
1060 07B9 210B00        LXI     H,MPROG
1061 07BC 112610        LXI     D,OTRM2
1062 07BF ED30          LDIR
1063 07C1 214010        LXI     H,ALTRM
1064 07C4 CB8E          RESB    M,0
1065 07C6 CB96          RESB    M,2
1066 07C8 F7            RST     6;UPPNL
1067 07C9 FF            RST     7
1068 07CA AF    EPOINT: XRA     A          ;RESET FLAGS
1069 07CB 216500        LXI     H,65H
1070 07CE ED52          DSBC    D
1071 07D0 2855          JRZ     SIX1
1072 07D2 AF            XRA     A
1073 07D3 216600        LXI     H,66H      ;102
1074 07D6 ED52          DSBC    D
1075 07D8 CA5808        JZ      NINE1
1076 07DB AF            XRA     A
1077 07DC 216700        LXI     H,67H
1078 07DF ED52          DSBC    D
1079 07E1 2830          JRZ     SIX0
1080 07E3 AF            XRA     A
1081 07E4 216800        LXI     H,68H
1082 07E7 ED52          DSBC    D
1083 07E9 CA6208        JZ      NINE2
1084 07EC AF            XRA     A
1085 07ED 216900        LXI     H,69H
1086 07F0 ED52          DSBC    D
1087 07F2 CA740B        JZ      NETW
1088 07F5 AF            XRA     A
1089 07F6 216A00        LXI     H,6AH
1090 07F9 ED52          DSBC    D
1091 07FB CA4A09        JZ      E106
1092 07FE AF            XRA     A
1093 07FF 218500        LXI     H,385H
1094 0802 ED52          DSBC    D
1095 0804 CAF508        JZ      E920
1096 0807 2100E0        LXI     H,0E000H;NROM CHECK 69H
1097 080A 7E            MOV     A,M
1098 080B FE69          CPI     69H
1099 080D CA01E0        JZ      NROM
1100 0810 C33D0C        JMP     ERR1
1101 0813 215802 SIX0:  LXI     H,258H
1102 0816 225B10        SHLD    RRAM
1103 0819 211F4E        LXI     H,4E1FH
1104 081C 225D10        SHLD    CRAM
1105 081F 210000        LXI     H,0
1106 0822 226D10        SHLD    CRAM2
1107 0825 1812          JMPR    PEXIT
1108 0827 215802 SIX1:  LXI     H,258H
1109 082A 225B10        SHLD    RRAM
1110 082D 217008 CEXIT: LXI     H,870H
1111 0830 225D10        SHLD    CRAM
1112 0833 210000        LXI     H,0
1113 0836 226D10        SHLD    CRAM2
1114 0839 AF    PEXIT:  XRA     A
1115 083A 320C10        STA     ENTER
1116 083D 320D10        STA     STATS
1117 0840 212610        LXI     H,OTRM2
1118 0843 115810        LXI     D,CODER
1119 0846 010400        LXI     B,04
1120 0849 ED30          LDIR
1121 084B 3E0E          MVI     A,0EH
1122 084D 326310        STA     CODER
1123 0850 EF            RST     5;CLEAR
1124 0851 F7            RST     6;UPPNL
1125 0852 3E01          MVI     A,01
1126 0854 326C10        STA     SWMC
1127 0857 FF            RST     7
1128 0858 218403 NINE1: LXI     H,384H
1129 085B 225B10        SHLD    RRAM
1130 085E 18CD          JMPR    CEXIT
1131 0860 218403 NINE2: LXI     H,384H;9000HMS
1132 0863 225B10        SHLD    RRAM
1133 0866 211F4E        LXI     H,4E1FH
1134 0869 225D10        SHLD    CRAM
```

```
1135 086C 210000            LXI    H,0
1136 086F 226D10            SHLD   CRAM2
1137 0872 18C5              JMPR   PEXIT
1138 0874 212610    NETW:   LXI    H,OTRM2
1139 0877 116210            LXI    D,CODER
1140 087A 010400            LXI    B,04
1141 087D C5                PUSH   B
1142 087E EDB0              LDIR
1143 0880 3E0E              MVI    A,0EH
1144 0882 326210            STA    CODER
1145 0885 3E02              MVI    A,02
1146 0887 326C10            STA    SWMO
1147 088A 213300            LXI    H,MSGE1
1148 088D 112610            LXI    D,OTRM2
1149 0892 C1                POP    B;04
1150 0891 EDB0              LDIR
1151 0893 AF                XRA    A
1152 0894 320D10            STA    STATS
1153 0897 F7                RST    6
1154 0898 FF                RST    7
1155 0899 CDE108    PR1:    CALL   EVALU
1156 089C 225B10            SHLD   RRAM
1157 089F 3E04              MVI    A,04
1158 08A1 326C10            STA    SWMO
1159 08A4 EF                RST    5
1160 08A5 AF                XRA    A
1161 08A6 320010            STA    ENTER
1162 08A9 212300            LXI    H,MSGE2
1163 08AC 112610            LXI    D,OTRM2
1164 08AF 010400            LXI    B,04
1165 08B2 EDB0              LDIR
1166 08B4 F7                RST    6
1167 08B5 FF                RST    7
1168 08B6 CDE108    EC1:    CALL   EVALU
1169 08B9 225D10            SHLD   CRAM
1170 08BC 3E08              MVI    A,08
1171 08BE 326C10            STA    SWMO
1172 08C1 EF                RST    5
1173 08C2 AF                XRA    A
1174 08C3 320010            STA    ENTER
1175 08C6 212300            LXI    H,MSGE3
1176 08C9 010400            LXI    B,04
1177 08CC 112610            LXI    D,OTRM2
1178 08CF EDB0              LDIR
1179 08D1 F7                RST    6
1180 08D2 FF                RST    7
1181 08D3 CDE108    EC2:    CALL   EVALU
1182 08D6 226D10            SHLD   CRAM2
1183 08D9 3E21              MVI    A,21
1184 08DB 326C10            STA    SWMO
1185 08DE EF                RST    5;CLEAR
1186 08DF F7                RST    6
1187 08E0 FF                RST    7
1188 08E1 7D        EVALU:  MOV    A,L
1189 08E2 FE00              CPI    0
1190 08E4 280A              JRZ    LOAD0
1191 08E6 D602              SUI    02
1192 08E8 CDAD04            CALL   BCDBN
1193 08EB AF        BACK2:  XRA    A
1194 08EC 320D10            STA    STATS
1195 08EF C9                RET
1196 08F0 210000    LOAD0:  LXI    H,0
1197 08F3 18F6              JMPR   BACK2
1198 08F5 010400    E000:   LXI    B,04
1199 08F8 C5                PUSH   B
1200 08F9 211300            LXI    H,MSGBK
1201 08FC E5                PUSH   H
1202 08FD 113810            LXI    D,ZRAM
1203 0900 EDB0              LDIR
1204 0902 E1                POP    H
1205 0903 C1                POP    B
1206 0904 113C10            LXI    D,PHRAM
1207 0907 EDB0              LDIR
1208 0909 ED5B5B10          LDED   RRAM
1209 090D CD2C09            CALL   EOUT
1210 0910 ED5B5D10          LDED   CRAM
```

```
1211 0914 CD2C09            CALL    EOUT
1212 0917 ED5BED10           LDED    CRAM2
1213 091B CD2C09            CALL    EOUT
1214 091E AF                XRA     A
1215 091F 320010            STA     ENTER
1216 0922 320D10            STA     STATS
1217 0925 ED5B0710           LDED    FRBIN
1218 0929 C3A002            JMP     OUT2
1219 092C EF       EOUT:    RST     5
1220 092D 212510            LXI     H,OTRM1
1221 0930 EB                XCHG
1222 0931 CDC604            CALL    BINBC
1223 0934 F7                RST     6
1224 0935 06FF              MVI     B,0FFH
1225 0937 C5                PUSH    B
1226 0938 C5                PUSH    B
1227 0939 C5                PUSH    B
1228 093A CDE301            CALL    DELAY
1229 093D C1                POP     B
1230 093E CDE301            CALL    DELAY
1231 0941 C1                POP     B
1232 0942 CDE301            CALL    DELAY
1233 0945 C1                POP     B
1234 0946 CDE301            CALL    DELAY
1235 0949 C9                RET
1236 094A 010400   E106:    LXI     B,04
1237 094D 113010            LXI     D,PHRAM
1238 0950 C5                PUSH    B
1239 0951 211300            LXI     H,MSGBK
1240 0954 E5                PUSH    H
1241 0955 EDB0              LDIR
1242 0957 113810            LXI     D,ZRAM
1243 095A E1                POP     H
1244 095B C1                POP     B
1245 095C EDB0              LDIR
1246 095E 214110            LXI     H,FLTRL
1247 0961 D7                RST     2;LOD
1248 0962 CD2A0B            CALL    SCALE
1249 0965 215F10            LXI     H,FLTRF
1250 0968 DF                RST     3
1251 0969 CD9B0F            CALL    VFIX
1252 096C 225310            SHLD    RRAM;STORE LAST VALUE FOR REF
1253 096F 214510            LXI     H,FLTIM
1254 0972 D7                RST     2;LOD
1255 0973 CD2A0B            CALL    SCALE
1256 0976 215710            LXI     H,FLTIR
1257 0979 DF                RST     3;STR
1258 097A CD9B0F            CALL    VFIX
1259 097D 225D10            SHLD    CRAM;STORE FOR REF
1260 0980 210000            LXI     H,0
1261 0983 22ED10            SHLD    CRAM2
1262 0986 AF                XRA     A
1263 0987 320010            STA     ENTER
1264 098A 320D10            STA     STATS
1265 098D 116810            LXI     D,CODER
1266 0990 212E10            LXI     H,OTRM2
1267 0993 010400            LXI     B,04
1268 0996 EDB0              LDIR
1269 0998 3E0E              MVI     A,0EH
1270 099A 326810            STA     CODER
1271 099D 3E21              MVI     A,21H;BIT 0 BIT 5
1272 099F 326C10            STA     SWM0
1273 09A2 ED5B0710           LDED    FRBIN
1274 09A6 C3A002            JMP     OUT2
1275 09A9 E1       OVRG1:   POP     H
1276 09AA E1                POP     H
1277 09AB 010400   OVRRG:   LXI     B,04
1278 09AE C5                PUSH    B
1279 09AF 112A10            LXI     D,RLRAM
1280 09B2 215A00            LXI     H,MSGHI
1281 09B5 E5                PUSH    H
1282 09B6 EDB0              LDIR
1283 09B8 112E10            LXI     D,IMRAM
1284 09BB E1                POP     H
```

```
1285 09BC C1                   POP    B;04
1286 09BD EDB0                 LDIR
1287 09BF 210400    ZOVER:     LXI    B,04
1288 09C2 C5                   PUSH   B
1289 09C3 113510               LXI    D,ZRAM
1290 09C6 215A00               LXI    H,MSGEI
1291 09C9 EDB0                 LDIR
1292 09CB 211300               LXI    H,MSGBK
1293 09CE C1                   POP    B;04
1294 09CF 113C10               LXI    D,PHRAM
1295 09D2 EDB0                 LDIR
1296 09D4 3A0C10               LDA    100CH
1297 09D7 CB6F                 BIT    A,5
1298 09D9 C22506               JNZ    HERE
1299 09DC 3E0A                 MVI    A,0AH
1300 09DE 323C10               STA    PHRAM
1301 09E1 C30506               JMP    HERE
1302 09E4 CB4F    FNDRG:       BIT    A,1
1303 09E6 2850                 JRNZ   X1
1304 09E8 CD630A               CALL   RCOND
1305 09EB 112C01               LXI    D,12CH    ;
1306 09EE ED52                 DSBC   D
1307 09F0 3032                 JRNC   SETXA
1308 09F2 2A2910               LHLD   BINRL
1309 09F5 CD630A               CALL   RCOND
1310 09F8 112C01               LXI    D,12CH
1311 09FB ED52                 DSBC   D
1312 09FD 3025                 JRNC   SETXA
1313 09FF 212410               LXI    H,OUTRM
1314 0A02 CB96                 RESB   M,2
1315 0A04 CBCE                 SETB   M,1
1316 0A06 214010               LXI    H,ALTRM
1317 0A09 CBB6                 RESB   M,6
1318 0A0B 3E09                 MVI    A,09
1319 0A0D 320000               STA    ANGRG
1320 0A10 18AD                 JMPR   ZOVER
1321 0A12 212410    SETX1:     LXI    H,OUTRM
1322 0A15 CB96                 RESB   M,2
1323 0A17 CBCE                 SETB   M,1
1324 0A19 214010               LXI    H,ALTRM
1325 0A1C 3E09                 MVI    A,09
1326 0A1E 320000               STA    ANGRG
1327 0A21 C34105               JMP    DATA
1328 0A24 212410    SETXA:     LXI    H,OUTRM
1329 0A27 CBD6                 SETB   M,2
1330 0A29 CB8E                 RESB   M,1
1331 0A2B 214010               LXI    H,ALTRM
1332 0A2E CBF6                 SETB   M,6
1333 0A30 3E05                 MVI    A,05
1334 0A32 320000               STA    ANGRG
1335 0A35 C34105               JMP    DATA
1336 0A38 CD630A    X1         CALL   RCOND
1337 0A3B 119E0F               LXI    D,0F9EH
1338 0A3E ED52                 DSBC   D
1339 0A40 300D                 JRNC   K1999
1340 0A42 2A0910               LHLD   BINRL
1341 0A45 CD630A               CALL   RCOND
1342 0A48 119E0F               LXI    D,0F9EH
1343 0A4B ED52                 DSBC   D
1344 0A4D 38C3                 JRC    SETX1
1345 0A4F 212410    K1999:     LXI    H,OUTRM
1346 0A52 CBD6                 SETB   M,2
1347 0A54 CB8E                 RESB   M,1
1348 0A56 214010               LXI    H,ALTRM
1349 0A59 CBB6                 RESB   M,6
1350 0A5B 3E05                 MVI    A,05
1351 0A5D 320000               STA    ANGRG
1352 0A60 C3AB29               JMP    OVRRG
1353 0A63 7C       RCOND:      MOV    A,H
1354 0A64 E60F                 ANI    0FH
1355 0A66 67                   MOV    H,A
1356 0A67 C9                   RET
1357 0A68 7C       COND:       MOV    A,H
1358 0A69 E62F                 ANI    2FH
1359 0A6B 67                   MOV    H,A
```

```
1360 0A6C E5              PUSH   H
1361 0A6D 119E2F          LXI    D,2F9EH
1362 0A72
1363 0A70 ED52            DSBC   D
1364 0A72 D2A909          JNC    OVRG1
1365 0A75 E1              POP    H
1366 0A76 E5              PUSH   H
1367 0A77 CDB30F          CALL   CONFL
1368 0A7A CDEA0F          CALL   LADC
1369 0A7D 216200          LXI    H,FTWO
1370 0A80 CD5B2C          CALL   DIV        ;DIV
1371 0A83 E1              POP    H
1372 0A84 C9              RET
1373 0A85 C36F   SNCOR:   BIT    A,5        ;SIGN?
1374 0A87 7E              MOV    A,M
1375 0A88 2800            JRZ    MINUS
1376 0A8A FE00            CPI    0
1377 0A8C 2804            JRZ    ADD6
1378 0A8E 3E08            MVI    A,8
1379 0A90 77              MOV    M,A
1380 0A91 C9              RET
1381 0A92 3E05   ADD6:    MVI    A,05
1382 0A94 77              MOV    M,A
1383 0A95 C9              RET
1384 0A96 FE00   MINUS:   CPI    0
1385 0A98 2804            JRZ    ADDA
1386 0A9A 3E04            MVI    A,04
1387 0A9C 77              MOV    M,A
1388 0A9D C9              RET
1389 0A9E 3E0A   ADDA:    MVI    A,0AH
1390 0AA0 77              MOV    M,A
1391 0AA1 C9              RET
1392 0AA2 214110 RLOSS:   LXI    H,FLTRL
1393 0AA5 E5              PUSH   H
1394 0AA6 D7              RST    2;LOAD
1395 0AA7 CD2A0B          CALL   SCALE
1396 0AAA E1              POP    H
1397 0AAB DF              RST    3;STR
1398 0AAC 214510          LXI    H,FLTIM
1399 0AAF E5              PUSH   H
1400 0AB0 D7              RST    2
1401 0AB1 CD2A0B          CALL   SCALE
1402 0AB4 E1              POP    H
1403 0AB5 DF              RST    3
1404 0AB6 215F10          LXI    H,FLTRF
1405 0AB9 E5              PUSH   H
1406 0ABA D7              RST    2
1407 0ABB 214110          LXI    H,FLTRL
1408 0ABE E5              PUSH   H
1409 0ABF E7              RST    4
1410 0AC0 219510          LXI    H,TEMP
1411 0AC3 E5              PUSH   H
1412 0AC4 DF              RST    3
1413 0AC5 E1              POP    H
1414 0AC6 CF              RST    1
1415 0AC7 219910          LXI    H,TEMP2
1416 0ACA DF              RST    3
1417 0ACB E1              POP    H
1418 0ACC D7              RST    2
1419 0ACD E1              POP    H
1420 0ACE CD742C          CALL   SB
1421 0AD1 216310          LXI    H,TEMP3
1422 0AD4 E5              PUSH   H
1423 0AD5 E5              PUSH   H
1424 0AD6 DF              RST    3
1425 0AD7 E1              POP    H
1426 0AD8 CF              RST    1
1427 0AD9 E1              POP    H
1428 0ADA DF              RST    3
1429 0ADB 215710          LXI    H,FLTIR
1430 0ADE E5              PUSH   H
1431 0ADF D7              RST    2
1432 0AE0 214510          LXI    H,FLTIM
1433 0AE3 E5              PUSH   H
```

```
1434 0AE4 E7                  RST    4
1435 0AE5 219510              LXI    H,TEMP
1436 0AE8 E5                  PUSH   H
1437 0AE9 DF                  RST    3
1438 0AEA E1                  POP    H
1439 0AEB CF                  RST    1
1440 0AEC 219910              LXI    H,TEMP2
1441 0AEF E5                  PUSH   H
1442 0AF0 E7                  RST    4
1443 0AF1 E1                  POP    H
1444 0AF2 DF                  RST    3
1445 0AF3 E1                  POP    H
1446 0AF4 D7                  RST    2
1447 0AF5 E1                  POP    H
1448 0AF6 CD740C              CALL   SB
1449 0AF9 219510              LXI    H,TEMP
1450 0AFC E5                  PUSH   H
1451 0AFD DF                  RST    3
1452 0AFE E1                  POP    H
1453 0AFF CF                  RST    1
1454 0B00 216310              LXI    H,TEMP3
1455 0B03 E7                  RST    4
1456 0B04 219910              LXI    H,TEMP2
1457 0B07 CD5B0C              CALL   DIV
1458 0B0A CD360B      LOUT:   CALL   LOG
1459 0B0D 21D00E              LXI    H,FTEN
1460 0B10 E5                  PUSH   H
1461 0B11 CF                  RST    1
1462 0B12 E1                  POP    H
1463 0B13 CF                  RST    1
1464 0B14 CD9B0F              CALL   VFIX
1465 0B17 E5                  PUSH   H
1466 0B18 115B00              LXI    D,05BH
1467 0B1B ED52                DSBC   D
1468 0B1D 3806                JRC    NDFLT
1469 0B1F E1                  POP    H
1470 0B20 EB                  XCHG
1471 0B21 225510              SHLD   RTNLO
1472 0B24 C9                  RET
1473 0B25 E1      NDFLT:      POP    H
1474 0B26 225510              SHLD   RTNLO
1475 0B29 C9                  RET
1476 0B2A 212410  SCALE:      LXI    H,OUTRM
1477 0B2D CB4E                BIT    M,1
1478 0B2F 2004                JRNZ   BACK
1479 0B31 21D00E              LXI    H,FTEN
1480 0B34 CF                  RST    1
1481 0B35 C9      BACK:       RET
1482 0B36 CA760B  LOG:        JZ     ZRR     ;DEFAULT
1483 0B39 216710              LXI    H,SWL0
1484 0B3C 3600                MVI    M,0
1485 0B3E 219510              LXI    H,TEMP
1486 0B41 DF                  RST    3       ;STR FLOAT #
1487 0B42 21E20B  LOGO:       LXI    H,S10   ;.316
1488 0B45 CD740C              CALL   SB
1489 0B48 F25C0B              JP     LOG1
1490 0B4B 219510              LXI    H,TEMP
1491 0B4E E5                  PUSH   H
1492 0B4F D7                  RST    2       ;LOD
1493 0B50 21D00E              LXI    H,FTEN
1494 0B53 CF                  RST    1
1495 0B54 E1                  POP    H
1496 0B55 DF                  RST    3       ;STR FLOAT #
1497 0B56 216710              LXI    H,SWL0
1498 0B59 34                  INR    M
1499 0B5A 18E6                JMPR   LOGO
1500 0B5C 219510  LOG1:       LXI    H,TEMP
1501 0B5F E5                  PUSH   H
1502 0B60 E5                  PUSH   H
1503 0B61 D7                  RST    2       ;LOD
1504 0B62 21DD0E              LXI    H,FONE
1505 0B65 E7                  RST    4       ;FLOAT ADD
1506 0B66 E1                  POP    H
1507 0B67 DF                  RST    3       ;STR FLOAT #
1508 0B68 216200              LXI    H,FTWO
```

```
1509 0B6B CD742C              CALL    SB
1510 0B6E E1                  POP     H
1511 0B6F CD5B2C              CALL    DIV       ;DIV
1512 0B72 219910              LXI     H,TEMP2
1513 0B75 E5                  PUSH    H
1514 0B76 DF                  RST     3         ;STR FLOAT #
1515 0B77 E1                  POP     H
1516 0B78 CF                  RST     1
1517 0B79 216310              LXI     H,TEMP3
1518 0B7C E5                  PUSH    H
1519 0B7D E5                  PUSH    H
1520 0B7E E5                  PUSH    H
1521 0B7F DF                  RST     3         ;STR FLOAT #
1522 0B80 21DE0B              LXI     H,B9
1523 0B83 CF                  RST     1
1524 0B84 21DA0B              LXI     H,B7
1525 0B87 E7                  RST     4         ;FLOAT ADD
1526 0B88 E1                  POP     H
1527 0B89 CF                  RST     1
1528 0B8A 21D60B              LXI     H,B5
1529 0B8D E7                  RST     4         ;FLOAT ADD
1530 0B8E E1                  POP     H
1531 0B8F CF                  RST     1
1532 0B90 21D20B              LXI     H,B3
1533 0B93 E7                  RST     4         ;FLOAT ADD
1534 0B94 E1                  POP     H
1535 0B95 CF                  RST     1
1536 0B96 21CE0B              LXI     H,B1
1537 0B99 E7                  RST     4         ;FLOAT ADD
1538 0B9A 219910              LXI     H,TEMP2
1539 0B9D CF                  RST     1
1540 0B9E 219510              LXI     H,TEMP
1541 0BA1 DF                  RST     3         ;STR FLOAT #
1542 0BA2 3A6710              LDA     SWLO
1543 0BA5 FE00                CPI     0
1544 0BA7 C4BC2B              CNZ     FLDC
1545 0BAA 2306                JRZ     FINNY
1546 0BAC 219510              LXI     H,TEMP
1547 0BAF E7                  RST     4         ;FLOAT ADD
1548 0BB0 1804                JMPR    KUPT
1549 0BB2 219510    FINNY:    LXI     H,TEMP
1550 0BB5 D7                  RST     2         ;LOD
1551 0BB6 C9        KUPT:     RET
1552 0BB7 21E60B    ZER:      LXI     H,DELFC
1553 0BBA 18FC                JMPR    LOD
1554 0BBC 0E00      FLDC:     MVI     C,0
1555 0BBE A7                  ANA     A
1556 0BBF 0C        FLDC1:    INR     C
1557 0BC0 17                  RAL
1558 0BC1 30FC                JRNC    FLDC1
1559 0BC3 1F                  RAR
1560 0BC4 47                  MOV     B,A
1561 0BC5 3E89                MVI     A,89H
1562 0BC7 91                  SUB     C
1563 0BC8 0E00                MVI     C,0
1564 0BCA 51                  MOV     D,C
1565 0BCB C3EA0F              JMP     LADC
1566 0BCE 805E5C07  B1:       DB      80H,5EH,5CH,07H ;.868591713
1567 0BD2 7F2314C9  B3:       DB      7FH,23H,14H,0C9H ;.289335524
1568 0BD6 7E350C59  B5:       DB      7EH,35H,0C8H,59H ;.177522071
1569 0BDA 7D414374  B7:       DB      7DH,41H,49H,74H ;.294376475
1570 0BDE 7E43EE09  B9:       DB      7EH,43H,0EEH,09H ;.191337714
1571 0BE2 7F21EB9B  S10:      DB      7FH,21H,0EBH,9BH ;.316227766
1572 0BE6 87C60000  DELFC:    DB      87H,0C6H,0,0
1573 0BEA  0BEA     ROM       SET     $
1574 0BEA  1089               ORG     RAM
1575 1089
1576 1089
1577 1089               ;*****************************************************
1578 1089               ;*       8080
1579 1089               ;*       BINARY FLOATING POINT SYSTEM                  *
1580 1089               ;*****************************************************
1581 1089               ;LOCATION OF TE FLOATING POINT ACCUMULATOR
1582 1089
```

```
1583 1089            OVER:   DS      1
1584 108A            PREX:   DS      1
1585 108B            ACCE:   DS      1
1586 108C            ACCS:   DS      1
1587 108D            ACC1:   DS      1
1588 108E            ACC2:   DS      1
1589 108F            ACC3:   DS      1
1590 1090            SF:     DS      1
1591 1091            MULP3:  DS      1
1592 1092            MULP2:  DS      1
1593 1093            MULP1:  DS      1
1594 1094            OP1S:   DS      1
1595 1095   1091     OP4S    EQU     MULP3
1596 1095   1092     OP3S    EQU     MULP2
1597 1095   1093     OP2S    EQU     MULP1
1598 1095   1095     RAM     SET     $
1599 1095   0BEA             ORG     ROM
1600 0BEA 73         STR0:   MOV     M,E
1601 0BEB 23                 INX     H
1602 0BEC 77         STR:    MOV     M,A
1603 0BED 23         STR1:   INX     H
1604 0BEE 70                 MOV     M,B
1605 0BEF 23                 INX     H
1606 0BF0 71                 MOV     M,C
1607 0BF1 23                 INX     H
1608 0BF2 72                 MOV     M,D
1609 0BF3 C9                 RET
1610 0BF4 218B10     ZRO:    LXI     H,ACCE
1611 0BF7 AF                 XRA     A
1612 0BF8 77                 MOV     M,A
1613 0BF9 C9                 RET
1614 0BFA 3E80       CHS:    MVI     A,80H
1615 0BFC FE                 DB      0FEH
1616 0BFD AF         ABS:    XRA     A
1617 0BFE 218C10             LXI     H,ACCS
1618 0C01 A6                 ANA     M
1619 0C02 EE80               XRI     80H
1620 0C04 77                 MOV     M,A
1621 0C05 218B10     TST:    LXI     H,ACCE
1622 0C08 7E                 MOV     A,M
1623 0C09 A7                 ANA     A
1624 0C0A 28F8               JRZ     ZRO
1625 0C0C 5F                 MOV     E,A
1626 0C0D 23                 INX     H
1627 0C0E 7E                 MOV     A,M
1628 0C0F 23                 INX     H
1629 0C10 AE                 XRA     M
1630 0C11 23                 INX     H
1631 0C12 4E                 MOV     C,M
1632 0C13 23                 INX     H
1633 0C14 56                 MOV     D,M
1634 0C15 C3B20D             JMP     ADD12
1635 0C18 7E         LOD:    MOV     A,M
1636 0C19 A7                 ANA     A
1637 0C1A CAF40B             JZ      ZRO
1638 0C1D 5F                 MOV     E,A
1639 0C1E 23                 INX     H
1640 0C1F 7E                 MOV     A,M
1641 0C20 23                 INX     H
1642 0C21 4E                 MOV     C,M
1643 0C22 23                 INX     H
1644 0C23 56                 MOV     D,M
1645 0C24 6F                 MOV     L,A
1646 0C25 F680       LOD1:   ORI     80H
1647 0C27 47                 MOV     B,A
1648 0C28 AD                 XRA     L
1649 0C29 218B10             LXI     H,ACCE
1650 0C2C CDEA0B             CALL    STR0    ;STR FLOAT #0
1651 0C2F A8                 XRA     B
1652 0C30 47                 MOV     B,A
1653 0C31 F601               ORI     1
1654 0C33 7B                 MOV     A,E
1655 0C34 C9                 RET
1656 0C35 7E         MUL:    MOV     A,M
1657 0C36 A7                 ANA     A
```

```
1658 0C37 C4360D           CNZ    MDEX
1659 0C3A 28B8             JRZ    ZRO
1660 0C3C 382E             JRC    OVERF
1661 0C3E CDEB0D           CALL   MULX
1662 0C41 78               MOV    A,B
1663 0C42 A7               ANA    A
1664 0C43 FA510C           JM     RNDA
1665 0C46 218B10           LXI    H,ACCE
1666 0C49 7E               MOV    A,M
1667 0C4A DE01             SBI    1
1668 0C4C 77               MOV    M,A
1669 0C4D C8               RZ
1670 0C4E CD5C0D           CALL   LSH
1671 0C51 CDCD0D   RNDA:   CALL   ROND
1672 0C54 3816             JRC    OVERF
1673 0C56 47               MOV    B,A
1674 0C57 F601             ORI    1
1675 0C59 7B               MOV    A,E
1676 0C5A C9               RET
1677 0C5B AF       DIV:    XRA    A
1678 0C5C 96               SUB    M
1679 0C5D FE01             CPI    1
1680 0C5F D4360D           CNC    MDEX
1681 0C62 3308             JRC    OVERF
1682 0C64 288E             JRZ    ZRO
1683 0C66 4F               MOV    C,A
1684 0C67 CD3A0E           CALL   DIVX           ;DIVX
1685 0C6A 38E5             JRC    RNDA
1686 0C6C 218910   OVERF:  LXI    H,OVER
1687 0C6F 3EFF             MVI    A,0FFH
1688 0C71 77               MOV    M,A
1689 0C72 07               RLC
1690 0C73 C9               RET
1691 0C74 3E80     SB:     MVI    A,80H
1692 0C76 FE               DB     0FEH
1693 0C77 AF       AD:     XRA    A
1694 0C78 5E               MOV    E,M
1695 0C79 23               INX    H
1696 0C7A AE               XRA    M
1697 0C7B 47               MOV    B,A
1698 0C7C 23               INX    H
1699 0C7D 4E               MOV    C,M
1700 0C7E 23               INX    H
1701 0C7F 56               MOV    D,M
1702 0C80 219B10           LXI    H,ACCE
1703 0C83 7E               MOV    A,M
1704 0C84 2B               DCX    H
1705 0C85 77               MOV    M,A
1706 0C86 7B               MOV    A,E
1707 0C87 A7               ANA    A
1708 0C88 CA050C           JZ     TST
1709 0C8B 68               MOV    L,B
1710 0C8C 78               MOV    A,B
1711 0C8D F680             ORI    80H
1712 0C8F 47               MOV    B,A
1713 0C90 AD               XRA    L
1714 0C91 218C10           LXI    H,ACCS
1715 0C94 AE               XRA    M
1716 0C95 329010           STA    SF
1717 0C98 219B10           LXI    H,ACCE
1718 0C9B 7E               MOV    A,M
1719 0C9C A7               ANA    A
1720 0C9D CA280D           JZ     ADD17
1721 0CA0 93               SUB    E
1722 0CA1 DAAE0C           JC     ADD2
1723 0CA4 FA050C           JM     TST
1724 0CA7 FE19             CPI    19H
1725 0CA9 3822             JRC    ADD3
1726 0CAB C3050C           JMP    TST
1727 0CAE F2280D   ADD2:   JP     ADD17
1728 0CB1 FEE7             CPI    0E7H
1729 0CB3 3873             JRC    ADD17
1730 0CB5 73               MOV    M,E
1731 0CB6 5F               MOV    E,A
```

```
1732 0CB7 3A9010            LDA     SF
1733 0CBA 218010            LXI     H,ACCS
1734 0CBD AE                XRA     M
1735 0CBE 77                MOV     M,A
1736 0CBF AF                XRA     A
1737 0CC0 93                SUB     E
1738 0CC1 23                INX     H
1739 0CC2 5E                MOV     E,M
1740 0CC3 70                MOV     M,B
1741 0CC4 43                MOV     B,E
1742 0CC5 23                INX     H
1743 0CC6 5E                MOV     E,M
1744 0CC7 71                MOV     M,C
1745 0CC8 43                MOV     C,E
1746 0CC9 23                INX     H
1747 0CCA 5E                MOV     E,M
1748 0CCB 72                MOV     M,D
1749 0CCC 53                MOV     D,E
1750 0CCD CD693D    ADD3:   CALL    RSH
1751 0CD0 219010            LXI     H,SF
1752 0CD3 7E                MOV     A,M
1753 0CD4 A7                ANA     A
1754 0CD5 218110            LXI     H,ACC3
1755 0CD8 FAFE0C            JM      ADD9
1756 0CDB 7E                MOV     A,M
1757 0CDC 82                ADD     D
1758 0CDD 57                MOV     D,A
1759 0CDE 2B                DCX     H
1760 0CDF 7E                MOV     A,M
1761 0CE0 89                ADC     C
1762 0CE1 4F                MOV     C,A
1763 0CE2 2B                DCX     H
1764 0CE3 7E                MOV     A,M
1765 0CE4 88                ADC     B
1766 0CE5 47                MOV     B,A
1767 0CE6 302D              JRNC    ADD11
1768 0CE8 1F                RAR
1769 0CE9 47                MOV     B,A
1770 0CEA 79                MOV     A,C
1771 0CEB 1F                RAR
1772 0CEC 4F                MOV     C,A
1773 0CED 7A                MOV     A,D
1774 0CEE 1F                RAR
1775 0CEF 57                MOV     D,A
1776 0CF0 1F                RAR
1777 0CF1 5F                MOV     E,A
1778 0CF2 218310            LXI     H,ACCE
1779 0CF5 7E                MOV     A,M
1780 0CF6 C601              ADI     1
1781 0CF8 DA6C0C            JC      OVERF
1782 0CFB 77                MOV     M,A
1783 0CFC 1817              JMPR    ADD11
1784 0CFE AF        ADD9:   XRA     A
1785 0CFF 93                SUB     E
1786 0D00 5F                MOV     E,A
1787 0D01 7E                MOV     A,M
1788 0D02 9A                SBB     D
1789 0D03 57                MOV     D,A
1790 0D04 2B                DCX     H
1791 0D05 7E                MOV     A,M
1792 0D06 99                SBB     C
1793 0D07 4F                MOV     C,A
1794 0D08 2B                DCX     H
1795 0D09 7E                MOV     A,M
1796 0D0A 98                SBB     B
1797 0D0B 47                MOV     B,A
1798 0D0C DC2D0D    ADD17:  CC      COMP
1799 0D0F F4A22D            CP      NORM
1800 0D12 F2F40B            JP      ZRO
1801 0D15 CDCD0D    ADD11:  CALL    ROND
1802 0D18 DA6C0C            JC      OVERF
1803 0D1B 47        ADD12:  MOV     B,A
1804 0D1C 218A10            LXI     H,PREX
1805 0D1F 7B                MOV     A,E
```

```
1806 0D20 96              SUB     M
1807 0D21 6F              MOV     L,A
1808 0D22 78              MOV     A,B
1809 0D23 F601            ORI     1
1810 0D25 73              MOV     A,E
1811 0D26 5D              MOV     E,L
1812 0D27 C9              RET
1813 0D28 3A9C10   ADD17: LDA     SF
1814 0D2B 219C10          LXI     H,ACCS
1815 0D2E AE              XRA     M
1816 0D2F 2B              DCX     H
1817 0D30 CDEA0B          CALL    STR0    ;STR FLOAT #0
1818 0D33 A8              XRA     B
1819 0D34 18E5            JMPR    ADD12
1820 0D36 47       MDEX:  MOV     B,A
1821 0D37 23              INX     H
1822 0D38 4E              MOV     C,M
1823 0D39 23              INX     H
1824 0D3A 56              MOV     D,M
1825 0D3B 23              INX     H
1826 0D3C 5E              MOV     E,M
1827 0D3D 218B10          LXI     H,ACCE
1828 0D40 7E              MOV     A,M
1829 0D41 A7              ANA     A
1830 0D42 C8              RZ
1831 0D43 80              ADD     B
1832 0D44 47              MOV     B,A
1833 0D45 1F              RAR
1834 0D46 A8              XRA     B
1835 0D47 78              MOV     A,B
1836 0D48 0680            MVI     B,82H
1837 0D4A F2580D          JP      OVUN
1838 0D4D 90              SUB     B
1839 0D4E C8              RZ
1840 0D4F 77              MOV     M,A
1841 0D50 23              INX     H
1842 0D51 7E              MOV     A,M
1843 0D52 A9              XRA     C
1844 0D53 A0              ANA     B
1845 0D54 77              MOV     M,A
1846 0D55 79              MOV     A,C
1847 0D56 B0              ORA     B
1848 0D57 C9              RET
1849 0D58 07       OVUN:  RLC
1850 0D59 D8              RC
1851 0D5A AF              XRA     A
1852 0D5B C9              RET
1853 0D5C 7B       LSH:   MOV     A,E
1854 0D5D 17              RAL
1855 0D5E 5F              MOV     E,A
1856 0D5F 7A       LSH1:  MOV     A,D
1857 0D60 17              RAL
1858 0D61 57              MOV     D,A
1859 0D62 79              MOV     A,C
1860 0D63 17              RAL
1861 0D64 4F              MOV     C,A
1862 0D65 78              MOV     A,B
1863 0D66 8F              ADC     A
1864 0D67 47              MOV     B,A
1865 0D68 C9              RET
1866 0D69 1E00     RSH:   MVI     E,0
1867 0D6B 2E08     RSH0:  MVI     L,8
1868 0D6D BD       RSH1:  CMP     L
1869 0D6E FA790D          JM      RSH2
1870 0D71 5F              MOV     E,A
1871 0D72 51              MOV     D,C
1872 0D73 48              MOV     C,B
1873 0D74 0600            MVI     B,0
1874 0D76 95              SUB     L
1875 0D77 20F4            JRNZ    RSH1
1876 0D79 A7       RSH2:  ANA     A
1877 0D7A C8              RZ
1878 0D7B 6F              MOV     L,A
1879 0D7C A7       RSH3:  ANA     A
1880 0D7D 78              MOV     A,B
```

```
1881 0D7E 1F              RAR
1882 0D7F 47              MOV     B,A
1883 0D80 79              MOV     A,C
1884 0D81 1F              RAR
1885 0D82 4F              MOV     C,A
1886 0D83 7A              MOV     A,D
1887 0D84 1F              RAR
1888 0D85 57              MOV     D,A
1889 0D86 7B              MOV     A,E
1890 0D87 1F              RAR
1891 0D88 5F              MOV     E,A
1892 0D89 2D              DCR     L
1893 0D8A 20F0            JRNZ    RSH3
1894 0D8C C9              RET
1895 0D8D 2B      COMP:   DCX     H
1896 0D8E 7E              MOV     A,M
1897 0D8F EE80            XRI     80H
1898 0D91 77              MOV     M,A
1899 0D92 AF      COMP1:  XRA     A
1900 0D93 6F              MOV     L,A
1901 0D94 93              SUB     E
1902 0D95 5F              MOV     E,A
1903 0D96 7D              MOV     A,L
1904 0D97 9A              SBB     D
1905 0D98 57              MOV     D,A
1906 0D99 7D              MOV     A,L
1907 0D9A 99              SBB     C
1908 0D9B 4F              MOV     C,A
1909 0D9C 7D              MOV     A,L
1910 0D9D 98              SBB     B
1911 0D9E 47              MOV     B,A
1912 0D9F C9              RET
1913 0DA0 2E20    NORM:   MVI     L,20H
1914 0DA2 78      NORM1:  MOV     A,B
1915 0DA3 A7              ANA     A
1916 0DA4 2018            JRNZ    NORM3
1917 0DA6 41              MOV     B,C
1918 0DA7 4A              MOV     C,D
1919 0DA8 53              MOV     D,E
1920 0DA9 5F              MOV     E,A
1921 0DAA 7D              MOV     A,L
1922 0DAB D608            SUI     8
1923 0DAD 6F              MOV     L,A
1924 0DAE 20F2            JRNZ    NORM1
1925 0DB0 C9              RET
1926 0DB1 2D      NORM2:  DCR     L
1927 0DB2 7B              MOV     A,E
1928 0DB3 17              RAL
1929 0DB4 5F              MOV     E,A
1930 0DB5 7A              MOV     A,D
1931 0DB6 17              RAL
1932 0DB7 57              MOV     D,A
1933 0DB8 79              MOV     A,C
1934 0DB9 17              RAL
1935 0DBA 4F              MOV     C,A
1936 0DBB 78              MOV     A,B
1937 0DBC 8F              ADC     A
1938 0DBD 47              MOV     B,A
1939 0DBE F2B10D  NORM3:  JP      NORM2
1940 0DC1 7D              MOV     A,L
1941 0DC2 D620            SUI     20H
1942 0DC4 218B10          LXI     H,ACCE
1943 0DC7 86              ADD     M
1944 0DC8 77              MOV     M,A
1945 0DC9 C8              RZ
1946 0DCA 1F              RAR
1947 0DCB A7              ANA     A
1948 0DCC C9              RET
1949 0DCD 218B10  ROND:   LXI     H,ACCE
1950 0DD0 7B              MOV     A,E
1951 0DD1 A7              ANA     A
1952 0DD2 5E              MOV     E,M
1953 0DD3 FCDD0D          CM      RNDR
1954 0DD6 D8              RC
```

```
1955 0DD7 78                MOV     A,B
1956 0DD8 23                INX     H
1957 0DD9 AE                XRA     M
1958 0DDA C3ED2B            JMP     STR1
1959 0DDD 14        RNDR:   INR     D
1960 0DDE C0                RNZ
1961 0DDF 0C                INR     C
1962 0DE0 C0                RNZ
1963 0DE1 04                INR     B
1964 0DE2 C0                RNZ
1965 0DE3 7B                MOV     A,E
1966 0DE4 C601              ADI     1
1967 0DE6 5F                MOV     E,A
1968 0DE7 0680              MVI     B,82H
1969 0DE9 77                MOV     M,A
1970 0DEA C9                RET
1971 0DEB 329310    MULX:   STA     MULP1
1972 0DEE 7A                MOV     A,D
1973 0DEF 329210            STA     MULP2
1974 0DF2 7B                MOV     A,E
1975 0DF3 329110            STA     MULP3
1976 0DF6 AF                XRA     A
1977 0DF7 5F                MOV     E,A
1978 0DF8 57                MOV     D,A
1979 0DF9 218F10            LXI     H,ACC3
1980 0DFC CD0B2E            CALL    MULX2
1981 0DFF 218E10            LXI     H,ACC2
1982 0E02 CD080E            CALL    MULX1
1983 0E05 218D10            LXI     H,ACC1
1984 0E08 7A        MULX1:  MOV     A,D
1985 0E09 59                MOV     E,C
1986 0E0A 50                MOV     D,B
1987 0E0B 46        MULX2:  MOV     B,M
1988 0E0C 6F                MOV     L,A
1989 0E0D AF                XRA     A
1990 0E0E 4F                MOV     C,A
1991 0E0F 90                SUB     B
1992 0E10 3808              JRC     MULX3
1993 0E12 4A                MOV     C,D
1994 0E13 53                MOV     D,E
1995 0E14 C9                RET
1996 0E15 4F        MULX5:  MOV     C,A
1997 0E16 3002              JRNC    MULX3
1998 0E18 04                INR     B
1999 0E19 A7                ANA     A
2000 0E1A 7D        MULX3:  MOV     A,L
2001 0E1B 8F                ADC     A
2002 0E1C C8                RZ
2003 0E1D 6F                MOV     L,A
2004 0E1E 7B                MOV     A,E
2005 0E1F 17                RAL
2006 0E20 5F                MOV     E,A
2007 0E21 7A                MOV     A,D
2008 0E22 17                RAL
2009 0E23 57                MOV     D,A
2010 0E24 79                MOV     A,C
2011 0E25 17                RAL
2012 0E26 4F                MOV     C,A
2013 0E27 78                MOV     A,B
2014 0E28 17                RAL
2015 0E29 47                MOV     B,A
2016 0E2A 30EE              JRNC    MULX3
2017 0E2C 7B                MOV     A,E
2018 0E2D E5                PUSH    H
2019 0E2E 2A9110            LHLD    MULP3
2020 0E31 19                DAD     D
2021 0E32 EB                XCHG
2022 0E33 E1                POP     H
2023 0E34 3A9310            LDA     MULP1
2024 0E37 89                ADC     C
2025 0E38 18DB              JMPR    MULX5
2026 0E3A 218F10    DIVX:   LXI     H,ACC3
2027 0E3D 7E                MOV     A,M
2028 0E3E 93                SUB     E
2029 0E3F 77                MOV     M,A
```

```
2030 0E40 2B              DCX     H
2031 0E41 7E              MOV     A,M
2032 0E42 9A              SBB     D
2033 0E43 77              MOV     M,A
2034 0E44 2B              DCX     H
2035 0E45 7E              MOV     A,M
2036 0E46 99              SBB     C
2037 0E47 77              MOV     M,A
2038 0E48 79              MOV     A,C
2039 0E49 17              RAL
2040 0E4A 79              MOV     A,C
2041 0E4B 1F              RAR
2042 0E4C 329410          STA     OP1S
2043 0E4F 7A              MOV     A,D
2044 0E50 1F              RAR
2045 0E51 329310          STA     OP2S
2046 0E54 7B              MOV     A,E
2047 0E55 1F              RAR
2048 0E56 329210          STA     OP3S
2049 0E59 0600            MVI     B,0
2050 0E5B 78              MOV     A,B
2051 0E5C 1F              RAR
2052 0E5D 329110          STA     OP4S
2053 0E60 218D10          LXI     H,ACC1
2054 0E63 7E              MOV     A,M
2055 0E64 23              INX     H
2056 0E65 56              MOV     D,M
2057 0E66 23              INX     H
2058 0E67 5E              MOV     E,M
2059 0E68 A7              ANA     A
2060 0E69 FAB60E          JM      DIVX4
2061 0E6C 218D10          LXI     H,ACC1
2062 0E6F 4E              MOV     C,M
2063 0E70 0C              INR     C
2064 0E71 C8              RZ
2065 0E72 71              MOV     M,C
2066 0E73 6B              MOV     L,E
2067 0E74 62              MOV     H,D
2068 0E75 5F              MOV     E,A
2069 0E76 1601            MVI     D,1
2070 0E78 48              MOV     C,B
2071 0E79 AF      DIVX1:  XRA     A
2072 0E7A C5              PUSH    B
2073 0E7B 44              MOV     B,H
2074 0E7C 4D              MOV     C,L
2075 0E7D 219110          LXI     H,OP4S
2076 0E80 96              SUB     M
2077 0E81 23              INX     H
2078 0E82 79              MOV     A,C
2079 0E83 9E              SBB     M
2080 0E84 4F              MOV     C,A
2081 0E85 23              INX     H
2082 0E86 78              MOV     A,B
2083 0E87 9E              SBB     M
2084 0E88 47              MOV     B,A
2085 0E89 23              INX     H
2086 0E8A 7B              MOV     A,E
2087 0E8B 9E              SBB     M
2088 0E8C 5F              MOV     E,A
2089 0E8D 3A9110          LDA     OP4S
2090 0E90 60              MOV     H,B
2091 0E91 69              MOV     L,C
2092 0E92 C1              POP     B
2093 0E93 07      DIVX2:  RLC
2094 0E94 78              MOV     A,B
2095 0E95 17              RAL
2096 0E96 D8              RC
2097 0E97 1F              RAR
2098 0E98 7D              MOV     A,L
2099 0E99 17              RAL
2100 0E9A 6F              MOV     L,A
2101 0E9B 7C              MOV     A,H
2102 0E9C 17              RAL
2103 0E9D 67              MOV     H,A
2104 0E9E CD5C0D          CALL    LSH
```

```
2105 0EA1 7A                MOV     A,D
2106 0EA2 0F                RRC
2107 0EA3 38D4               JRC     DIVX1
2108 0EA5 D5       DIVX3:   PUSH    D
2109 0EA6 EB                XCHG
2110 0EA7 2A9210             LHLD    OP3S
2111 0EAA 19                DAD     D
2112 0EAB D1                POP     D
2113 0EAC 3A9410             LDA     OP1S
2114 0EAF 8B                ADC     E
2115 0EB0 5F                MOV     E,A
2116 0EB1 3A9110             LDA     OP4S
2117 0EB4 18DD              JMPR    DIVX2
2118 0EB6 6B       DIVX4:   MOV     L,E
2119 0EB7 62                MOV     H,D
2120 0EB8 5F                MOV     E,A
2121 0EB9 50                MOV     D,B
2122 0EBA 48                MOV     C,B
2123 0EBB 19E8              JMPR    DIVX3
2124 0EBD 84200000 FTEN:    DB      34H,20H,0,0
2125 0EC1           ;/////////////////////////////////////////////////////////////
//
2126 0EC1           ;
2127 0EC1           ;                              TAN
2128 0EC1           ;        DEG=180/3.14 .X(A1+XX(A3+XX(A5+XX(A7+A9XX))))
2129 0EC1           ;        A1=0.9998662
2130 0EC1           ;        A3=-.3302995
2131 0EC1           ;        A5=.1801410
2132 0EC1           ;        A7=-.0851330
2133 0EC1           ;        A9=.0203351
2134 0EC1           ;\\\\\\\\\\\\\\\\\\\\\\\\\\\\\\\\\\\\\\\\\\\\\\\\\\\\\\\\\\\\\\
\
2135 0EC1 807FF733 A1:      DB      80H,7FH,0F7H,33H       ;.9998662
2136 0EC5 7FA91D04 A3:      DB      7FH,0A9H,1DH,04H
2137 0EC9 7E3876E2 A5:      DB      7EH,38H,76H,0E2H
2138 0ECD 7DAE5A36 A7:      DB      7DH,2AEH,5AH,36H
2139 0ED1 7B2AAE5E A9:      DB      7BH,2AH,0AEH,5EH       ;.0203351
2140 0ED5 86652EE3 F573:    DB      86H,65H,2EH,2E3H
2141 0ED9 81C92FDA MPI2:    DB      81H,0C9H,0FH,7DAH
2142 0EDD 81000000 FONE:    DB      81H,0,0,0
2143 0EE1 AF       ARCTAN:  XRA     A
2144 0EE2 323D10            STA     SWTX
2145 0EE5 21DD0E            LXI     H,FONE
2146 0EE8 CD740C            CALL    SB
2147 0EEB F42D2F            CP      SWITCH
2148 0EEE 219510            LXI     H,TEMP
2149 0EF1 E5                PUSH    H
2150 0EF2 D7                RST     2            ;LOD
2151 0EF3 E1                POP     H
2152 0EF4 CF                RST     1
2153 0EF5 219910            LXI     H,TEMP2
2154 0EF8 E5                PUSH    H
2155 0EF9 E5                PUSH    H
2156 0EFA E5                PUSH    H
2157 0EFB DF                RST     3            ;STR FLOAT #
2158 0EFC 21D10E            LXI     H,A9
2159 0EFF CF                RST     1
2160 0F00 21CD0E            LXI     H,A7
2161 0F03 E7                RST     4            ;FLOAT ADD
2162 0F04 E1                POP     H
2163 0F05 CF                RST     1
2164 0F06 21C90E            LXI     H,A5
2165 0F09 E7                RST     4            ;FLOAT ADD
2166 0F0A E1                POP     H
2167 0F0B CF                RST     1
2168 0F0C 21C50E            LXI     H,A3
2169 0F0F E7                RST     4            ;FLOAT ADD
2170 0F10 E1                POP     H
2171 0F11 CF                RST     1
2172 0F12 21C10E            LXI     H,A1
2173 0F15 E7                RST     4            ;FLOAT ADD
2174 0F16 219510            LXI     H,TEMP
2175 0F19 CF                RST     1
2176 0F1A 3A9D10            LDA     SWTX
2177 0F1D FEFF              CPI     -1
```

```
2178 0F1F 2007              JRNZ    M573
2179 0F21 21D92E            LXI     H,MPI2
2180 0F24 E7                RST     4           ;FLOAT ADD
2181 0F25 CDFA0B            CALL    CHS
2182 0F28 21D50E    M573:   LXI     H,F573
2183 0F2B CF                RST     1
2184 0F2C C9                RET
2185 0F2D 3EFF     SWITCH:  MVI     A,-1
2186 0F2F 329D10            STA     SWTX
2187 0F32 21DD0E            LXI     H,FONE
2188 0F35 D7                RST     2           ;LOD
2189 0F36 219510            LXI     H,TEMP
2190 0F39 E5                PUSH    H
2191 0F3A CD5B0C            CALL    DIV         ;DIV
2192 0F3D E1                POP     H
2193 0F3E DF                RST     3           ;STR FLOAT #
2194 0F3F C9                RET
2195 0F40      0F40  ROM    SET     $
2196 0F40      1095         ORG     RAM
2197 1095              TEMP: DS     4
2198 1099              TEMP2: DS    4
2199 109D              SWTX: DS     1
2200 109E      109E  RAM    SET     $
2201 109E      0F40         ORG     ROM
2202 0F40                   ;////////////////////////////////////////////
2203 0F40                   ;
2204 0F40                   ;       SQUARE ROOT SUBROUTINE --------SQRT
2205 0F40                   ;
2206 0F40                   ;////////////////////////////////////////////
2207 0F40 CD050C    SQRT:   CALL    TST         ;TEST SIGN OF ARGUMENT
2208 0F43 C8                RZ                  ;RETURN IF ARG.=0
2209 0F44 F8                RM                  ;RETURN IF ARG.<0
2210 0F45 329D10            STA     TEXP        ;STORE EXPONENT
2211 0F48 3E80              MVI     A,80H
2212 0F4A 32B310            STA     ACCE        ;STORE IN EXPONENT
2213 0F4D 219510            LXI     H,TMANTISSA
2214 0F50 DF                RST     3           ;STR FLOAT #    ;STORE IN TMANTISSA
2215 0F51             ;     INITIAL APPROXIMATION:
2216 0F51             ;
2217 0F51             ;     TMPX:=0.41730759 + .59015205*M
2218 0F51             ;
2219 0F51 218F0F            LXI     H,IAMULT
2220 0F54 CF                RST     1
2221 0F55 21930F            LXI     H,IAADD
2222 0F58 E7                RST     4           ;FLOAT ADD
2223 0F59 219910            LXI     H,TMPX
2224 0F5C E5                PUSH    H
2225 0F5D DF                RST     3           ;STR FLOAT #    ;STORE IN TMPX
2226 0F5E             ;
2227 0F5E             ;     NEWTON'S METHOD OF ITERATION TO
2228 0F5E             ;     THE APPROXIMATE VALUE
2229 0F5E             ;     OF THE SQRT OF M
2230 0F5E             ;
2231 0F5E CD7C0F            CALL    FSQ1        ;1ST ITERATION
2232 0F61 E1                POP     H
2233 0F62 DF                RST     3           ;STR FLOAT #    ;IN TMPX
2234 0F63 CD7C0F            CALL    FSQ1        ;2ND ITERATION
2235 0F66             ;
2236 0F66             ;     RESTORE RANGE TO OBTAIN THE FINAL RESULT
2237 0F66             ;
2238 0F66             ;
2239 0F66 3A9D10            LDA     TEXP
2240 0F69 D682              SUI     82H         ;UNBIAS THE EXPONENT
2241 0F6B 1F                RAR                 ;DIVIDE EXPONENT BY 2 (SQRT FNC)
2242 0F6C F5                PUSH    PSW         ;SAVE CARRY BIT (ODD OR EVEN)
2243 0F6D C682              ADI     82H         ;RESTORE BIAS TO EXPONENT
2244 0F6F 32B310            STA     ACCE
2245 0F72 F1                POP     PSW         ;RESTORE CARRY
2246 0F73 D2050C            JNC     TST         ;JUMP IF EXPONENT WAS EVEN
2247 0F76 21972F            LXI     H,SQRT2
2248 0F79 C3350C            JMP     MUL
2249 0F7C             ;
2250 0F7C             ;     SUBROUTINE FSQ1
2251 0F7C             ;
```

```
2252 0F7C                    ;    THIS ROUTINE PERFORMS ONE NEWTON ITERATION
2253 0F7C                    ;    TO THE SQUARE ROOT FUNCTION
2254 0F7C                    ;
2255 0F7C                    ;
2256 0F7C          FSQ1:
2257 0F7C 219510             LXI    H,TMANTISSA     ;LOAD THE MANTISSA
2258 0F7F D7                 RST    2               ;LOD          ;INTO FPA
2259 0F80 219910             LXI    H,TMPX          ;FORM M/TMP1
2260 0F83 E5                 PUSH   H
2261 0F84 CD5B0C             CALL   DIV             ;DIV
2262 0F87 E1                 POP    H
2263 0F88 E7                 RST    4               ;FLOAT ADD    ;DIVIDE BY 2 AND
2264 0F89 D601               SUI    1               ;STORE IN EXPONENT
2265 0F8B 328B10             STA    ACCE            ;RETURN TO MAIN SQRT ROUTINE
2266 0F8E C9                 RET
2267 0F8F                    ;
2268 0F8F                    ;    END OF SQUARE ROOT ALGORITHM
2269 0F8F                    ;
2270 0F8F                    ;    CONSTANTS NEEDED BY SQRT
2271 0F8F 801714EB  IAMULT:  DB     80H,17H,14H,0EBH        ;.59015226
2272 0F93 7F55A956  IAADD:   DB     7FH,55H,0A9H,56H        ;.41730759
2273 0F97 813504F3  SQRT2:   DB     81H,35H,4,0F3H          ;1.41421386
2274 0F9B
2275 0F9B                    ;    SCRATCH STORAGE
2276 0F9B
2277 0F9B     109D  TEXP     EQU    SWTX
2278 0F9B     1095  TMANTISSA EQU   TEMP
2279 0F9B     1099  TMPX     EQU    TEMP2
2280 0F9B                    ;/////////////////////////////////////////////////

2281 0F9B                    ;            FLOATING POINT NUMBER IN ACCU
2282 0F9B                    ;            16 BIT RESULT IN H,L
2283 0F9B                    ;/////////////////////////////////////////////////
2284 0F9B 2F        VFIX:    CMA            ;COMP ACU
2285 0F9C 3C                 INR    A
2286 0F9D C690               ADI    90H
2287 0F9F 2814               JRZ    CZERO
2288 0FA1 5F                 MOV    E,A
2289 0FA2 78                 MOV    A,B
2290 0FA3 F680               ORI    80H             ;ADD MS BIT
2291 0FA5 37        VFIXL:   STC                    ;SHIFT RIGHT
2292 0FA6 3F                 CMC
2293 0FA7 1F                 RAR
2294 0FA8 47                 MOV    B,A
2295 0FA9 79                 MOV    A,C
2296 0FAA 1F                 RAR
2297 0FAB 4F                 MOV    C,A
2298 0FAC 1D                 DCR    E
2299 0FAD 78                 MOV    A,B
2300 0FAE 20F5               JRNZ   VFIXL
2301 0FB0 60                 MOV    H,B
2302 0FB1 69                 MOV    L,C
2303 0FB2 D0                 RNC
2304 0FB3 23                 INX    H               ;ROUND UP
2305 0FB4 C9                 RET
2306 0FB5 78        CZERO:   MOV    A,B
2307 0FB6 F680               ORI    80H
2308 0FB8 67                 MOV    H,A
2309 0FB9 69                 MOV    L,C
2310 0FBA C9                 RET
2311 0FBB                    ;/////////////////////////////////////////////////
2312 0FBB                    ;            CONVERT BIN IN HL
2313 0FBB                    ;            TO FLOATINGPOINT
2314 0FBB                    ;/////////////////////////////////////////////////
2315 0FBB 7C        CONFL:   MOV    A,H
2316 0FBC B5                 ORA    L
2317 0FBD C8                 RZ
2318 0FBE 7C                 MOV    A,H
2319 0FBF A7                 ANA    A
2320 0FC0 F5                 PUSH   PSW
2321 0FC1 FC220F             CM     NEG
2322 0FC4 0608               MVI    B,8
2323 0FC6 04        C1:      INR    B
2324 0FC7 7D                 MOV    A,L
```

```
2325 0FC8 17              RAL
2326 0FC9 6F              MOV     L,A
2327 0FCA 7C              MOV     A,H
2328 0FCB 17              RAL
2329 0FCC 67              MOV     H,A
2330 0FCD A7              ANA     A
2331 0FCE F2DC0F          JP      C1
2332 0FD1 3E80            MVI     A,80H
2333 0FD3 90              SUB     B
2334 0FD4 5F              MOV     E,A
2335 0FD5 F1              POP     PSW
2336 0FD6 7C              MOV     A,H
2337 0FD7 FADC0F          JM      NCEG
2338 0FDA E67F            ANI     7FH
2339 0FDC 47      NCEG:   MOV     B,A
2340 0FDD 4D              MOV     C,L
2341 0FDE 1600            MVI     D,0
2342 0FE0 7B              MOV     A,E
2343 0FE1 C9              RET
2344 0FE2 7C      NEG:    MOV     A,H
2345 0FE3 2F              CMA
2346 0FE4 67              MOV     H,A
2347 0FE5 7D              MOV     A,L
2348 0FE6 2F              CMA
2349 0FE7 6F              MOV     L,A
2350 0FE8 23              INX     H
2351 0FE9 C9              RET
2352 0FEA         ;///////////////////////////////////////////////
2353 0FEA         ;      LOADS FLOAT;    NUMBER IN INTERNAL REG
2354 0FEA         ;///////////////////////////////////////////////
2355 0FEA 32B810  LADC:   STA     ACCE
2356 0FED 7B              MOV     A,E
2357 0FEE F680            ORI     80H
2358 0FF0 5F              MOV     E,A
2359 0FF1 A8              XRA     B
2360 0FF2 32BC10          STA     ACCS
2361 0FF5 21BD10          LXI     H,ACC1
2362 0FF8 73              MOV     M,E
2363 0FF9 23              INX     H
2364 0FFA 71              MOV     M,C
2365 0FFB 23              INX     H
2366 0FFC 72              MOV     M,D
2367 0FFD C3050C          JMP     TST
2368 1000         ;///////////////////////////////////////////////
2369 1000         ;///////////////////////////////////////////////
2370 1000  109E           ORG     RAM
2371 109E         RLCTR:  DS      02
2372 10A0         RMCTR:  DS      02      ;COUNTER FOR DRAM
2373 10A2         OTMSG:  DS      04      ;DISPLAY
2374 10A6         AVEBN:  DS      02      ;RESULT SUMED AVE
2375 10A8         STNBR:  DS      02      ;STEP NUMBER
2376 10AA         STCCR:  DS      02      ;STEP COUNTER
2377 10AC         FRQST:  DS      02      ;START FREQ
2378 10AE         AVFL:   DS      04      ;SUMED AVE FLT
2379 10B2         AVEL4:  DS      04      ;SUMED AVE
2380 10B6         AVEL3:  DS      04      ;2ND SUMED AVE
2381 10BA         AVEL2:  DS      04      ;3RD  SUMED AVE
2382 10BE         STNBF:  DS      04      ;FLT STEP NUMBER
2383 10C2         SRLBN:  DS      02      ;BIN SRL
2384 10C4         SLHBN:  DS      02      ;BIN SRL H
2385 10C6         ERLBN:  DS      02      ;BINARY ERL
2386 10C8         SWQD:   DS      01      ;B,0=QUAD
2387 10C9  2000           ORG     2000H   ;NEW RAM
2388 2000         RTNRM:  DS      02      ;BIN RTN LOSS RATIO
2389 2002         RTR37   DS      02
2390 2004         RTR36   DS      02
2391 2006         RTR35   DS      02
2392 2008         RTR34   DS      02
2393 200A         RTR33   DS      02
2394 200C         RTR32   DS      02
2395 200E         RTR31   DS      02
2396 2010         RTR30   DS      02
2397 2012         RTR29   DS      02
2398 2014         RTR28   DS      02
```

```
2399 2016           RTR27    DS    02
2400 2018           RTR26    DS    02
2401 201A           RTR25    DS    02
2402 201C           RTR24    DS    02
2403 201E           RTR23    DS    02
2404 2020           RTR22    DS    02
2405 2022           RTR21    DS    02
2406 2024           RTR20    DS    02
2407 2026           RTR19    DS    02
2408 2028           RTR18    DS    02
2409 202A           RTR17    DS    02
2410 202C           RTR16    DS    02
2411 202E           RTR15    DS    02
2412 2030           RTR14    DS    02
2413 2032           RTR13    DS    02
2414 2034           RTR12    DS    02
2415 2036           RTR11    DS    02
2416 2038           RTR10    DS    02
2417 203A           RTR09    DS    02
2418 203C           RTR08    DS    02
2419 203E           RTR07    DS    02
2420 2040           RTR06    DS    02
2421 2042           RTR05    DS    02
2422 2044           RTR04    DS    02
2423 2046           RTR03    DS    02
2424 2048           RTR02    DS    02
2425 204A           RTR01:   DS    02
2426 204C           DRAM:    DS    16    ;PRELOG DATA
2427 205C           DRM34:   DS    16
2428 206C           DRM30:   DS    20
2429 2080           DRM25:   DS    60
2430 20BC           DRM10:   DS    36
2431 20E0           BNLOW:   DS    02    ;BEFORE LOG 565
2432 20E2           BNMED:   DS    02
2433 20E4           BNHI:    DS    02
2434 20E6           BNFRQ:   DS    02
2435 20E8           BNSPL:   DS    02
2436 20EA           RMDIR:   DS    01    ;SWITCH FOR DIR
2437 20EB           FLTA:    DS    04
2438 20EF           FLTB     DS    04    ;FLOATING # FOR A,B
2439 20F3           FLTXM    DS    04
2440 20F7  B000              ORG   0B000H
2441 B000           NEWRM:   DS    100   ;START OF NEW RAM
2442 B064  E000              ORG   0E000H ;START NEW ROM
2443 E000  69                DB    69H   ;CARD IN CHECK
2444 E001  AF       NROM:    XRA   A
2445 E002  21F501            LXI   H,501  ;P501?
2446 E005  ED52              DSBC  D
2447 E007  CA3CE1            JZ    P501
2448 E00A  AF                XRA   A
2449 E00B  21F401            LXI   H,500
2450 E00E  ED52              DSBC  D
2451 E010  CAC0F0            JZ    P500
2452 E013  AF                XRA   A
2453 E014  21F601            LXI   H,502
2454 E017  ED52              DSBC  D
2455 E019  CA98E1            JZ    P502
2456 E01C  AF                XRA   A
2457 E01D  21F701            LXI   H,503
2458 E020  ED52              DSBC  D
2459 E022  CADAE1            JZ    P503
2460 E025  AF                XRA   A
2461 E026  21F801            LXI   H,504
2462 E029  ED52              DSBC  D
2463 E02B  CA11E2            JZ    P504
2464 E02E  AF                XRA   A
2465 E02F  21FB01            LXI   H,507
2466 E032  ED52              DSBC  D
2467 E034  CAC3E2            JZ    P507
2468 E037  AF                XRA   A
2469 E038  21FD01            LXI   H,509
2470 E03B  ED52              DSBC  D
2471 E03D  CA62E8            JZ    P509
2472 E040  AF                XRA   A
```

```
2473 E041 21F901            LXI    H,505
2474 E044 ED52              DSBC   D
2475 E046 CAFCE3            JZ     P505
2476 E049 AF                XRA    A
2477 E04A 21FA01            LXI    H,506
2478 E04D ED52              DSBC   D
2479 E04F CABAE3            JZ     P506
2480 E052 AF                XRA    A
2481 E053 21B603            LXI    H,950
2482 E056 ED52              DSBC   D
2483 E058 CA06EB            JZ     P950
2484 E05B 21B703            LXI    H,951
2485 E05E AF                XRA    A
2486 E05F ED52              DSBC   D
2487 E061 C33D00            JMP    ERR1
2488 E064                   LIST
2489 E064     E070          ORG    0E070H    ;LINK
2490 E070 3A9310    ECC3:   LDA    PRINT
2491 E073 FE81              CPI    81H       ;IS MODE SET
2492 E075 CA7C02            JZ     B106      ;BACK TO ENTER MODE
2493 E078 FF                RST    7
2494 E079                   LIST
2495 E079     E080          ORG    0E080H    ;PRINTER
2496 E080 216C10    PTR:    LXI    H,SWMO
2497 E083 CB6E              BIT    M,4
2498 E085 CA0701            JZ     BKSCN     ;RTN KEYSCAN
2499 E088 0603     PTRST:   MVI    B,3
2500 E08A AF                XRA    A
2501 E08B 210180            LXI    H,8001H
2502 E08E 7E       PTRLP:   MOV    A,M
2503 E08F C6FF              ADI    0FFH
2504 E091 3806              JRC    PTROK
2505 E093 CB25              RLCR   L
2506 E095 10F7              DJNZ   PTRLP
2507 E097 18EF              JMPR   PTRST
2508 E099 210430   PTROK:   LXI    H,3004H
2509 E09C 7E                MOV    A,M
2510 E09D 07                RLC
2511 E09E DA2AEB            JC     D952Z
2512 E0A1 C30721            JMP    BKSCN
2513 E0A4 212600   COMM1:   LXI    H,38      ;#STEPS
2514 E0A7 22A910            SHLD   STNBR
2515 E0AA 210222   COMM2:   LXI    H,RTNRM
2516 E0AD 229B10            SHLD   RLCTR     ;RETURN LOSS COUNTER
2517 E0B0 214C20            LXI    H,DRAM
2518 E0B3 22A010            SHLD   RMCTR     ;Z COUNTER
2519 E0B6 215DE7            LXI    H,TABLS   ;START OF FRQ WEIGHT
2520 E0B9 22AA10            SHLD   STOCR
2521 E0BC 21D80E            LXI    H,3320    ;HZ
2522 E0BF 22AC10            SHLD   FRQST
2523 E0C2 CD03E5   COMM0:   CALL   XFER
2524 E0C5 216400            LXI    H,100     ;HZ
2525 E0C8 223610            SHLD   STEPS
2526 E0CB 210810            LXI    H,SWOD
2527 E0CE C9                RET
2528 E0CF CDA4E0   P500:    CALL   COMM1
2529 E0D2 CBCE              SETB   M,Z
2530 E0D4 CD3AE4            CALL   ECHOR
2531 E0D7 2134E1            LXI    H,MSLL
2532 E0DA CD20E3            CALL   XFER2
2533 E0DD 21AEE3            LXI    H,ASLL
2534 E0E0 CD29E3            CALL   XFER3
2535 E0E3 2AC210            LHLD   SRLBN
2536 E0E6 CDF6E3            CALL   EDSPL
2537 E0E9 CDADE4            CALL   SEC1D
2538 E0EC 2138E1            LXI    H,MSLH
2539 E0EF CD20E3            CALL   XFER2
2540 E0F2 2132E3            LXI    H,ASLH
2541 E0F5 CD29E3            CALL   XFER3
2542 E0F8 2AC410            LHLD   SLHBN
2543 E0FB CDF6E3            CALL   EDSPL
2544 E0FE CDADE4            CALL   SEC1D
2545 E101 2117E5            LXI    H,MRDY
2546 E104 CD20E3            CALL   XFER2
2547 E107 21B6E3            LXI    H,AECE
```

```
2548 E10A CD29E3            CALL    XFER3
2549 E10D 2AC610            LHLD    ERLBV
2550 E110 CDF6E3            CALL    EDSPL
2551 E113 CDADE4            CALL    SEC1D
2552 E116 3E05              MVI     A,05
2553 E118 210210            LXI     H,PBIN1
2554 E11B 77                MOV     M,A
2555 E11C 23                INX     H
2556 E11D AF                XRA     A
2557 E11E 77                MOV     M,A
2558 E11F 23                INX     H
2559 E120 77                MOV     M,A
2560 E121 23                INX     H
2561 E122 CD12E3            CALL    SPUP
2562 E125 20A8              JRNZ    P520
2563 E127 FF                RST     7
2564 E128 05050E0D  MSPL:   DB      5H,5H,0EH,0DH
2565 E12C 050D2005  MAVE:   DB      5H,0DH,20,05
2566 E130 82400000  FLT3:   DB      82H,40H,0,0
2567 E134 05050D0D  MSLL:   DB      05H,05H,0DH,0DH
2568 E138 05050D0C  MSLH:   DB      05,05H,0DH,0CH
2569 E13C CDC2E0    P521:   CALL    COMM0
2570 E13F CB86              RES3    M,0
2571 E141 21C409            LXI     H,2500   ;HZ
2572 E144 22AC10            SHLD    FRQST
2573 E147 211600            LXI     H,22
2574 E14A 22A810            SHLD    STNBR
2575 E14D 2134E7            LXI     H,TABL2
2576 E150 22AA10            SHLD    STOCK
2577 E153 213020            LXI     H,DRM25
2578 E156 22A010            SHLD    RMCTR
2579 E159 211A20            LXI     H,RTR25
2580 E15C 229E10            SHLD    RLCTR
2581 E15F CD3AE4            CALL    ECHOR
2582 E162 2117E5            LXI     H,MRDY   ;EHOL
2583 E165 CD20E3            CALL    XFER2
2584 E168 2136E3            LXI     H,AECH
2585 E16B CD29E3            CALL    XFER3
2586 E16E 2AC610            LHLD    ERLBV
2587 E171 CDF6E3            CALL    EDSPL
2588 E174 CDADE4            CALL    SEC1D
2589 E177 3E05              MVI     A,05    ;5
2590 E179 210210            LXI     H,PBIN1
2591 E17C 77                MOV     M,A
2592 E17D 23                INX     H
2593 E17E AF                XRA     A
2594 E17F 77                MOV     M,A
2595 E180 23                INX     H
2596 E181 3E01              MVI     A,01
2597 E183 77                MOV     M,A
2598 E184 23                INX     H
2599 E185 CD12E3            CALL    SPUP
2600 E188 20B2              JRNZ    P501
2601 E18A FF                RST     7
2602 E18B CDC2E0    P502:   CALL    COMM0
2603 E18E CB86              RES3    M,0
2604 E190 21E803            LXI     H,1000   ;HZ
2605 E193 22AC10            SHLD    FRQST
2606 E196 210A00            LXI     H,10
2607 E199 22A810            SHLD    STNBR
2608 E19C 21B1E7            LXI     H,TABL3
2609 E19F 22AA10            SHLD    STOCK
2610 E1A2 21BC20            LXI     H,DRM12
2611 E1A5 22A010            SHLD    RMCTR
2612 E1A8 213820            LXI     H,RTR12
2613 E1AB 229E10            SHLD    RLCTR
2614 E1AE CD3AE4            CALL    ECHOR
2615 E1B1 2134E1            LXI     H,MSLL
2616 E1B4 CD20E3            CALL    XFER2
2617 E1B7 21AEE3            LXI     H,ASLL
2618 E1BA CD29E3            CALL    XFER3
2619 E1BD 2AC210            LHLD    SRLBV
2620 E1C0 CDF6E3            CALL    EDSPL
2621 E1C3 CDADE4            CALL    SEC1D
2622 E1C6 210210            LXI     H,PBIN1
```

```
2623 E1C9 3E05           MVI   A,5
2624 E1CB 77             MOV   M,A
2625 E1CC 23             INX   H
2626 E1CD AF             XRA   A
2627 E1CE 77             MOV   M,A
2628 E1CF 23             INX   H
2629 E1D0 3E02           MVI   A,22
2630 E1D2 77             MOV   M,A
2631 E1D3 23             INX   H
2632 E1D4 CD12E3         CALL  SPUP
2633 E1D7 20B2           JRNZ  P522
2634 E1D9 FF             RST   7
2635 E1DA CDAAE0  P573:  CALL  COMM2
2636 E1DD CBC6           SETB  M,0
2637 E1DF 211500         LXI   H,21
2638 E1E2 22A810         SHLD  STNBR
2639 E1E5 CD3AE4         CALL  ECHOR
2640 E1E8 2138E1         LXI   H,MSLH
2641 E1EB CD20E3         CALL  XFER2
2642 E1EE 2132E3         LXI   H,ASLH
2643 E1F1 CD29E3         CALL  XFER3
2644 E1F4 2AC410         LHLD  SLHBN
2645 E1F7 CDF6E3         CALL  EDSPL
2646 E1FA CDADE4         CALL  SEC1D
2647 E1FD 210210         LXI   H,PBIN1
2648 E200 3E05           MVI   A,5
2649 E202 77             MOV   M,A
2650 E203 23             INX   H
2651 E204 AF             XRA   A
2652 E205 77             MOV   M,A
2653 E206 23             INX   H
2654 E207 3E03           MVI   A,3
2655 E209 77             MOV   M,A
2656 E20A 23             INX   H
2657 E20B CD12E3         CALL  SPUP
2658 E20E 20CA           JRNZ  P573
2659 E210 FF             RST   7
2660 E211 CDC2E0  P524:  CALL  COMM2
2661 E214 CBC6           SETB  M,0
2662 E216 210B00         LXI   H,11
2663 E219 22A810         SHLD  STNBR
2664 E21C 23             DCX   H
2665 E21D CDB8F           CALL  CONFL
2666 E220 21BE10         LXI   H,STNPF
2667 E223 DF             RST   3
2668 E224 AF             XRA   A
2669 E225 323210         STA   AVEL4
2670 E228 2175E7         LXI   H,TABLB
2671 E22B 22AA10         SHLD  STOCR
2672 E22E 216C20         LXI   H,DRM30
2673 E231 22A010         SHLD  RMCTR
2674 E234 211020         LXI   H,RTR30
2675 E237 223E10         SHLD  RLCTR
2676 E23A 21B03B         LXI   H,3000  ;HZ
2677 E23D 22AC10         SHLD  FRQST
2678 E240 CD1BE5         CALL  STPLO
2679 E243 CD64E4         CALL  ECHOL
2680 E246 2138E1         LXI   H,MSLH
2681 E249 CD20E3         CALL  XFER2
2682 E24C 2132E3         LXI   H,ASLH
2683 E24F CD29E3         CALL  XFER3
2684 E252 2AA610         LHLD  AVEBN
2685 E255 CDF6E3         CALL  EDSPL
2686 E258 210B00         LXI   H,11
2687 E25B 22A810         SHLD  STNBR
2688 E25E 23             DCX   H
2689 E25F CDBB7F         CALL  CONFL
2690 E262 21BE10         LXI   H,STNBF
2691 E265 DF             RST   3
2692 E266 AF             XRA   A
2693 E267 32AE10         STA   AVEL
2694 E26A 32BA10         STA   AVEL2
2695 E26D 323610         STA   AVEL3
```

```
2696 E270 32B210            STA   AVEL4
2697 E273 2184E7            LXI   H,TABL2
2698 E276 22AA10            SHLD  STOCK
2699 E279 218020            LXI   H,DRM25
2700 E27C 22A010            SHLD  RMCTR
2701 E27F 211A20            LXI   H,RTR25
2702 E282 229E10            SHLD  RLCTR
2703 E285 21C010            LXI   H,SWQD
2704 E288 CB86              RESB  M,0
2705 E28A 21C409            LXI   H,2500
2706 E28D 22AC10            SHLD  FRQST
2707 E290 CD1BE5            CALL  STPLO
2708 E293 CD5CE4            CALL  ECEOS
2709 E296 2117E5            LXI   H,MRDY
2710 E299 CD20E3            CALL  XFER2
2711 E29C 2136E3            LXI   H,AECH
2712 E29F CD29E3            CALL  XFER3
2713 E2A2 2AA610            LHLD  AVEBV
2714 E2A5 CDF6E3            CALL  EDSPL
2715 E2A8 CDADE4            CALL  SEC1D
2716 E2AB CDADE4            CALL  SEC1D
2717 E2AE 210210            LXI   H,PBIN1
2718 E2B1 3E05              MVI   A,5
2719 E2B3 77                MOV   M,A
2720 E2B4 23                INX   H
2721 E2B5 AF                XRA   A
2722 E2B6 77                MOV   M,A
2723 E2B7 23                INX   H
2724 E2B8 3E04              MVI   A,4
2725 E2BA 77                MOV   M,A
2726 E2BB 23                INX   H
2727 E2BC CD12E3            CALL  SPUP
2728 E2BF C211F2            JNZ   P524
2729 E2C2 FF                RST   7
2730 E2C3 CDC2E0    P527:   CALL  COMM2
2731 E2C6 CBC6              SETB  M,0
2732 E2C8 21452D            LXI   H,3420
2733 E2CB 22AC10            SHLD  FRQST
2734 E2CE 212100            LXI   H,33
2735 E2D1 22A810            SHLD  STNBR
2736 E2D4 2169E7            LXI   H,TABLA
2737 E2D7 22AA10            SHLD  STOCK
2738 E2DA 215C20            LXI   H,DRM34
2739 E2DD 22A010            SHLD  RMCTR
2740 E2E0 216820            LXI   H,RTR34
2741 E2E3 229E10            SHLD  RLCTR
2742 E2E6 CD3AE4            CALL  ECHOR
2743 E2E9 212CE1            LXI   H,MAVE
2744 E2EC CD20E3            CALL  XFER2
2745 E2EF 21AAE3            LXI   H,AAVE
2746 E2F2 CD29E3            CALL  XFER3
2747 E2F5 2AA610            LHLD  AVEBV
2748 E2F8 CDF6E3            CALL  EDSPL
2749 E2FB CDADE4            CALL  SEC1D
2750 E2FF 210210            LXI   H,PBIN1
2751 E301 3E05              MVI   A,5
2752 E303 77                MOV   M,A
2753 E304 23                INX   H
2754 E305 AF                XRA   A
2755 E306 77                MOV   M,A
2756 E307 23                INX   H
2757 E308 3E07              MVI   A,7
2758 E30A 77                MOV   M,A
2759 E30B 23                INX   H
2760 E30C CD12E3            CALL  SPUP
2761 E30F 2032              JRNZ  P527
2762 E311 FF                RST   7
2763 E312 220010    SPUP:   SHLD  ENTER
2764 E315 3E10              MVI   A,10H
2765 E317 320D10            STA   STATS
2766 E31A 3A6C10            LDA   SWMO
2767 E31D CB77              BIT   A,6
2768 E31F C9                RET
2769 E320 11A210    XFER2:  LXI   D,OTMSG
2770 E323 010400            LXI   B,04
```

```
2771 E326 EDB0                LDIR
2772 E328 C9                  RET
2773 E329 1100B0    XFER3:    LXI    D,PINRM
2774 E32C 010400              LXI    B,4
2775 E32F EDB0                LDIR              ;TRANSFERS MSG 500
2776 E331 C9                  RET
2777 E332 3A8810    PTRON:    LDA    PRINT
2778 E335 FE31                CPI    81H        ;MODE SET
2779 E337 C0                  RNZ               ;NO BACK.
2780 E338 3A6C10              LDA    SWMO
2781 E33B CB67                BIT    A,4
2782 E33D C8                  RZ                ;DOUBLE CHECK
2783 E33E CD9DEB              CALL   CLRF
2784 E341 0603                MVI    B,3
2785 E343 21D4EC              LXI    H,SGVNA
2786 E346 CD09ED              CALL   MSGOT
2787 E349 0E50                MVI    C,'P'
2788 E34B CDFAEC              CALL   PROUT
2789 E34E 216910              LXI    H,1769H    ;CODER+1
2790 E351 0603                MVI    B,3
2791 E353 7E        LPSO:     MOV    A,M
2792 E354 C630                ADI    30H        ;MAKE#
2793 E356 4F                  MOV    C,A
2794 E357 23                  INX    H
2795 E358 E5                  PUSH   H
2796 E359 CDFAEC              CALL   PROUT      ;PRINT OUT
2797 E35C F1                  POP    H
2798 E35D 10F4                DJNZ   LPSO
2799 E35F CD9DEB              CALL   CLRF
2800 E362 C9                  RET
2801 E363 3A6C10    PDSPL:    LDA    SWMO
2802 E366 CB67                BIT    A,4
2803 E368 C8                  RZ                ;NOT SET
2804 E369 E5                  PUSH   H
2805 E36A CD72E3              CALL   PTLBL      ;LABLE OUT
2806 E36D E1                  POP    H          ;BINARY RETURN LOSS
2807 E36E CD4CEC              CALL   RTLOT      ;PRINTS RTN LOSS VALUE
2808 E371 C9                  RET
2809 E372 CD9DEB    PTLBL:    CALL   CLRF
2810 E375 0604                MVI    B,4
2811 E377 210030              LXI    H,PINRM
2812 E37A CD09ED              CALL   MSGOT      ;PRINTS MSG
2813 E37D 0E20                MVI    C,22H
2814 E37F CDFAEC              CALL   PROUT
2815 E382 0618                MVI    B,24
2816 E384 218EE3              LXI    H,MRLN
2817 E387 CD09ED              CALL   MSGOT
2818 E38A CD9DEB              CALL   CLRF
2819 E38D C9                  RET
2820 E38E 52455455  MRLN:     DB     'RETURN LOSS '
     E392 524E2040
     E396 4F535320
2821 E39A 56533A20            DB     'VS: R1 C2 C3'
     E39E 52312043
     E3A2 32204333
2822 E3A6 53504C20  ASPL:     DB     'SPL '
2823 E3AA 41505240  AAVE:     DB     'APRL'
2824 E3AE 534C4C20  ASLL:     DB     'SLL '
2825 E3B2 534C4820  ASLH:     DB     'SLH '
2826 E3B6 4543484F  AECH:     DB     'ECHO'
2827 E3BA AF        P506:     XRA    A
2828 E3BB 32C210              STA    SWQD
2829 E3BE 3A6C10              LDA    SWMO
2830 E3C1 E610                ANI    10H
2831 E3C3 326C10              STA    SWMO
2832 E3C6 214C20              LXI    H,DRAM
2833 E3C9 22A010              SHLD   RMCTR
2834 E3CC 210020              LXI    H,RTNRM
2835 E3CF 223E10              SHLD   RLCTR
2836 E3D2 216400              LXI    H,100
2837 E3D5 223610              SHLD   STEPS
2838 E3D8 21D82E              LXI    H,3000
2839 E3DB 22AC10              SHLD   FRQST
2840 E3DE 212600              LXI    H,38
2841 E3E1 22A810              SHLD   STNPR
```

```
2842 E3E4 215DE7          LXI    H,TABLS
2843 E3E7 22AA10          SHLD   STOCR
2844 E3EA CD3AE4          CALL   ECHOR
2845 E3ED 216C10          LXI    H,SWMO
2846 E3F0 CBFE            SETB   M,7
2847 E3F2 E5              PUSH   H
2848 E3F3 C38E07          JMP    PROG
2849 E3F6                 ;///////////////////////////////
2850 E3F6 E5       EDSPL: PUSH   H         ;SAVE
2851 E3F7 CD63E3          CALL   PDSPL
2852 E3FA 213C10          LXI    H,PERAM
2853 E3FD E5              PUSH   H
2854 E3FE CD3403          CALL   IMPZO
2855 E401 D1              POP    D         ;PERAM
2856 E402 E1              POP    H         ;BIN NUMBER
2857 E403 CDCC24          CALL   BINB2
2858 E406 3E05            MVI    A,05
2859 E408 323C10          STA    PERAM     ;SIGN
2860 E40B 323810          STA    ZRAM
2861 E40E EF              RST    5
2862 E40F 214010          LXI    H,ALTRM
2863 E412 CBDE            SETB   M,3
2864 E414 CB8E            RESB   M,2
2865 E416 CB96            RESB   M,2
2866 E418 212410          LXI    H,OUTRM
2867 E41B CB8E            RESB   M,2       ;MEAS LED
2868 E41D CBE6            SETB   M,4
2869 E41F CDE802          CALL   NTFR
2870 E422 216810          LXI    H,CODER
2871 E425 112610          LXI    D,OTRM2
2872 E428 010400          LXI    B,04
2873 E42B EDB0            LDIR
2874 E42D 21A210          LXI    H,OTMSG
2875 E430 113810          LXI    D,ZRAM
2876 E433 010400          LXI    B,04
2877 E436 EDB0            LDIR
2878 E438 F7              RST    6
2879 E439 C9              RET
2880 E43A 2AA810   ECHOR: LHLD   STNBR
2881 E43D 2B              DCX    H
2882 E43E CDBB0F          CALL   CONFL
2883 E441 21BF10          LXI    H,STNBF
2884 E444 DF              RST    3
2885 E445 21AE10          LXI    H,AVEL    ;CLEAR
2886 E448 AF              XRA    A
2887 E449 77              MOV    M,A
2888 E44A 21BA10          LXI    H,AVEL2
2889 E44D 77              MOV    M,A
2890 E44E 21B610          LXI    H,AVEL3
2891 E451 77              MOV    M,A
2892 E452 213210          LXI    H,AVEL4
2893 E455 77              MOV    M,A
2894 E456 2AAC10          LHLD   FRQST
2895 E459 CD1BF5          CALL   STPLO
2896 E45C 210000   ECHOS: LXI    H,ANGRG   ;UNHOLD
2897 E45F CB8E            RESB   M,1
2898 E461 CD4F04          CALL   STOP
2899 E464 210310   ECHOL: LXI    H,SWQD
2900 E467 C346            BIT    M,0
2901 E469 C432E8          CNZ    QUAD
2902 E46C 21AE10          LXI    H,AVEL    ;SUMED AVE
2903 E46F D7              RST    2         ;LOD
2904 E470 2151E7          LXI    H,CURV1
2905 E473 CD530C          CALL   DIV
2906 E476 CD0A0B          CALL   LOUT
2907 E479 22C610          SHLD   ERLBN
2908 E47C 21BA10          LXI    H,AVEL2
2909 E47F D7              RST    2
2910 E480 2159E7          LXI    H,CURV3
2911 E483 CD5B0C          CALL   DIV
2912 E486 CD0A0B          CALL   LOUT
2913 E489 22C210          SHLD   SRLBN
2914 E48C 21B610          LXI    H,AVEL3
2915 E48F D7              RST    2
2916 E490 2155E7          LXI    H,CURV2
```

```
2917 E493 CD5B2C              CALL    DIV
2918 E496 CD0A0B              CALL    LOUT
2919 E499 22C410              SHLD    SLHBN
2920 E49C 21B210              LXI     H,AVEL4
2921 E49F D7                  RST     2
2922 E4A0 21BE10              LXI     H,STVBF
2923 E4A3 CD5B2C              CALL    DIV
2924 E4A6 CD0A0B              CALL    LOUT
2925 E4A9 22A610              SHLD    AVEBN
2926 E4AC C9                  RET
2927 E4AD 06FF      SEC1D:    MVI     B,0FFH
2928 E4AF CDB5E4    SEC1L:    CALL    MSECC
2929 E4B2 10FB                DJNZ    SEC1L
2930 E4B4 C9                  RET
2931 E4B5 C5        MSECC:    PUSH    B
2932 E4B6 06FF                MVI     B,0FFH
2933 E4B8 210480    MSECL:    LXI     H,8004H ;KEYS
2934 E4BB 7E                  MOV     A,M
2935 E4BC 0F                  RRC
2936 E4BD 0F                  RRC
2937 E4BE 0F                  RRC
2938 E4BF 0F                  RRC
2939 E4C0 0F                  RRC
2940 E4C1 3804                JRC     OTEXT
2941 E4C3 10F3                DJNZ    MSECL
2942 E4C5 C1                  POP     B
2943 E4C6 C9                  RET
2944 E4C7 E1        OTEXT:    POP     H
2945 E4C8 E1                  POP     H
2946 E4C9 E1                  POP     H
2947 E4CA 21441F              LXI     H,8004
2948 E4CD C39821              JMP     CLRKB
2949 E4D0 CD2A0B    S526:     CALL    SCALE
2950 E4D3 216F10              LXI     H,FLTX1 ;TEMP STORAGE
2951 E4D6 DF                  RST     3
2952 E4D7 CDD02B              CALL    ABS
2953 E4DA CDB32F              CALL    VFIX
2954 E4DD E5                  PUSH    H
2955 E4DE 216F10              LXI     H,FLTX1
2956 E4E1 D7                  RST     2
2957 E4E2 CD0520              CALL    TST
2958 E4E5 E1                  POP     H
2959 E4E6 FCFBE4              CM      BNPOS
2960 E4E9 3A6C10              LDA     SWMO
2961 E4EC CB7F                BIT     A,7
2962 E4EE C0                  RNZ
2963 E4EF EB                  XCHG
2964 E4F0 2AA610              LHLD    RMCTR
2965 E4F3 73                  MOV     M,E
2966 E4F4 23                  INX     H
2967 E4F5 72                  MOV     M,D
2968 E4F6 23                  INX     H
2969 E4F7 22A610              SHLD    RMCTR
2970 E4FA C9                  RET
2971 E4FB 7C        BNPOS:    MOV     A,H
2972 E4FC 2F                  CMA
2973 E4FD 67                  MOV     H,A
2974 E4FE 7D                  MOV     A,L
2975 E4FF 2F                  CMA
2976 E500 6F                  MOV     L,A
2977 E501 23                  INX     H
2978 E502 C9                  RET
2979 E503 010400    XFFR:     LXI     B,04
2980 E506 212610              LXI     H,OTRM2
2981 E509 116810              LXI     D,CODER
2982 E50C EDB0                LDIR
2983 E50E 3E0E                MVI     A,0EH
2984 E510 326810              STA     CODER
2985 E513 CD32E3              CALL    PTRON   ;IF ON PRINT HEADER
2986 E516 C9                  RET
2987 E517 05B0200H            DB      05,0BH,20H,0
2988 E51B 220710    STFLO:    SHLD    FRBIN
2989 E51E 220070              SHLD    FREQ
2990 E521 CDB02F              CALL    CONFL
2991 E524 215110              LXI     H,FLTFR
```

```
2992 E527 DF                     RST    3          ;STORE
2993 E528 CD2BE7                 CALL   ESTRT
2994 E52B 2101C0                 LXI    H,ADSRT
2995 E52E C3C0E5                 JMP    WAIT2
2996 E531 2A00A0     STPLP:      LHLD   RLLOW
2997 E534 CBEC                   SETB   H,5        ;+FOR REAL
2998 E536 220910                 SHLD   BINRL
2999 E539 2A02A0                 LHLD   IMLOW
3000 E53C 220B10                 SHLD   BINIM
3001 E53F CDCFE7                 CALL   ERANGE
3002 E542 3AA810                 LDA    STNBR
3003 E545 3D                     DCR    A
3004 E546 C8                     RZ                ;ALL DONE
3005 E547 32A810                 STA    STNBR
3006 E54A AF                     XRA    A          ;CLR FLAGS
3007 E54B 2A0710                 LHLD   FRBIN
3008 E54E ED5B3610                LDED   STEPS
3009 E552 ED52                   DSBC   D
3010 E554 220710                 SHLD   FRBIN
3011 E557 CD63E8                 CALL   CKSKP      ;2600HZ SKIP
3012 E55A 220C70                 SHLD   FREQ
3013 E55D 2A0B10                 LHLD   BINIM
3014 E560 CDC1F6                 CALL   COND1
3015 E563 214510                 LXI    H,FLTIM
3016 E566 DF                     RST    3          ;STORE
3017 E567 2A0910                 LHLD   BINRL
3018 E56A CDC1E6                 CALL   COND1
3019 E56D 214110                 LXI    H,FLTRL
3020 E570 DF                     RST    3          ;STORE
3021 E571 3A0C10                 LDA    100F
3022 E574 CB6F                   BIT    A,5
3023 E576 200D                   JRNZ   INDCT
3024 E578 214510                 LXI    H,FLTIM
3025 E57B E5                     PUSH   H
3026 E57C D7                     RST    2          ;LOD
3027 E57D CDFD0B                 CALL   ABS
3028 E580 CDFA0B                 CALL   CES
3029 E583 E1                     POP    H
3030 E584 DF                     RST    3;         STORE
3031 E585 CDF2E5     INDCT:      CALL   BRGIN
3032 E588 2A5D10                 LHLD   CRAM
3033 E58B CDDD0E                 CALL   CAP
3034 E58E 216F10                 LXI    H,FLTX1
3035 E591 DF                     RST    3          ;STORE
3036 E592 2A6D10                 LHLD   CRAM2
3037 E595 CDDD0E                 CALL   CAP
3038 E598 217310                 LXI    H,FLTX2
3039 E59B DF                     RST    3
3040 E59C 2A5310                 LHLD   RRAM
3041 E59F CDBB0F                 CALL   CONFL
3042 E5A2 217710                 LXI    H,FLTR1
3043 E5A5 DF                     RST    3
3044 E5A6 CD2A07                 CALL   CALZN
3045 E5A9 2A0710                 LHLD   FRBIN
3046 E5AC CDBB0F                 CALL   CONFL
3047 E5AF 215110                 LXI    H,FLTFR
3048 E5B2 DF                     RST    3
3049 E5B3 216C10                 LXI    H,SWMO
3050 E5B6 CB7E                   BIT    M,7
3051 E5B8 2019                   JRNZ   RDYIN      ;MOVED FOR TIME=TIME
3052 E5BA CD14E6     RTN0E:      CALL   ALOSS
3053 E5BD 2101C0                 LXI    H,ADSRT
3054 E5C0 CB5E       WAIT2:      BIT    M,3        ;HIGH A/D
3055 E5C2 20FC                   JRNZ   WAIT2
3056 E5C4 CB5E       WAIT3:      BIT    M,3
3057 E5C6 28FC                   JRZ    WAIT3
3058 E5C8 CB5E       WAIT4:      BIT    M,3
3059 E5CA 20FC                   JRNZ   WAIT4
3060 E5CC CB66       WAIT5:      BIT    M,4
3061 E5CE 20FC                   JRNZ   WAIT5
3062 E5D0 C331E5                 JMP    STPLP      ;L H L L
3063 E5D3 CDE3E5     RDYIN:      CALL   RDYN2
3064 E5D6 215710                 LXI    H,FLTIR
3065 E5D9 DF                     RST    3
3066 E5DA CDE3E5                 CALL   RDYN2
```

```
3267 E5DD 215F10            LXI     H,FLTRF
3268 E5E0 DF                RST     3
3269 E5E1 18D7              JMPR    RTN26
3270 E5E3 2AA010   RDYN2:   LHLD    RMCTR
3271 E5E6 5E                MOV     E,M
3272 E5E7 23                INX     H
3273 E5E8 56                MOV     D,M
3274 E5E9 23                INX     H
3275 E5EA 22A010            SHLD    RMCTR
3276 E5ED EB                XCHG
3277 E5EE CD3B2F            CALL    CONFL
3278 E5F1 C9                RET
3279 E5F2 214510   BRGIN:   LXI     H,FLTIM
3280 E5F5 D7                RST     2
3281 E5F6 CDD2E4            CALL    S526
3082 E5F9 214110            LXI     H,FLTRL
3083 E5FC D7                RST     2
3084 E5FD CDD2E4            CALL    S526
3085 E600 C9                RET
3086 E601 7C       COND1:   MOV     A,H
3087 E602 E60F              ANI     0FH
3088 E604 67                MOV     H,A
3089 E605 E5                PUSH    H
3090 E606 CD3B2F            CALL    CONFL
3091 E609 CDEA2F            CALL    LADC
3092 E60C 216200            LXI     H,FTWO
3093 E60F CD532C            CALL    DIV
3094 E612 E1                POP     H
3095 E613 C9                RET
3096 E614 214110   ALOSS:   LXI     H,FLTRL
3097 E617 E5                PUSH    H
3098 E618 D7                RST     2          ;LOD
3099 E619 CD2A2B            CALL    SCALE
3100 E61C E1                POP     H
3101 E61D DF                RST     3
3102 E61E 214510            LXI     H,FLTIM
3103 E621 E5                PUSH    H
3104 E622 D7                RST     2
3105 E623 CD2A2B            CALL    SCALE
3106 E626 E1                POP     H
3107 E627 DF                RST     3
3108 E628 215F10            LXI     H,FLTRF
3109 E62B E5                PUSH    H
3110 E62C D7                RST     2
3111 E62D 214110            LXI     H,FLTRL
3112 E630 E5                PUSH    H
3113 E631 E7                RST     4
3114 E632 219510            LXI     H,TEMP
3115 E635 E5                PUSH    H
3116 E636 DF                RST     3
3117 E637 E1                POP     H
3118 E638 CF                RST     1
3119 E639 219910            LXI     H,TEMP2
3120 E63C DF                RST     3
3121 E63D E1                POP     H
3122 E63E D7                RST     2
3123 E63F E1                POP     H
3124 E640 CD742C            CALL    SB
3125 E643 216310            LXI     H,TEMP3
3126 E646 E5                PUSH    H
3127 E647 E5                PUSH    H
3128 E648 DF                RST     3
3129 E649 E1                POP     H
3130 E64A CF                RST     1
3131 E64B E1                POP     H
3132 E64C DF                RST     3
3133 E64D 215710            LXI     H,FLTIR
3134 E650 E5                PUSH    H
3135 E651 D7                RST     2
3136 E652 214510            LXI     H,FLTIM
3137 E655 E5                PUSH    H
3138 E656 E7                RST     4
3139 E657 219510            LXI     H,TEMP
```

```
3140  E65A  E5              PUSH  H
3141  E65B  DF              RST   3
3142  E65C  E1              POP   H
3143  E65D  CF              RST   1
3144  E65E  219910          LXI   H,TEMP2
3145  E661  E5              PUSH  H
3146  E662  E7              RST   4
3147  E663  E1              POP   H
3148  E664  DF              RST   3
3149  E665  E1              POP   H
3150  E666  D7              RST   2
3151  E667  E1              POP   H
3152  E668  CD742C          CALL  SB
3153  E66B  219510          LXI   H,TEMP
3154  E66E  E5              PUSH  H
3155  E66F  DF              RST   3
3156  E670  E1              POP   H
3157  E671  CF              RST   1
3158  E672  216310          LXI   H,TEMP3
3159  E675  E7              RST   4
3160  E676  219910          LXI   H,TEMP2
3161  E679  E5              PUSH  H
3162  E67A  E5              PUSH  H
3163  E67B  CD5B0C          CALL  DIV
3164  E67E  E1              POP   H       ;TEMP2
3165  E67F  DF              RST   3
3166  E680  21DD0E          LXI   H,FONE
3167  E683  D7              RST   2
3168  E684  E1              POP   H
3169  E685  CD5B0C          CALL  DIV
3170  E688  CDA0F6          CALL  TST01
3171  E68B  CD9B0F          CALL  VFIX
3172  E68E  EB      BAK63:  XCHG
3173  E68F  2A9E10          LHLD  RLCTR
3174  E692  73              MOV   M,E
3175  E693  23              INX   H
3176  E694  72              MOV   M,D
3177  E695  23              INX   H
3178  E696  229E10          SHLD  RLCTR
3179  E699  2AAA10          LHLD  STOCR
3180  E69C  CDD0E6          CALL  R500
3181  E69F  C9              RET
3182  E6A0  FE93    TST01:  CPI   93H
3183  E6A2  D2C6E6          JNC   OVRFO   ;OUT OF RANGE
3184  E6A5  21BD0E          LXI   H,FTEN
3185  E6A8  CF              RST   1
3186  E6A9  FE8F            CPI   8FH
3187  E6AB  D8              RC            ;X10 OK
3188  E6AC  21BD0E          LXI   H,FTEN
3189  E6AF  E5              PUSH  H
3190  E6B0  CD5B0C          CALL  DIV     ;NORM
3191  E6B3  F1              POP   H
3192  E6B4  CD5B0C          CALL  DIV     ;1/10
3193  E6B7  CD9B0F          CALL  VFIX
3194  E6BA  EB              XCHG
3195  E6BB  E1              POP   H
3196  E6BC  7D              MOV   A,L
3197  E6BD  C603            ADI   3
3198  E6BF  6F              MOV   L,A
3199  E6C0  E5              PUSH  H
3200  E6C1  EB              XCHG
3201  E6C2  CDFBE4          CALL  BNPOS
3202  E6C5  C9              RET
3203  E6C6  E1      OVRFO:  POP   H       ;RET ADDRESS
3204  E6C7  010300          LXI   B,3
3205  E6CA  09              DAD   B       ;CALC NEW ADRS
3206  E6CB  E5              PUSH  H
3207  E6CC  210130          LXI   H,3001H
3208  E6CF  C9              RET
3209  E6D0  E5      R500:   PUSH  H       ;STOCR
3210  E6D1  CD6E7           CALL  LOTAB
3211  E6D4  21AE10          LXI   H,AVEL
3212  E6D7  E5              PUSH  H
3213  E6D8  E7              RST   4       ;ADD
3214  E6D9  E1              POP   H       ;AVEL
```

```
3215 E6DA DF                 RST    3           ;STORE
3216 E6DB E1                 POP    H           ;STOCR
3217 E6DC 23                 INX    H           ;NEXT
3218 E6DD E5                 PUSH   H
3219 E6DE CD06E7             CALL   LOTAB
3220 E6E1 213A10             LXI    H,AVEL2
3221 E6E4 E5                 PUSH   H           ;AVEL2
3222 E6E5 E7                 RST    4
3223 E6E6 E1                 POP    H
3224 E6E7 DF                 RST    3           ;+
3225 E6E8 E1                 POP    H           ;STOCR
3226 E6E9 23                 INX    H
3227 E6EA E5                 PUSH   H
3228 E6EB CD06E7             CALL   LOTAB
3229 E6EE 213E10             LXI    H,AVEL3
3230 E6F1 E5                 PUSH   H
3231 E6F2 E7                 RST    4
3232 E6F3 E1                 POP    H
3233 E6F4 DF                 RST    3           ;+
3234 E6F5 E1                 POP    H           ;STOCR
3235 E6F6 23                 INX    H
3236 E6F7 22AA10             SHLD   STOCR
3237 E6FA 219910             LXI    H,TEMP2
3238 E6FD D7                 RST    2
3239 E6FE 214210             LXI    H,AVEL4
3240 E701 E5                 PUSH   H
3241 E702 E7                 RST    4           ;+
3242 E703 E1                 POP    H
3243 E704 DF                 RST    3
3244 E705 C9                 RET
3245 E706 6E       LOTAB:    MOV    L,M
3246 E707 AF                 XRA    A
3247 E708 67                 MOV    H,A
3248 E709 CDBB0F             CALL   CONFL
3249 E70C CDEA2F             CALL   LADC
3250 E70F 219910             LXI    H,TEMP2     ;DATA
3251 E712 CF                 RST    1           ;X
3252 E713 219510             LXI    H,TEMP
3253 E716 E5                 PUSH   H
3254 E717 DF                 RST    3
3255 E718 21FF00             LXI    H,0FFH
3256 E71B CDBB0F             CALL   CONFL
3257 E71E 216310             LXI    H,TEMP3
3258 E721 DF                 RST    3
3259 E722 E1                 POP    H
3260 E723 D7                 RST    2           ;LOD
3261 E724 216310             LXI    H,TEMP3
3262 E727 CD5330             CALL   DIV         ;CURVE X DATA/255
3263 E72A C9                 RET
3264 E72B 214310   ESTRT:    LXI    H,ALTRM
3265 E72E CB36               RES3   M,6
3266 E730 3E09               MVI    A,09
3267 E732 3200C0             STA    ANGRG
3268 E735 210100   EWAIT:    LXI    H,ADSRT
3269 E738 CB56               BIT    M,2         ;IS OUT RELAY ON
3270 E73A 23F8               JRZ    EWAIT       ;WAIT
3271 E73C 3E0B               MVI    A,0BH
3272 E73E 3200C0             STA    ANGRG       ;HOLD ON LOW
3273 E741 3A2410             LDA    OUTRM
3274 E744 CB97               RES3   A,2
3275 E745 CBCF               SETB   A,1
3276 E748 CBC7               SETB   A,2
3277 E74A 322410             STA    OUTRM
3278 E74D 321232             STA    OUTPL
3279 E750 C9                 RET
3280 E751 8464CCDD CURV1:    DB     84H,64H,0CCH,0DDH          ;143
3281 E755 34433333 CURV2:    DB     34H,43H,33H,33H ;122
3282 E759 822CCCCD CURV3:    DB     82H,2CH,0CCH,0CDH          ;77
3283 E75D 000003   TABLS:    DB     0,0,3       ;3800
3284 E760 000012             DB     0,0,18      ;3700
3285 E763 000020             DB     0,0,32      ;3600
3286 E766 000047             DB     0,0,71      ;3500
3287 E769 000080   TABLA:    DB     0,0,128     ;3400
3288 E76C 0100C9             DB     1,0,201     ;3300
3289 E76F 0100F6             DB     1,0,246 ;
```

```
3290  E772 0100F2                DB     1,0,242  ;3100
3291  E775 0200FA   TABLE:       DB     2,0,250  ;3000
3292  E778 0200FD                DB     2,0,253  ;2900
3293  E77B 0300FF                DB     3,0,255  ;2800
3294  E77E 0400FF                DB     4,0,255  ;2700
3295  E781 0800FF   TABL1:       DB     8,0,255  ;2600
3296  E784 0D00FD   TABL2:       DB     13,0,253       ;2500
3297  E787 1400ED                DB     20,0,237       ;2400
3298  E78A 2100D4                DB     33,0,212       ;2300
3299  E78D 3600B0                DB     54,0,128       ;2200
3300  E790 570033                DB     87,0,51  ;2100
3301  E793 730013                DB     115,0,19       ;2000
3302  E796 99000A                DB     153,0,10       ;1900
3303  E799 B50006                DB     181,0,6  ;1800
3304  E79C DB0003                DB     219,0,3  ;1700
3305  E79F F00002                DB     240,0,2  ;1600
3306  E7A2 FA0001                DB     250,0,1  ;1500
3307  E7A5 FC0001                DB     252,0,1  ;1400
3308  E7A8 FE0100                DB     254,1,0  ;1300
3309  E7AB FF0100                DB     255,1,0  ;1200
3310  E7AE FF0200                DB     255,2,0  ;1100
3311  E7B1 FF0300   TABL3:       DB     255,3,0  ;1000
3312  E7B4 FA0500                DB     250,5,0  ;900
3313  E7B7 F70C00                DB     247,12,0       ;800
3314  E7BA E51400                DB     229,20,0       ;700
3315  E7BD 9E2400                DB     158,36,0       ;600
3316  E7C0 598000                DB     89,128,0       ;500
3317  E7C3 0DF200                DB     13,242,0       ;400
3318  E7C6 03CC00                DB     3,204,0  ;300
3319  E7C9 022200                DB     2,34,0   ;200HZ
3320  E7CC 010200                DB     1,2,0    ;100HZ
3321  E7CF                       ;///////////////////////////////////
3322  E7CF                       ;1ST=ERL,SRLLO,SRLHI
3323  E7CF                       ;///////////////////////////////////
3324  E7CF 3A2410   ERANGE:      LDA    OUTRM    ;BINIM
3325  E7D2 CB4F                  BIT    A,1
3326  E7D4 2046                  JRNZ   EX1
3327  E7D6 CD632A                CALL   RCOND
3328  E7D9 112C01                LXI    D,12CH
3329  E7DC ED52                  DSBC   D
3330  E7DE 302A                  JRNC   SETEA
3331  E7E0 2A0910                LHLD   BINRL
3332  E7E3 CD632A                CALL   RCOND
3333  E7E6 112C01                LXI    D,12CH
3334  E7E9 ED52                  DSBC   D
3335  E7EB 301D                  JRNC   SETEA
3336  E7ED 212410                LXI    H,OUTRM
3337  E7F0 CB9E                  RESB   M,2
3338  E7F2 CBCE                  SETB   M,1
3339  E7F4 214010                LXI    H,ALTRM
3340  E7F7 CBBE                  RESB   M,6
3341  E7F9 3E2B                  MVI    A,2BH
3342  E7FB 3200C0                STA    ANGR3
3343  E7FE E1                    POP    H        ;CORRECT STACK
3344  E7FF 0620                  MVI    B,20H
3345  E801 CDAFE4                CALL   SEC1L
3346  E804 210100                LXI    H,ADSRT
3347  E807 C303E5                JMP    WAIT2
3348  E80A 212410   SETEA:       LXI    H,OUTRM
3349  E80D CBD6                  SETB   M,2
3350  E80F CB8E                  RESB   M,1
3351  E811 214010                LXI    H,ALTRM
3352  E814 CBF6                  SETB   M,6
3353  E816 3E27                  MVI    A,27
3354  E818 3200C0                STA    ANGR3
3355  E81B C9                    RET
3356  E81C CD632A   EX1:         CALL   RCOND
3357  E81F 119E0F                LXI    D,0F9EH
3358  E822 ED52                  DSBC   D
3359  E824 300D                  JRNC   UPRNG
3360  E826 2A0910                LHLD   BINRL
3361  E829 CD632A                CALL   RCOND
3362  E82C 119E0F                LXI    D,0F9EH
3363  E82F ED52                  DSBC   D
3364  E831 3B1D                  JRC    SETE1
```

```
3365 E833 212410    UPRNG:   LXI   H,OUTRM
3366 E836 CBD6               SETB  M,2
3367 E838 CB8E               RESB  M,1
3368 E83A 214010             LXI   H,ALTRM
3369 E83D CBB6               RESB  M,6
3370 E83F 3E07               MVI   A,27
3371 E841 320002             STA   ANGRG
3372 E844 E1                 POP   H         ;CORRECT STACK
3373 E845 0620               MVI   B,22H
3374 E847 CDAFE4             CALL  SEC1H
3375 E84A 2101C0             LXI   H,ADSRT
3376 E84D C3C0E5             JMP   WAIT2
3377 E850 212410    SETE1:   LXI   H,OUTRM
3378 E853 CB96               RESB  M,2
3379 E855 CBCE               SETB  M,1
3380 E857 214010             LXI   H,ALTRM
3381 E85A CBF6               SETB  M,6
3382 E85C 3E0B               MVI   A,0BH
3383 E85E 320002             STA   ANGRG
3384 E861 C9                 RET
3385 E862 216C10    P529:    LXI   H,SWMO
3386 E865 CBF6               SETB  M,6
3387 E867 E5                 PUSH  H
3388 E868 C3EE27             JMP   PROG
3389 E86B E5        CKSKP:   PUSH  H
3390 E86C 11232A             LXI   D,2A23    ;EZ
3391 E86F AF                 XRA   A
3392 E870 ED52               DSBC  D
3393 E872 E1                 POP   H
3394 E873 2004               JRNZ  F2500
3395 E875 210409             LXI   H,2500    ;HZ,TWICE
3396 E878 C9                 RET
3397 E879 E5        F2500:   PUSH  H
3398 E87A 110409             LXI   D,2500
3399 E87D AF                 XRA   A
3400 E87E ED52               DSBC  D
3401 E880 E1                 POP   H
3402 E881 C0                 RNZ
3403 E882 EB                 XCHG
3404 E883 CDB32F             CALL  CONFL
3405 E886 215110             LXI   H,FLIFR
3406 E889 DF                 RST   3
3407 E88A 2AAA10             LHLD  STOCR
3408 E88D 23                 INX   H
3409 E88E 23                 INX   H
3410 E88F 23                 INX   H
3411 E890 22AA10             SHLD  STOCR
3412 E893 2AA010             LHLD  RMCTR
3413 E896 23                 INX   H
3414 E897 23                 INX   H
3415 E898 23                 INX   H
3416 E899 23                 INX   H
3417 E89A 22A010             SHLD  RMCTR
3418 E89D 2A9E10             LHLD  RLCTR
3419 E8A0 23                 INX   H
3420 E8A1 23                 INX   H
3421 E8A2 229E10             SHLD  RLCTR
3422 E8A5 210409             LXI   H,2500
3423 E8A8 228710             SHLD  FRBIN
3424 E8AB 2101C0             LXI   H,ADSRT   ;FOR WAIT
3425 E8AE D1                 POP   D
3426 E8AF C3C0E5             JMP   WAIT2
3427 E8B2 2A1C20    QUAD:    LHLD  RTR24
3428 E8B5 CDF7E9             CALL  TST02     ;CONVT & SCALE
3429 E8B8 214D10             LXI   H,FLZ     ;TEMP
3430 E8BB E5                 PUSH  H
3431 E8BC E5                 PUSH  H
3432 E8BD E5                 PUSH  H
3433 E8BE DF                 RST   3         ;STORE
3434 E8BF 2A1620             LHLD  RTR27
3435 E8C2 CDF7E9             CALL  TST02
3436 E8C5 E1                 POP   H
3437 E8C6 CD740C             CALL  S3
3438 E8C9 2132E1             LXI   H,FLT3
3439 E8CC CD5B0C             CALL  DIV
```

```
3440 E8CF E1                    POP    H
3441 E8D2 DF                    RST    3
3442 E8D1 2A1A20                LHLD   RTR25
3443 E8D4 CDF7E9                CALL   TST22
3444 E8D7 E1                    POP    H
3445 E8D8 E7                    RST    4        ;ADD
3446 E8D9 219910                LXI    H,TEMP2
3447 E8DC E5                    PUSH   H
3448 E8DD E5                    PUSH   H
3449 E8DE DF                    RST    3
3450 E8DF CDA0E6                CALL   TST21
3451 E8E2 CD9B0F                CALL   VFIX
3452 E8E5 221820                SHLD   RTR25
3453 E8E8 21DD2E                LXI    H,FONE
3454 E8EB D7                    RST    2        ;LOD
3455 E8EC E1                    POP    H
3456 E8ED CD530C                CALL   DIV      ;1/BINVALUE
3457 E8F0 CDFD0B                CALL   ABS
3458 E8F3 E1                    POP    H
3459 E8F4 DF                    RST    3
3460 E8F5 2181E7                LXI    H,TABL1  ;2600
3461 E8F8 CDD0E6                CALL   R520
3462 E8FB C9                    RET
3463 E8FC CDA4E0      P505:     CALL   COMM1
3464 E8FF C3C6                  SETB   M,?
3465 E901 CD3AE4                CALL   ECHOR
3466 E904 CD1FEA                CALL   SRCH
3467 E907 CD83EA                CALL   DIRCT
3468 E90A CD6FE9                CALL   CALCA
3469 E90D CD88E9                CALL   CALCB
3470 E910 CD9DE9                CALL   CALCX
3471 E913 CDB3E9                CALL   CALCY
3472 E916 CDDEEA                CALL   FFLOW
3473 E919 CDB6EA                CALL   FFMIN
3474 E91C 2123E1      D505:     LXI    H,MSPL
3475 E91F CD20E3                CALL   XFER2
3476 E922 21A6E3                LXI    H,ASPL
3477 E925 CD29E3                CALL   XFER3
3478 E928 2AE320                LHLD   BNSPL
3479 E92B CDF6E3                CALL   EDSPL
3480 E92E CD62E9                CALL   PFOUT
3481 E931 ED5BE620              LDED   BNFRQ
3482 E935 EF                    RST    5
3483 E936 212410                LXI    H,OUTRM
3484 E939 CBC6                  SETB   M,0
3485 E93B 23                    INX    H
3486 E93C EB                    XCHG
3487 E93D CDC604                CALL   BINBC
3488 E940 F7                    RST    6        ;UPDATE
3489 E941 CDADE4                CALL   SEC1D
3490 E944 CDADE4                CALL   SEC1D
3491 E947 AF                    XRA    A
3492 E948 32EA20                STA    RMDIR
3493 E94B 210210                LXI    H,PBIN1
3494 E94E 3E05                  MVI    A,5
3495 E950 77                    MOV    M,A
3496 E951 23                    INX    H
3497 E952 AF                    XRA    A
3498 E953 77                    MOV    M,A
3499 E954 23                    INX    H
3500 E955 3E05                  MVI    A,5
3501 E957 77                    MOV    M,A
3502 E958 23                    INX    H
3503 E959 CD12E3                CALL   SPUP
3504 E95C C2FCE8                JNZ    P505
3505 E95F FF                    RST    7
3506 E960 3A6C10      PFOUT:    LDA    SWMO
3507 E963 C367                  BIT    A,4
3508 E965 C8                    RZ
3509 E966 0E20                  MVI    C,20H
3510 E968 CDFAEC                CALL   PROUT
3511 E96B CD5FEB                CALL   TYFRQ
3512 E96E C9                    RET
3513 E96F 219510      CALCA:    LXI    H,TEMP
3514 E972 D7                    RST    2        ;STORE Y1
```

```
3515 E973 216310            LXI    H,TEMP3    ;Y3
3516 E976 E7                RST    4          ;+
3517 E977 216222            LXI    H,FTWO
3518 E97A CD5B2C            CALL   DIV
3519 E97D 215712            LXI    H,FLTIR
3520 E980 CD740C            CALL   SB
3521 E983 21EB20            LXI    H,FLTA
3522 E986 DF                RST    3
3523 E987 C9                RET
3524 E988 216310   CALCB:   LXI    H,TEMP3
3525 E98B D7                RST    2          ;LOD Y3
3526 E98C 219510            LXI    H,TEMP     ;Y1
3527 E98F CD740C            CALL   SB
3528 E992 216202            LXI    H,FTWO
3529 E995 CD5B2C            CALL   DIV
3530 E998 21EF20            LXI    H,FLTP
3531 E99B DF                RST    3
3532 E99C C9                RET
3533 E99D 21EF20   CALCX:   LXI    H,FLTB
3534 E9A0 D7                RST    2
3535 E9A1 CDFD2F            CALL   ABS
3536 E9A4 CDFA0B            CALL   CHS
3537 E9A7 21EB20            LXI    H,FLTA
3538 E9AA CD5B2C            CALL   DIV
3539 E9AD 216200            LXI    H,FTWO
3540 E9B0 CD5B2C            CALL   DIV
3541 E9B3 21F320            LXI    H,FLTXM
3542 E9B6 DF                RST    3
3543 E9B7 C9                RET
3544 E9B8 21F320   CALCY:   LXI    H,FLTXM
3545 E9BB E5                PUSH   H
3546 E9BC E5                PUSH   H
3547 E9BD D7                RST    2
3548 E9BE E1                POP    H
3549 E9BF CF                RST    1          ;XXX
3550 E9C0 21EB20            LXI    H,FLTA
3551 E9C3 CF                RST    1          ;AX:X
3552 E9C4 215F10            LXI    H,FLTRF
3553 E9C7 DF                RST    3          ;STORE AY X
3554 E9C8 21EF20            LXI    H,FLTB
3555 E9CB D7                RST    2
3556 E9CC E1                POP    H
3557 E9CD CF                RST    1          ;B:X
3558 E9CE 215F10            LXI    H,FLTRF
3559 E9D1 E7                RST    4          ;AX:X+B:X
3560 E9D2 215712            LXI    H,FLTIR
3561 E9D5 E7                RST    4          ;AX:X+BX+C
3562 E9D6 21051A            LXI    H,TEMP
3563 E9D9 E5       YOUTL:   PUSH   H
3564 E9DA DF                RST    3
3565 E9DB CB7F               BIT    A,7
3566 E9DD CAEFE9            JZ     BNZRO
3567 E9E0 21DD2E            LXI    H,FONE
3568 E9E3 D7                RST    2
3569 E9E4 E1                POP    H
3570 E9E5 CD5B2C            CALL   DIV
3571 E9E8 CD0A2B            CALL   LOUT
3572 E9EB 22E820            SHLD   BNSPL
3573 E9EE C9                RET
3574 E9EF E1       BNZRO:   POP    H          ;CORRECT
3575 E9F0 210000            LXI    H,0
3576 E9F3 22E820            SHLD   BNSPL
3577 E9F6 C9                RET
3578 E9F7 E5       TST22:   PUSH   H
3579 E9F8 EB                XCHG
3580 E9F9 210130            LXI    H,3001E
3581 E9FC AF                XRA    A
3582 E9FD ED52              DSBC   D
3583 E9FF 2318              JRZ    TOBIG
3584 EA01 EB                XCHG
3585 EA02 CDBB0F            CALL   CONFL
3586 EA05 CDEA0F            CALL   LADC
3587 EA08 E1                POP    H
3588 EA09 CB7F              BIT    A,7
3589 EA0B 213D2E            LXI    H,FTEN
```

```
3590 EA0E 2004              JRNZ   TX10
3591 EA10 CD5B0C            CALL   DIV
3592 EA13 C9                RET
3593 EA14 CF        TX10:   RST    1
3594 EA15 CDFD0B            CALL   ABS
3595 EA18 C9                RET
3596 EA19 E1        TOBIG:  POP    H
3597 EA1A 211B00            LXI    H,FLIT9
3598 EA1D D7                RST    2
3599 EA1E C9                RET
3600 EA1F 2A0020    SRCH:   LHLD   RTNRM
3601 EA22 CDF7E9            CALL   TST02
3602 EA25 215710            LXI    H,FLTIR  ;LOWEST
3603 EA28 DF                RST    3
3604 EA29 210020            LXI    H,RTNRM  ;START
3605 EA2C 22E620            SHLD   BNFRQ
3606 EA2F 0E25              MVI    B,37
3607 EA31 C5        SRCHL:  PUSH   B
3608 EA32 5E                MOV    E,M      ;LOW BYTE
3609 EA33 23                INX    H
3610 EA34 56                MOV    D,M      ;HIGH BYTE
3611 EA35 E5                PUSH   H        ;ADDRESS
3612 EA36 EB                XCHG            ;DATA    IN H
3613 EA37 CDF7E9            CALL   TST02
3614 EA3A 219910            LXI    H,TEMP2
3615 EA3D DF                RST    3
3616 EA3E 215710            LXI    H,FLTIR
3617 EA41 CD740C            CALL   SB
3618 EA44 E1                POP    H        ;ADDRESS
3619 EA45 FC73EA            CM     NEWL
3620 EA48 23                INX    H        ;NEXT
3621 EA49 C1                POP    B
3622 EA4A 10E5              DJNZ   SRCHL
3623 EA4C ED5BE620          LDED   BNFRQ
3624 EA50 210020            LXI    H,RTNRM
3625 EA53 AF                XRA    A
3626 EA54 ED52              DSBC   D
3627 EA56 CA63EA            JZ     ENDCK
3628 EA59 214820            LXI    H,RTR02
3629 EA5C AF                XRA    A
3630 EA5D ED52              DSBC   D
3631 EA5F CA63EA            JZ     ENDCK
3632 EA62 C9                RET
3633 EA63 E1        ENDCK:  POP    H        ;OLD RET ADRS
3634 EA64 215710            LXI    H,FLTIR
3635 EA67 E5                PUSH   H
3636 EA68 D7                RST    2
3637 EA69 E1                POP    H
3638 EA6A CDD9E9            CALL   YOUTL
3639 EA6D CDDEEA            CALL   FFLOW
3640 EA72 C31CE9            JMP    D525     ;OUT
3641 EA73 2B        NEWL:   DCX    H        ;BACK
3642 EA74 22E620            SHLD   BNFRQ
3643 EA77 23                INX    H
3644 EA78 E5                PUSH   H
3645 EA79 219910            LXI    H,TEMP2
3646 EA7C D7                RST    2
3647 EA7D 215710            LXI    H,FLTIR
3648 EA80 DF                RST    3
3649 EA81 E1                POP    H
3650 EA82 C9                RET
3651 EA83 2AE620    DIRCT:  LHLD   BNFRQ
3652 EA86 E5                PUSH   H
3653 EA87 23                INX    H
3654 EA88 23                INX    H        ;NEXT LOWER FR DATA
3655 EA89 5E                MOV    E,M
3656 EA8A 23                INX    H
3657 EA8B 56                MOV    D,M
3658 EA8C E1                POP    H        ;START
3659 EA8D D5                PUSH   D        ;SAVE DATA
3660 EA8E 2B                DCX    H
3661 EA8F 56                MOV    D,M
3662 EA90 2B                DCX    H
3663 EA91 5E                MOV    E,M
3664 EA92 E1                POP    H        ;HIGH FR VALUE
```

```
3665 EA93 E5              PUSH    H
3666 EA94 AF              XRA     A
3667 EA95 ED52            DSBC    D
3668 EA97 E1              POP     H
3669 EA98 D4ACEA          CNC     REVCL
3670 EA9B D5              PUSH    D
3671 EA9C CDF7E9          CALL    TST32
3672 EA9F 219512          LXI     H,TEMP
3673 EAA2 DF              RST     3           ;LOW
3674 EAA3 E1              POP     H
3675 EAA4 CDF7E9          CALL    TST32
3676 EAA7 216312          LXI     H,TEMP3
3677 EAAA DF              RST     3           ;HIGH
3678 EAAB C9              RET
3679 EAAC EB      REVCL:  XCHG
3680 EAAD 3AEA20          LDA     RMDIR
3681 EAB0 CBC7            SETB    A,0
3682 EAB2 32EA20          STA     RMDIR
3683 EAB5 C9              RET
3684 EAB6 2A3610  FFMIN:  LHLD    STEPS
3685 EAB9 CDBB2F          CALL    CONFL
3686 EABC CDEA0F          CALL    LADC
3687 EABF 21F320          LXI     H,FLTYM
3688 EAC2 CF              RST     1
3689 EAC3 3AEA20          LDA     RMDIR
3690 EAC6 CB47            BIT     A,0
3691 EAC8 215110          LXI     H,FLTFR
3692 EACB E5              PUSH    H
3693 EACC C2DBEA          JNZ     ADDF
3694 EACF CD742C          CALL    SB
3695 EAD2 E1      SBF:    POP     H
3696 EAD3 DF              RST     3
3697 EAD4 CD9B0F          CALL    VFIX
3698 EAD7 22E620          SHLD    BNFRQ
3699 EADA C9              RET
3700 EADB E7      ADDF:   RST     4
3701 EADC 18F4            JMPR    SBF
3702 EADE 214C20  FFLOW:  LXI     H,DRAM
3703 EAE1 ED5BE620        LDED    BNFRQ
3704 EAE5 AF              XRA     A
3705 EAE6 ED52            DSBC    D
3706 EAE8 CDBB2F          CALL    CONFL
3707 EAEB CDEA0F          CALL    LADC
3708 EAEE 216220          LXI     H,FTWO
3709 EAF1 CD5B2C          CALL    DIV
3710 EAF4 21BD2E          LXI     H,FTEN
3711 EAF7 E5              PUSH    H
3712 EAF8 CF              RST     1
3713 EAF9 E1              POP     H
3714 EAFA CF              RST     1
3715 EAFB 215110          LXI     H,FLTFR
3716 EAFE DF              RST     3
3717 EAFF CD9B0F          CALL    VFIX
3718 EB02 22E620          SHLD    BNFRQ
3719 EB05 C9              RET
3720 EB06                 LIST
3721 EB06                 ;////////////////////////////////////
3722 EB06 3E81    P950:   MVI     A,81H
3723 EB08 323810          STA     PRINT
3724 EB0B CD51ED          CALL    INLPR
3725 EB0E AF              XRA     A
3726 EB0F 322D10          STA     STATS
3727 EB12 320010          STA     ENTER       ;CLEARS MODES
3728 EB15 216C10          LXI     H,SWM0
3729 EB18 CBE6            SETB    M,4
3730 EB1A CB46            BIT     M,0         ;? WHICH RANGE
3731 EB1C C20FEC          JNZ     A950
3732 EB1F 063E            MVI     B,3EH
3733 EB21 2113ED          LXI     H,S9NON
3734 EB24 CD09ED          CALL    MSGOT
3735 EB27 C38CEB          JMP     0950
3736 EB2A CDCF21  D950Z:  CALL    KDENC
3737 EB2D CD4F04          CALL    STOP
3738 EB30 216C10          LXI     H,SWM0
3739 EB33 C346            BIT     M,0
```

```
3740 EB35 C222EC           JNZ    D952L
3741 EB38 CD9DEB           CALL   CLRF      ;SET UP
3742 EB3B CDEFEB           CALL   TYFRQ
3743 EB3E 214110           LXI    H,FLTRL
3744 EB41 CD96EB           CALL   SCALD
3745 EB44 CDAEEB           CALL   TYZOT
3746 EB47 0E20             MVI    C,20H
3747 EB49 CDFAEC           CALL   PROUT
3748 EB4C 214510           LXI    H,FLTIM
3749 EB4F CD96EB           CALL   SCALD
3750 EB52 E5               PUSH   H
3751 EB53 CDAEEB           CALL   TYZOT
3752 EB56 214D10           LXI    H,FLZ
3753 EB59 CD96EB           CALL   SCALD
3754 EB5C CDAEEB           CALL   TYZOT
3755 EB5F 3E05             MVI    A,5
3756 EB61 321830           STA    FIELD
3757 EB64 3E01             MVI    A,01
3758 EB66 321930           STA    FRAC
3759 EB69 E1               POP    H
3760 EB6A D7               RST    2
3761 EB6B CD650C           CALL   TST
3762 EB6E 218310           LXI    H,FLTPE
3763 EB71 FAA8EB           JM     NEGDG
3764 EB74 D7               RST    2
3765 EB75 CD1BEF  BNEGP:   CALL   TYOUT
3766 EB78 0E20             MVI    C,20H
3767 EB7A CDFAEC           CALL   PROUT
3768 EB7D 0E44             MVI    C,44H
3769 EB7F CDFAEC           CALL   PROUT
3770 EB82 0E45             MVI    C,45H
3771 EB84 CDFAEC           CALL   PROUT
3772 EB87 0E47             MVI    C,47H
3773 EB89 CDFAEC           CALL   PROUT
3774 EB8C CD9DEB  0952:    CALL   CLRF
3775 EB8F ED5B0710         LDED   FRBIN
3776 EB93 C3A002           JMP    OUT2      ;BACK TO OLD TESTS
3777 EB96 E5      SCALD:   PUSH   H
3778 EB97 D7               RST    2
3779 EB98 CD2A03           CALL   SCALE
3780 EB9B E1               POP    H
3781 EB9C C9               RET
3782 EB9D 0E0D    CLRF:    MVI    C,0DH
3783 EB9F CDFAEC           CALL   PROUT
3784 EBA2 0E0A             MVI    C,0AH
3785 EBA4 CDFAEC           CALL   PROUT
3786 EBA7 C9               RET
3787 EBA8 D7      NEGDG:   RST    2
3788 EBA9 CDFA3B           CALL   CHS       ;-
3789 EBAC 18C7             JMPR   BNEGP
3790 EBAE 219510  TYZOT:   LXI    H,TEMP
3791 EBB1 E5               PUSH   H
3792 EBB2 DF               RST    3
3793 EBB3 3E06             MVI    A,06
3794 EBB5 321830           STA    FIELD
3795 EBB8 3E03             MVI    A,3
3796 EBBA 321930           STA    FRAC
3797 EBBD 212410           LXI    H,OUTRM
3798 EBC0 CB4E             BIT    M,1
3799 EBC2 CCE9EB           CZ     RLOWO
3800 EBC5 E1               POP    H
3801 EBC6 D7               RST    2
3802 EBC7 21BD0E           LXI    H,FTEN
3803 EBCA E5               PUSH   H
3804 EBCB E5               PUSH   H
3805 EBCC CD5B0C           CALL   DIV
3806 EBCF E1               POP    H
3807 EBD0 CD5B0C           CALL   DIV
3808 EBD3 E1               POP    H
3809 EBD4 CD5B0C           CALL   DIV       ;NOW IN F OHMS
3810 EBD7 CD1BEF           CALL   TYOUT
3811 EBDA 0E43             MVI    C,43H
3812 EBDC CDFAEC           CALL   PROUT
3813 EBDF 0603             MVI    B,3
3814 EBE1 0E20    THRSP:   MVI    C,20H
```

```
3815 EBE3 CDFAEC           CALL    PROUT
3816 EBE6 10F9             DJNZ    THRSP
3817 EBE8 C9               RET
3818 EBE9 3E02      RLOW0: MVI     A,2
3819 EBEB 3219B0           STA     FRAC
3820 EBEE C9               RET
3821 EBEF 3E07      TYFRQ: MVI     A,7
3822 EBF1 3218B0           STA     FIELD
3823 EBF4 AF               XRA     A
3824 EBF5 3219B0           STA     FRAC
3825 EBF8 215110           LXI     H,FLTFR
3826 EBFB D7               RST     2           ;LOD
3827 EBFC CD1BEF           CALL    TYOUT
3828 EBFF 3E48             MVI     C,48H       ;H
3829 EC01 CDFAEC           CALL    PROUT
3830 EC04 0E5A             MVI     C,5AH       ;Z
3831 EC06 CDFAEC           CALL    PROUT
3832 EC09 0E20             MVI     C,20H
3833 EC0B CDFAEC           CALL    PROUT
3834 EC0E C9               RET
3835 EC0F 061A      A950:  MVI     B,26
3836 EC11 2113ED           LXI     H,SGNON
3837 EC14 CD09ED           CALL    MSGOT
3838 EC17 0626             MVI     B,38
3839 EC19 21D4EC           LXI     H,SGNNA
3840 EC1C CD09ED           CALL    MSGOT
3841 EC1F C38CEB           JMP     0950
3842 EC22 CD9DEF   D950L:  CALL    CLRF
3843 EC25 CDEFEB           CALL    TYFRQ
3844 EC28 0602             MVI     B,2
3845 EC2A CDCCEC           CALL    SPCES
3846 EC2D 0E50             MVI     C,'P'
3847 EC2F CDFAEC           CALL    PROUT
3848 EC32 216910           LXI     H,1069H     ;CODER+1
3849 EC35 0603             MVI     B,3
3850 EC37 7E        LCDR:  MOV     A,M
3851 EC38 C630             ADI     30H
3852 EC3A 4F               MOV     C,A
3853 EC3B 23               INX     H
3854 EC3C E5               PUSH    H
3855 EC3D CDFAEC           CALL    PROUT
3856 EC40 E1               POP     H
3857 EC41 10F4             DJNZ    LCDR
3858 EC43 2A5516           LHLD    RTNL0
3859 EC46 CD4CEC           CALL    RTLOT
3860 EC49 C38CEB           JMP     0950
3861 EC4C 225516   RTLOT:  SHLD    RTNL0
3862 EC4F 0602             MVI     B,2
3863 EC51 CDCCEC           CALL    SPCES
3864 EC54 3E05             MVI     A,5
3865 EC56 3218B0           STA     FIELD
3866 EC59 3E01             MVI     A,1
3867 EC5B 3219B0           STA     FRAC
3868 EC5E 2A5510           LHLD    RTNL0
3869 EC61 CDC5EC           CALL    BRGUP
3870 EC64 21FD0E           LXI     H,FTEN
3871 EC67 CD5BEC           CALL    DIV
3872 EC6A CD1BEF           CALL    TYOUT
3873 EC6D 0E20             MVI     C,20H
3874 EC6F CDFAEC           CALL    PROUT
3875 EC72 0E44             MVI     C,'D'
3876 EC74 CDFAEC           CALL    PROUT
3877 EC77 0E42             MVI     C,'B'
3878 EC79 CDFAEC           CALL    PROUT
3879 EC7C 3E07             MVI     A,7
3880 EC7E 3218B0           STA     FIELD
3881 EC81 AF               XRA     A
3882 EC82 3219B0           STA     FRAC
3883 EC85 3AEC10           LDA     SWMO
3884 EC88 C37F             BIT     A,7         ;96 MODE
3885 EC8A C2B1EC           JNZ     PRTEX
3886 EC8D 2A5B17           LHLD    RRAM
3887 EC90 CDC5EC           CALL    BRGUP
3888 EC93 CD1BEF           CALL    TYOUT
3889 EC96 0E20             MVI     C,20H
```

```
3890 EC98 CDFAEC              CALL   PROUT
3891 EC9B 2A5D10              LHLD   CRAM
3892 EC9E CDC5EC              CALL   BRGUP
3893 ECA1 CD1BEF              CALL   TYOUT
3894 ECA4 2A6D10              LHLD   CRAM2
3895 ECA7 CDC5EC              CALL   BRGUP
3896 ECAA CD1BEF              CALL   TYOUT
3897 ECAD CD9DEB              CALL   CLRF
3898 ECB0 C9                  RET
3899 ECB1 21BDEC    PRTEX:    LXI    H,DRTEX
3900 ECB4 0608                MVI    B,8
3901 ECB6 CD09ED              CALL   MSGOT
3902 ECB9 CD9DEB              CALL   CLRF
3903 ECBC C9                  RET
3904 ECBD 20455854  DRTEX:    DB     ' EXT NET'
     ECC1 204E4554
3905 ECC5 CDBB0F    BRGUP:    CALL   CONFL
3906 ECC8 CDEA0F              CALL   LADC
3907 ECCB C9                  RET
3908 ECCC 0E20      SPCES:    MVI    C,20H
3909 ECCE CDFAEC              CALL   PROUT
3910 ECD1 10F9                DJNZ   SPCES
3911 ECD3 C9                  RET
3912 ECD4 50524F47  SGNNA:    DB     'PROGRAM RTN LOSS'
     ECD8 52414D20
     ECDC 52544E20
     ECE0 4C4F5353
3913 ECE4 20523120            DB     ' R1 OHMS C2 NF '
     ECE8 4F484D53
     ECEC 20433220
     ECF0 4E4620
3914 ECF3 20433320            DB     ' C3 NF '
     ECF7 4E4620
3915 ECFA 21E1D0    PROUT:    LXI    H,CONST
3916 ECFD 7E                  MOV    A,M
3917 ECFE E681                ANI    81H
3918 ED00 FE81                CPI    81H
3919 ED02 20F6                JRNZ   PROUT
3920 ED04 21E0D0              LXI    H,CONOT ;READY OUT DATA
3921 ED07 71                  MOV    M,C
3922 ED08 C9                  RET
3923 ED09 4E        MSGOT:    MOV    C,M
3924 ED0A E5                  PUSH   H
3925 ED0B CDFAEC              CALL   PROUT   ;OUT IF READY
3926 ED0E E1                  POP    H
3927 ED0F 23                  INX    H
3928 ED10 10F7                DJNZ   MSGOT   ;ENTER B=# OF PASSES
3929 ED12 C9                  RET
3930 ED13 0D0A2057  SGNON:    DB     0DH,0AH,' WILCOM I306'
     ED17 494C434F
     ED1B 4D225433
     ED1F 3036
3931 ED21 0D0A                DB     0DH,0AH
3932 ED23 46524551            DB     'FREQUENCY RESISTANCE '
     ED27 55454E43
     ED2B 59205245
     ED2F 53495354
     ED33 414E4345
     ED37 20
3933 ED38 52454143            DB     'REACTANCE IMPEDANCE PHASE'
     ED3C 54414E43
     ED40 4520494D
     ED44 50454441
     ED48 4E434520
     ED4C 50484153
     ED50 45
3934 ED51 21E1D0    INLPR:    LXI    H,CONST
3935 ED54 AF                  XRA    A
3936 ED55 77                  MOV    M,A
3937 ED56 77                  MOV    M,A
3938 ED57 77                  MOV    M,A
3939 ED58 3E40                MVI    A,40H
3940 ED5A 77                  MOV    M,A
3941 ED5B 3E0E                MVI    A,0EH
3942 ED5D 77                  MOV    M,A
```

```
3943 ED5E 3E37               MVI     A,37H
3944 ED60 77                 MOV     M,A
3945 ED61 C9                 RET
3946 ED62      ED62    ROM   SET     $
3947 ED62                            ;3030 BINARY FLOATING POINT SYSTEM
3948 ED62                            ;FORMAT CONVERSION AND ARITHEMATIC UTILITIES
3949 ED62                    ;
3950 ED62
3951 ED62      B000          ORG     0B000H
3952 B000              PIVRM DS      4       ;HOLDS ASCII MSG
3953 B004
3954 B004              CNBF: DS      10      ;CONVERSION AREA BUFFER
3955 B00E              OUBF: DS      10      ;OUTPUT BUFFER AREA
3956 B018              FIELD: DS     1       ;FIELD WIDTH OF OUTPUT
3957 B019              FRAC:  DS     1       ;FRACTION LENGTH
3958 B01A              EXP:   DS     1       ;DECIMAL EXPONENT COUNT
3959 B01B              DEGIT: DS     1       ;NUMBER OF DIGITS IN CNBF LEFT
3960 B01C              IEXP:  DS     1;      E-FORMAT EXPONENT
3961 B01D              ADRL:  DS     1;      CHARACTER STRING WORD
3962 B01E              ADRH:  DS     1;      CHARACTER STRING BANK
3963 B01F              TMP1:  DS     1;      TEMPORARY STORAGE
3964 B020              TMP2:  DS     1       ;TEMPORARY STORAGE-1
3965 B021              TMP3:  DS     1;      TEMPORARY STORAGE
3966 B022              VALE:  DS     1;      VALUE EXPONENT
3967 B023              VAL1:  DS     1;      VALUE 1ST FRACTION
3968 B024              VAL2:  DS     1;      VALUE 2ND FRACTION
3969 B025              VAL3:  DS     1;      VALUE 3RD FRACTION
3970 B026              TMP4:  DS     1;      TEMPORY STORAGE
3971 B027              SAVE:  DS     4
3972 B02B              BUFFER: DS    16
3973 B03B      B03B    RAM   SET     $
3974 B03B
3975 B03B      ED62          ORG     ROM
3976 ED62
3977 ED62 EB         FLT:    MOV     L,E
3978 ED63 5A                 MOV     E,D
3979 ED64 51                 MOV     D,C
3980 ED65 48                 MOV     C,B
3981 ED66 47                 MOV     B,A
3982 ED67 7D                 MOV     A,L
3983 ED68 EE80               XRI     80H
3984 ED6A 218B10              LXI    H,ACCF
3985 ED6D 77                 MOV     M,A
3986 ED6E 23                 INX     H
3987 ED6F 3680               MVI     M,80H
3988 ED71 23                 INX     H
3989 ED72 78                 MOV     A,B
3990 ED73 A7                 ANA     A
3991 ED74 17                 RAL
3992 ED75 C36C0D             JMP     ADD10
3993 ED78 218B10      FIX:   LXI     H,ACCE
3994 ED7B 7E                 MOV     A,M
3995 ED7C A7                 ANA     A
3996 ED7D 2826               JRZ     FIX1
3997 ED7F 7B                 MOV     A,E
3998 ED80 C67F               ADI     7FH
3999 ED82 96                 SUB     M
4000 ED83 D8                 RC
4001 ED84 FE1F               CPI     1FH
4002 ED86 301D               JRNC    FIX1
4003 ED88 C601               ADI     1
4004 ED8A 218D10             LXI     H,ACC1
4005 ED8D 46                 MOV     B,M
4006 ED8E 23                 INX     H
4007 ED8F 4E                 MOV     C,M
4008 ED90 23                 INX     H
4009 ED91 56                 MOV     D,M
4010 ED92 CD690D             CALL    RSH
4011 ED95 218C10             LXI     H,ACCS
4012 ED98 7E                 MOV     A,M
4013 ED99 A7                 ANA     A
4014 ED9A F48D0D             CP      COMP
4015 ED9D 3E01               MVI     A,1
4016 ED9F B0                 ORA     B
4017 EDA0 78                 MOV     A,B
```

```
4018 EDA1 41              MOV     B,C
4019 EDA2 4A              MOV     C,D
4020 EDA3 53              MOV     D,E
4021 EDA4 C9              RET
4022 EDA5 AF     FIX1:    XRA     A
4023 EDA6 47              MOV     B,A
4024 EDA7 4F              MOV     C,A
4025 EDA8 57              MOV     D,A
4026 EDA9 C9              RET
4027 EDAA 7D     SVAD:    MOV     A,L
4028 EDAB 44              MOV     B,H
4029 EDAC 2E02             MVI    C,2
4030 EDAE 51              MOV     D,C
4031 EDAF 211DB0          LXI     H,ADRL
4032 EDB2 DF              RST     3
4033 EDB3 C9              RET
4034 EDB4 2A1DB0 CHAD:    LHLD    ADRL
4035 EDB7 23              INX     H
4036 EDB8 221DB0          SHLD    ADRL
4037 EDBB C9              RET
4038 EDBC 2122B0 OU:      LXI     H,VALE  ;SAVE FP REGISTER
4039 EDBF DF              RST     3
4040 EDC0 2104B0          LXI     H,CNBF  ;CONVERSION AREA BUFFER
4041 EDC3 222BB0          SHLD    BUFFER  ;BUFFER POINTER
4042 EDC6 211AB0          LXI     H,EXP   ;POINT TO DECIMAL EXP
4043 EDC9 3600            MVI     M,0     ;ZERO IT
4044 EDCB 23              INX     H       ;POINT TO DIGIT COUNT
4045 EDCC 3606            MVI     M,06    ;=6
4046 EDCE A7              ANA     A       ;TEST EXPONENT
4047 EDCF CA04EE          JZ      TESTZ   ;JMP IF ZERO
4048 EDD2 FE7E   TEST1:   CPI     7EH     ;COMPARE EXP WITH 7EH
4049 EDD4 213D0E          LXI     H,FTEN  ;POINTER TO 10.0
4050 EDD7 3007            JRNC    TEST2   ;<?,NO-CONDITION MET
4051 EDD9 CF              RST     1       ;TRUE
4052 EDDA 211AB0          LXI     H,EXP   ;DCR. EXP COUNT
4053 EDDD 35              DCR     M
4054 EDDE 18F2            JMPR    TEST1   ;CONTINUE
4055 EDE0 FE81   TEST2:   CPI     81H     ;COMPARE UPPER LIMIT
4056 EDE2 380C            JRC     TEST3   ;>81H
4057 EDE4 CD530C          CALL    DIV     ;YES
4058 EDE7 211AB0          LXI     H,EXP   ;INC. EXP
4059 EDEA 34              INR     M
4060 EDEB 21BD0E          LXI     H,FTEN  ;10.0
4061 EDEE 18F0            JMPR    TEST2   ;CONTINUE
4062 EDF0 CDFD0B TEST3:   CALL    ABS     ;TAKE ABSOLUTE VALUE
4063 EDF3 2117EF          LXI     H,RNDO  ;AND ROUND UP
4064 EDF6 E7              RST     4
4065 EDF7
4066 EDF7            ;**************ROUND UP ROUTINE******************
4067 EDF7            ;
4068 EDF7
4069 EDF7 3A1AB0          LDA     EXP     ;LOAD DECIMAL EXP
4070 EDFA 47              MOV     B,A
4071 EDFB 3A19B0          LDA     FRAC    ;EXP+FRAC
4072 EDFE 80              ADD     B
4073 EDFF
4074 EDFF            ;IF EXP+FRAC < 7 CONTINUE
4075 EDFF
4076 EDFF FE07            CPI     7
4077 EE01 301B            JRNC    TEST5   ;FINISHED IF >=7
4078 EE03 A7              ANA     A       ;CLEAR FLAGS
4079 EE04 17              RAL             ;MULT. BY 4
4080 EE05 17              RAL
4081 EE06 211B1E          LXI     H,TABLE ;OBTAIN TABLE INDEX
4082 EE09 85              ADD     L
4083 EE0A 6F              MOV     L,A
4084 EE0B 7C              MOV     A,H
4085 EE0C CE00            ACI     0
4086 EE0E 67              MOV     H,A     ;ADD FACTOR
4087 EE0F E7              RST     4
4088 EE10
4089 EE10            ;TEST THE EXPONENT FOR RANGE
4090 EE10            ;
4091 EE10
4092 EE10 21BD0E          LXI     H,FTEN  ;POINTER TO 10.0
```

```
4093 EE13 FE81              CPI     81H         ;TEST VALUE
4094 EE15 3807              JRC     TEST5       ;IF EXPON.<81H,DONE
4095 EE17 CD5B2C            CALL    DIV         ;OTHERWISE RECALE
4096 EE1A 211A30            LXI     H,EXP       ;MAKE ADJUSTMENT IN DEC. EXP
4097 EE1D 34                INR     M
4098 EE1E
4099 EE1E              ;CONTINUE
4100 EE1E
4101 EE1E 21BD3E     TEST5: LXI     H,FTEN      ;SET UP POINTER NEXT OPER.
4102 EE21 CF         TEST4: RST     1           ;EXTRACT DIGIT
4103 EE22 1E08              MVI     E,8
4104 EE24 CD78ED            CALL    FIX         ;FIX IT!
4105 EE27 2A2BB0            LHLD    BUFFER      ;GET BUFFER POINTER
4106 EE2A 77                MOV     M,A         ;STORE DIGIT
4107 EE2B 23                INX     H           ;INC. POINTER
4108 EE2C 222BB0            SHLD    BUFFER      ;SAVE POINTER
4109 EE2F AF                XRA     A           ;CLEAR DIGIT
4110 EE30 1E08              MVI     E,8         ;NOW REFLOAT
4111 EE32 CD62ED            CALL    FLT
4112 EE35 211330            LXI     H,DEGIT     ;DECR. DIGIT COUNT
4113 EE38 35                DCR     M
4114 EE39 21BD3E            LXI     H,FTEN      ;10.0
4115 EE3C F221EE            JP      TEST4       ;7 DIGITS?
4116 EE3F
4117 EE3F              ;****************************************************
4118 EE3F              ;
4119 EE3F              ;NOW START THE FIXED POINTER CONVERSION
4120 EE3F              ;
4121 EE3F              ;****************************************************
4122 EE3F
4123 EE3F              ;INIT. BUFFER POINTER
4124 EE3F
4125 EE3F 3E07       FORMAT: MVI    A,7         ;INIT. DIGIT COUNT
4126 EE41 321330            STA     DEGIT
4127 EE44 2104B0            LXI     H,CNBF      ;CONVERSION BUFFR AREA
4128 EE47 222BB0            SHLD    BUFFER      ;STORE IT
4129 EE4A 3A1930            LDA     FRAC        ;FRACTION FIELD
4130 EE4D A7                ANA     A           ;SET FLAGS
4131 EE4E 3A1AB0            LDA     EXP         ;LOAD EXPONENT
4132 EE51 2005             JRNZ     FOR1        ;NO TEST
4133 EE53 FE01              CPI     1           ;TEST
4134 EE55 FAC4EF            JM      TESTZ       ;<1
4135 EE58 FE01       FOR1:  CPI     1
4136 EE5A 47                MOV     B,A
4137 EE5B              ;
4138 EE5B              ;NOW DETERMINE HOW MANY SPACES PRECEDE THE SIGN
4139 EE5B              ;
4140 EE5B
4141 EE5B 211830            LXI     H,FIELD
4142 EE5E 7E                MOV     A,M         ;FIELD
4143 EE5F 23                INX     H           ;POINTING TO FRAC
4144 EE62 FA64EE            JM      FM1         ;EXP>2
4145 EE63
4146 EE63              ;SPACES=FIELD-FRAC-2
4147 EE63
4148 EE63 90                SUB     B           ;SUBTRACT EXP
4149 EE64 96         FM1:   SUB     M           ;FIELD-(EXP?)-FRAC
4150 EE65 DE02              SBI     2           ;SPACES=
4151 EE67                                        ;FIELD-(EXP?)-FRAC-2
4152 EE67
4153 EE67              ;
4154 EE67              ;SET UP OUTPUT BUFFER AREA
4155 EE67              ;SPACE COUNT IN A REG.
4156 EE67
4157 EE67 210E30            LXI     H,OUBF      ;OUTPUT BUFFER AREA POINTER
4158 EE6A 0EF0              MVI     C,' '-30H   ;WRITE SPACES TO BUFFER
4159 EE6C 2805       FM2:   JRZ     SI          ;NO SPACES
4160 EE6E 71                MOV     M,C         ;WRITE SPACES
4161 EE6F 3D                DCR     A
4162 EE70 23                INX     H
4163 EE71 20F9              JRNZ    FM2         ;CONTINUE UNTIL DONE
4164 EE73
4165 EE73              ;TEST THE SIGN
4166 EE73
4167 EE73 3A2330     SI:    LDA     VALE+1      ;LOAD MANTISSA1
```

```
4168 EE76 EE80                    XRI     30H
4169 EE78
4170 EE78             ;IF SIGN FLAG SET NUMBER >=0
4171 EE78
4172 EE78 FA7DEE                  JM      POSIT
4173 EE7B 0EFD                    MVI     C,'-'-30H
4174 EE7D 71          POSIT:      MOV     M,C      ;WRITE EITHER SPACE OR '-'
4175 EE7E 23                      INX     H        ;UPDATE POINTER
4176 EE7F
4177 EE7F             ;LOAD THE DECIMAL EXPONENT AND DETERMINE
4178 EE7F             ;WHETHER THE INTEGER FIELD IS TO BE WRITTEN.
4179 EE7F
4180 EE7F 3A1BB0                  LDA     DIGIT    ;DIGIT CARRIED IN D REG.
4181 EE82 57                      MOV     D,A
4182 EE83 78                      MOV     A,B      ;EXP TO ACC.
4183 EE84 A7                      ANA     A
4184 EE85 FAA0EE                  JM      FRACTION;IF >=1 TRUE
4185 EE88 2816                    JRZ     FRACTION
4186 EE8A
4187 EE8A             ;START OF THE INTEGER FIELD
4188 EE8A
4189 EE8A 7A          INTEGER:    MOV     A,D      ;TEST DIGIT
4190 EE8B A7                      ANA     A
4191 EE8C 0E30                    MVI     C,'0'-30H ;0
4192 EE8E 280B                    JRZ     ASC0     ;JUMP IF NO DIGITS LEFT
4193 EE90 15                      DCR     D        ;DIGIT=DIGIT-1
4194 EE91 E5                      PUSH    H        ;SAVE BUFFER POINTER
4195 EE92 2A2BB0                  LHLD    BUFFER   ;GET CNBF POINTER
4196 EE95 4E                      MOV     C,M      ;MOVE DIGIT TO C REG
4197 EE96 23                      INX     H        ;CNBF=CNBF+1
4198 EE97 222BB0                  SHLD    BUFFER   ;STORE
4199 EE9A E1                      POP     H        ;RESTORE POINTER
4200 EE9B 71          ASC0:       MOV     M,C      ;WRITE TO BUFFER AREA
4201 EE9C 23                      INX     H        ;UPDATE POINTER
4202 EE9D 05                      DCR     B        ;EXP=EXP-1
4203 EE9E 20EA                    JRNZ    INTEGER  ;CONTINUE INTEGER FIELD
4204 EEA0
4205 EEA0             ;*************************************************
4206 EEA0             ;
4207 EEA0             ;THIS ROUTINE FORMATS THE FRACTION PART
4208 EEA0             ;
4209 EEA0             ;*************************************************
4210 EEA0
4211 EEA0 36FE        FRACTION:   MVI     M,'.'-30H; STORE DECIMAL POINT
4212 EEA2 23                      INX     H        ;UPDATE POINTER
4213 EEA3
4214 EEA3             ;THE OPERATION NOW CONSISTS OF MANIPULATING
4215 EEA3             ;THE EXP AND THE FRAC FIELD
4216 EEA3
4217 EEA3 3A19B0                  LDA     FRAC     ;GET THE FRACTION FIELD LENGTH
4218 EEA6 A7                      ANA     A        ;TEST FRAC
4219 EEA7 2833                    JRZ     CHAR1+1  ;DONE IF ZERO
4220 EEA9 4F                      MOV     C,A      ;STORE IN THE C REG
4221 EEAA 78                      MOV     A,B      ;EXP TO ACC.
4222 EEAB A7          ASC1:       ANA     A        ;SET FLAGS
4223 EEAC FAC6EE                  JM      FRAC0    ;EXP<0?
4224 EEAF 0D          LPDG:       DCR     C        ;NO FRAC=FRAC-1
4225 EEB0 7A                      MOV     A,D
4226 EEB1 2322                    JRZ     CHARP    ;JMP ZERO DIGIT TEST
4227 EEB3 FE01                    CPI     1        ;DIGIT>0?
4228 EEB5 3819                    JRC     SPACE    ;NO-OUTPUT SPACE
4229 EEB7
4230 EEB7             ;IF DIGIT>0 TRANSFER CHARACTER TO BUFFER
4231 EEB7
4232 EEB7             ;*************************************************
4233 EEB7             ;               GET DIGIT
4234 EEB7             ;*************************************************
4235 EEB7
4236 EEB7 E5                      PUSH    H        ;SAVE CURRENT BUFFER
4237 EEB8                                          ;POINTER
4238 EEB8 2A2BB0                  LHLD    BUFFER   ;LOAD CNBF PT.
4239 EEBB 5E                      MOV     E,M      ;MOVE DIGIT TO E REG.
4240 EEBC 23                      INX     H        ;CNBF=CNBF-1
4241 EEBD 222BB0                  SHLD    BUFFER   ;SAVE
4242 EEC0 E1                      POP     H        ;RESTORE BUFFER PT.
```

```
4243 EEC1 73               MOV    M,E       ;STORE DIGIT
4244 EEC2 23               INX    H
4245 EEC3 15               DCR    D         ;DIGIT=DIGIT-1
4246 EEC4 18E9              JMPR   LPDG      ;LOOP
4247 EEC6 3630      FRAC0:  MVI    M,'0'-30H;'0' TO BUFFER
4248 EEC8 23               INX    H         ;OUBF=OUBF-1
4249 EEC9 04               INR    B         ;EXP=EXP+1
4250 EECA 0D               DCR    C         ;FRAC=FRAC-1
4251 EECB 78               MOV    A,B       ;LOAD EXP
4252 EECC 20DD             JRNZ   ASC1
4253 EECF 180B             JMPR   CHAR1     ;OTHERWISE
4254 EED0
4255 EED0 36F0      SPACE:  MVI    M,' '-32H
4256 EED2 23               INX    H
4257 EED3 18DA             JMPR   LPDG      ;LOOP
4258 EED5
4259 EED5 FE01      CHART:  CPI    1         ;NO- =1
4260 EED7 3006             JRNC   EQONE     ;ON-SPACE TO MEM.
4261 EED9 36F0             MVI    M,' '-32H
4262 EEDB 23       CHAR1:  INX    H
4263 EEDC 36FF             MVI    M,0FFH    ;DELIMITER
4264 EEDE C9               RET
4265 EEDF
4266 EEDF E5        EQONE:  PUSH   H         ;SAVE PT.
4267 EEE0 2A2BB0           LHLD   BUFFER    ;CNBF PT.
4268 EEE3 5E               MOV    E,M       ;GET DIGIT
4269 EEE4 E1               POP    H         ;RESTORE PT.
4270 EEE5 73               MOV    M,E       ;STORE DIGIT
4271 EEE6 18F3             JMPR   CHAR1
4272 EEE8 80000000 TABLE:  DB     80H,0,0,0            ;.5
4273 EEEC 7C40CCCD         DB     7CH,40H,0CCH,0CDH; .25
4274 EEF0 7923D72A         DB     79H,23H,0D7H,0AH         ;.225
4275 EEF4 763312EF         DB     76H,33H,12E,6FH ;.0005
4276 EEF8 72513713         DB     72H,51H,037H,13H; .00005
4277 EEFC 6F27C5AC         DB     6FH,27H,0C5H,0ACH; .000005
4278 EF00 6C06373D         DB     6CH,06H,37H,03DH; .0000005
4279 EF04
4280 EF04 3E01      TESTZ:  MVI    A,1
4281 EF06 321AB0           STA    EXP       ;EXP=1
4282 EF09 2A2BB0           LHLD   BUFFER
4283 EF0C 0E07             MVI    C,7
4284 EF0E AF               XRA    A         ;A=0
4285 EF0F 77        TEZ:    MOV    M,A
4286 EF10 23               INX    H
4287 EF11 0D               DCR    C
4288 EF12 20FB             JRNZ   TLZ
4289 EF14 C33FFE           JMP    FORMAT
4290 EF17 6856EFAD RNDO:   DB     68H,56H,6FH,0ADH
4291 EF1B CDBCED   TYOUT:  CALL   OU
4292 EF1E 210EB0           LXI    H,OUBF
4293 EF21 7E        TYO:    MOV    A,M
4294 EF22 FEFF             CPI    -1
4295 EF24 C8               RZ
4296 EF25 C630             ADI    30H
4297 EF27 4F               MOV    C,A
4298 EF28 E5               PUSH   H
4299 EF29 CDFAEC           CALL   PROUT
4300 EF2C E1               POP    H
4301 EF2D 23               INX    H
4302 EF2E 18F1             JMPR   TYO
4303 EF30 0611      BBCD:   MVI    B,11H
4304 EF32 CD3EEF           CALL   BCD
4305 EF35 4F               MOV    C,A
4306 EF36 0611      BCB:    MVI    B,11H
4307 EF38 CD3EEF   NEXT:   CALL   BCD
4308 EF3B 67               MOV    H,A
4309 EF3C 69               MOV    L,C
4310 EF3D C9               RET
4311 EF3E AF        BCD:    XRA    A
4312 EF3F 05        CVT:    DCR    B
4313 EF40 C8               RZ
4314 EF41 29               DAD    H
4315 EF42 8F               ADC    A
4316 EF43 27               DAA
4317 EF44 30F9             JRNC   CVT
```

```
4318 EF46 23            INX     H
4319 EF47 18F6          JMPR    CVT
4320 EF49   0000        END
```

TOTAL ERRORS=00

| | | | | | | | |
|---|---|---|---|---|---|---|---|
| A1    | L 2EC1 | A3    | L 0EC5 | A5    | L 2EC9 | A7    | L 3ECD |
| A9    | L 0ED1 | A950  | L EC0F | AAVE  | L E3AA | ABS   | L 23FD |
| ACC1  | L 103D | ACC2  | L 103E | ACC3  | L 103F | ACCE  | L 103B |
| ACCS  | L 148C | AD    | L 0C77 | ADD10 | L 0D0C | ADD11 | L 0D15 |
| ADD12 | L 0D1B | ADD17 | L 0D29 | ADD2  | L 0CAE | ADD3  | L 0CCD |
| ADD6  | L 0A92 | ADD9  | L 0CFE | ADDA  | L 2A9E | ADDF  | L EAD5 |
| ADDIN | L 04F0 | ADRH  | L B21E | ADRL  | L B01D | ADSRP | E 0001 |
| AECH  | L E3B6 | AGAIN | L 0431 | ALLIN | L 069F | ALOSS | L 2614 |
| ALTOT | L 030B | ALTRM | L 1040 | ANGRG | E 0000 | ARCTA | L 2EE1 |
| ASC0  | L EE93 | ASC1  | L EEA3 | ASLH  | L E332 | ASLL  | L E3AE |
| ASPL  | L E3A6 | AUTO  | L 043C | AVEBN | L 13A6 | AVEL  | L 13AE |
| AVEL2 | L 10BA | AVEL3 | L 1036 | AVEL4 | L 10B2 | B1    | L 03CE |
| B106  | L 027C | B3    | L 03D2 | B5    | L 0BD6 | B7    | L 03DA |
| B9    | L 0BDE | BACK  | L 0B35 | BACK2 | L 0BEB | BAK60 | L E68E |
| BBCD  | L EF30 | BC3   | L EF36 | BCD   | L EF3E | BCDBN | L 04AD |
| BCOUT | L 04C4 | BDIGT | L 04E5 | BINB2 | L 04CC | BINB3 | L 04D2 |
| BINBC | L 04C6 | BINIM | L 1003 | BINRL | L 1009 | BELO  | L 063B |
| BKSCN | L 0107 | BLANK | L 02D6 | BNEGP | L EB75 | BNFRQ | L 2306 |
| BNHI  | L 20E4 | BNLOW | L 22E0 | BNMED | L 20E2 | BNPOS | L E4FB |
| BNSPL | L 20E8 | BNZRO | L B9EF | BRGIN | L E5F2 | BRGUP | L ECCE |
| BUFFE | L B023 | C1    | L 0FC6 | CALC  | L 0677 | CALCA | L 096F |
| CALCB | L E993 | CALCX | L E99D | CALCY | L E993 | CALZN | L 072A |
| CAP   | L 06DD | CEXIT | L 022D | CHAD  | L EDB4 | CHAR1 | L EEDB |
| CHART | L EED5 | CHS   | L CBFA | CKSKP | L E863 | CLEAR | L 2326 |
| CLR1  | L 231E | CLRF  | L E39D | CLRKB | L 2193 | CNBF  | L 3004 |
| CODER | L 1063 | COMM0 | L E2C2 | COMM1 | L E9A4 | COMM2 | L 30AA |
| COMP  | L 0D8D | COMP1 | L 0D92 | COND  | L 2AEB | COND1 | L EE01 |
| CONFL | L 0FBB | CONOT | E D0E0 | CONST | E D2E1 | CORR  | L 0509 |
| CRAM  | L 105D | CRAM2 | L 106D | CURV1 | L F751 | CURV2 | L E755 |
| CURV3 | L E759 | CVT   | L EF3F | CZERO | L 0FB5 | D525  | L E910 |
| D950L | L EC22 | D950Z | L EB2A | DATA  | L 3541 | DEGIT | L B01B |
| DELAY | L 01E3 | DELFC | L 0BE6 | DELP3 | L 21E6 | DELP4 | L 01EC |
| DHIGE | L 0711 | DIGIT | L 0220 | DIGT1 | L 01F6 | DIRCT | L EA33 |
| DIV   | L 0C5B | DIVX  | L 0E3A | DIVX1 | L 0E79 | DIVX2 | L 0E93 |
| DIVX3 | L 0BA5 | DIVX4 | L 2E36 | DLOW  | L 071A | DLOW1 | L 271B |
| DMODE | L 213D | DOW1  | L 0423 | DOWN  | L 241E | DRAM  | L 234C |
| DRM12 | L 20BC | DRM25 | L 2030 | DRM30 | L 205C | DRM34 | L 2250 |
| DRTEX | L EC3D | DSPLY | L 333C | E106  | L 094A | E900  | L 0BF5 |
| EC1   | L 0836 | EC2   | L 08D3 | EC03  | L E270 | ECHOL | L E464 |
| ECHOR | L E43A | ECHOS | L E45C | EDSPL | L E3F6 | ELMIT | L 0376 |
| EMSG  | L 3041 | ENDCK | L EA63 | ENT   | L 225F | ENTER | L 1000 |
| EOUT  | L 092C | EPOIN | L 07CA | EQONE | L EEDF | ER1   | L 2699 |
| ER106 | L 224F | ERANG | L E7CF | ERLBN | L 1006 | ERR   | L 0390 |
| ERR1  | L 203D | ERRHI | L 2364 | ERRLO | L 236D | ERROR | L 0030 |
| ESTRT | L E723 | EVALU | L 0BE1 | EWAIT | L E735 | EX1   | L E31C |
| EXIT  | L 019B | EXP   | L B01A | F250  | L E879 | F2PI  | L 205E |
| F573  | L 0ED5 | FFLOW | L EADE | FFMIN | L EAB6 | FIELD | L B01B |
| FINNY | L 0BB2 | FIX   | L ED78 | FIX1  | L EDA5 | FLASH | L 1037 |
| FLDC  | L 0BBC | FLDC1 | L 0BBF | FLT   | L ED62 | FLT3  | L E130 |
| FLTA  | L 20EB | FLTB  | L 20EF | FLTFR | L 1051 | FLTIM | L 1045 |
| FLTIR | L 1057 | FLTPH | L 1083 | FLTPI | L 107B | FLTPR | L 107F |
| FLTR1 | L 1077 | FLTRF | L 105F | FLTRL | L 1041 | FLTR2 | L 0013 |
| FLTX1 | L 105F | FLTX2 | L 1073 | FLTXM | L 20F3 | FLZ   | L 1040 |
| FM1   | L EE64 | FM2   | L EE6C | FNDRG | L 09E4 | FONE  | L 0EDD |
| FOR1  | L EE58 | FORMA | L 2E3F | FRAC  | L B219 | FRACA | L EEC6 |
| FRACT | L EEA0 | FRBIN | L 1207 | FREQ  | E 7200 | FRONE | L 006B |
| FRQST | L 10AC | FSQ1  | L 2F7C | FTEN  | L 0EBD | FTWO  | L 2062 |
| HDLY  | L 050F | HERE  | L 0605 | HI    | L 0489 | HLOW  | L 230D |
| HOLDN | L 24FE | IAADD | L 0F93 | IAMUL | L 0F9F | IEXP  | L B01C |
| IMHI  | E A003 | IMLOW | L A002 | IMP00 | L 0334 | IMRAM | L 132E |
| INC1  | L 040D | INCDN | L 2396 | INCUP | L 038C | INDCT | L E585 |
| INITL | L 03A3 | INLPR | L ED51 | INTAR | L 3519 | INTEG | L EE3A |
| K1999 | L 0A4F | KBLP1 | L 010C | KBLP2 | L 010F | KDBNC | L 010F |
| KSCAN | L 00FE | KUPT  | L 03B6 | KYB1  | E B001 | LADC  | L 0FEA |
| LASTS | L 2333 | LCDR  | L EC37 | LIMIT | L 034E | LOAD0 | L 03F0 |
| LOD   | L 0C18 | LOD1  | L 0C25 | LOG   | L 0B36 | LOG1  | L 0B50 |
| LOGO  | L 0B42 | LOOP  | L 0234 | LOTAB | L E706 | LOUT  | L 0B0A |
| LOW   | L 2476 | LOWFR | L 24F4 | LPCR  | L 032F | LPDG  | L EEAF |
| LPSO  | L E353 | LPZ   | L 0337 | LSH   | L 0D5C | LSH1  | L 0D5F |

| | | | | | | | |
|---|---|---|---|---|---|---|---|
| LSTRC | L 1034 | M573 | L 0F28 | MAVE | L E12C | MDEX | L 2D36 |
| MINUS | L 0A96 | MPI2 | L 0ED9 | MPROG | L 3003 | MRDY | L E517 |
| MRLN | L E33E | MSECC | L E4B5 | MSECL | L E4B8 | MSG | L 2052 |
| MSGBA | L 0013 | MSGE1 | L 0033 | MSGE2 | L 0023 | MSGE3 | L 2023 |
| MSGEI | L 025A | MSGL | L 2056 | MSGOT | L ED29 | MSLE | L E132 |
| MSLL | L E134 | MULP2 | L 1094 | MULP3 | L 1091 | MULP1 | L 1093 |
| MULP2 | L 1092 | MULP3 | L 1091 | MULX | L 2DE3 | MULX1 | L 2E08 |
| MULX2 | L 0E0B | MULX3 | L 0E1A | MULX5 | L 0E15 | NCARD | L 00A2 |
| NCHG | L 0FDC | NDFLT | L 0B25 | NE3 | L 0FE2 | NEGDG | L E3A8 |
| NETW | L 0374 | NEWL | L EA73 | NEWRM | L 3000 | NEXT | L EF38 |
| NINE0 | L 0860 | NINE1 | L 0858 | NMINS | L 059E | NNEW | L 035F |
| NORM | L 0DA0 | NORM1 | L 0DA2 | NORM2 | L 0D31 | NORM3 | L 0D3E |
| NORPT | L 0629 | NROM | L E001 | NSTEP | L 03A3 | NTALZ | L 031D |
| NTBLK | L 02DF | NTFR | L 02E8 | NTOVF | L 0237 | O050 | L E38C |
| ODMOD | L 01CD | OP1S | L 1094 | OP2S | E 1093 | OP3S | E 1092 |
| OP4S | E 1091 | OTCK | L 0452 | OTEXT | L E407 | OTMSJ | L 10A2 |
| OTRM1 | L 1025 | OTRM2 | L 1026 | OTRM3 | L 1027 | OTRM4 | L 1028 |
| OTRM5 | L 1029 | OU | L ED3C | OUBF | L 300E | OUI | L 23D3 |
| OUT2 | L 02A0 | OUTD | L 0628 | OUTFR | E 300B | OUTI | L 063A |
| OUTIM | E 9008 | OUTPL | E 3010 | OUTRL | L 9200 | OUTRM | L 1024 |
| OVER | L 1239 | OVERI | L 2060 | OVRFL | L 0366 | OVRFO | L E806 |
| OVRG1 | L 09A9 | OVRRG | L 09A8 | OVJN | L 0D58 | P500 | L D0CF |
| P501 | L E13C | P502 | L E193 | P503 | L E1DA | P504 | L E211 |
| P505 | L E9FC | P506 | L E3FA | P507 | L E203 | P509 | L E862 |
| P950 | L E306 | PANEL | E 8818 | PBIN1 | L 1002 | PBIN2 | L 1003 |
| PBIN3 | L 1004 | PBIN4 | L 1005 | PBIN5 | L 1006 | PDSPL | L E363 |
| PEXIT | L 0339 | PFOUT | L E960 | PHBIN | L 1043 | PHRAM | L 1030 |
| PINRM | L E620 | POLAR | L 0641 | POSIT | L EE7D | PREX | L 103A |
| PRINT | L 1038 | PROG | L 073E | PROUT | L ECFA | PRTEX | L ECB1 |
| PTLPL | L E372 | PTR | L E080 | PTRCK | L E099 | PTRLP | L E0SE |
| PTRON | L E332 | PTRST | L E099 | QUAD | L E332 | R500 | L E6D3 |
| RAM | S 3033 | RANGE | L 0458 | ROLDN | L 23F6 | ROLSP | L 03E1 |
| RCOND | L 0A63 | RDYIN | L E5D3 | RDYN2 | L E5E3 | RECAL | L 0175 |
| REDU3 | L 240A | REST | L 0ECC | REVOL | L EAAC | RLCTR | L 103E |
| RLHT | E A021 | RLLOW | E A000 | RLOSS | L 2AA2 | RLOWO | L E8E9 |
| RLRAM | L 122A | RMCTR | L 12A0 | RMDIR | L 22EA | RNDA | L 3051 |
| RNDO | L EF17 | RNDR | L 3DDD | RNGE | L 1232 | ROM | S ED62 |
| ROND | L 0DCD | RRAM | L 1255 | RSH | L 2D69 | RSHC | L 2D9B |
| RSH1 | L 2DCD | RSH2 | L 2D79 | RSH3 | L 2D7C | RST1 | L 000B |
| RST2 | L 0010 | RST3 | L 0018 | RST4 | L 0020 | RST5 | L 0028 |
| RST6 | L 0030 | RST7 | L 0038 | RTLOT | L EC4C | RTV06 | L E5BA |
| RTNLO | L 1055 | RTNRM | L 2000 | RTR01 | L 204A | RTR02 | L 2048 |
| RTR03 | L 2046 | RTR04 | L 2044 | RTR05 | L 2042 | RTR06 | L 2040 |
| RTR07 | L 203E | RTR08 | L 203C | RTR09 | L 203A | RTR10 | L 2038 |
| RTR11 | L 2036 | RTR12 | L 2034 | RTR13 | L 2032 | RTR14 | L 2030 |
| RTR15 | L 202E | RTR16 | L 202C | RTR17 | L 202A | RTR18 | L 2028 |
| RTR19 | L 2026 | RTR20 | L 2024 | RTR21 | L 2022 | RTR22 | L 2020 |
| RTR23 | L 201E | RTR24 | L 201C | RTR25 | L 201A | RTR26 | L 2018 |
| RTR27 | L 2016 | RTR28 | L 2014 | RTR29 | L 2012 | RTR30 | L 2010 |
| RTR31 | L 200E | RTR32 | L 200C | RTR33 | L 200A | RTR34 | L 2008 |
| RTR35 | L 2006 | RTR36 | L 2004 | RTR37 | L 2002 | S10 | L 03E2 |
| S506 | L E4D0 | SAVE | L B027 | SB | L 2C74 | SBF | L EAD2 |
| SCALD | L EB96 | SCALE | L 032A | SEC1D | L E4AD | SEC1L | L E4AF |
| SET1 | L 01CB | SETUP | L 30D5 | SETEA | L E80A | SETHI | L 0402 |
| SETLO | L 0406 | SGNNA | L ECD4 | SGNON | L ED13 | SI | L EE73 |
| SF | L 1090 | SIX1 | L 0327 | SKIPS | L 04AC | SLEBN | L 10C4 |
| SIX0 | L 0813 | SPACE | L EED0 | SPCES | L E0CC | SPUP | L E312 |
| SNCOR | L 0A85 | SQRT2 | L 0F97 | SRCH | L EA1F | SRCHL | L EA31 |
| SQRT | L 0F40 | STACK | L 10FF | START | L 3426 | STATS | L 120D |
| SRLEN | L 1002 | STEPS | L 1036 | STNBF | L 12BE | STNBR | L 10AB |
| STEP | L 039E | STOP | L 044F | STORE | L 1010 | STPLO | L E513 |
| STOCR | L 10AA | STR | L 0BEC | STR1 | L 0BED | STRCL | L 0131 |
| STPLP | L E531 | STRTH | L 0440 | STRTL | L 0431 | STSTR | L 0134 |
| STRC | L 0BEA | SWITC | L 0F2D | SWLD | L 1267 | SVMO | L 10EC |
| SVAD | L EDAA | SWTX | L 109D | TABL1 | L E731 | TABL2 | L E734 |
| SVQD | L 10C8 | TABLA | L E7E9 | TABLB | L E775 | TABLE | L EEE8 |
| TABL3 | L E7B1 | TEMP | L 1095 | TEMP2 | L 1099 | TEMP3 | L 1063 |
| TABLS | L E75D | TEST2 | L EDE0 | TEST3 | L EDF0 | TEST4 | L EE21 |
| TEST1 | L EDD2 | TESTZ | L EF04 | TEXP | E 109D | TEZ | L EF0F |
| TEST5 | L EE1E | TMANT | E 1095 | TMP1 | L B01F | TMP2 | L B020 |
| THRSP | L EBE1 | TMP4 | L B026 | TMPX | E 1099 | TOBIG | L EA19 |
| TMP3 | L B021 | TST01 | L EEA0 | TST02 | L E9F7 | TX10 | L EA14 |
| TST | L 2C05 | TYO | L EF21 | TYOUT | L EF18 | TYZOT | L EBAE |
| TYFRQ | L EBEF | UPRV3 | L E833 | VAL1 | L B023 | VAL2 | L B024 |
| UPPNL | L 02C5 | | | | | | |

| | | | | | | | | |
|---|---|---|---|---|---|---|---|---|
| VAL3 | L | 3025 | VALE | L | 3022 | VFIX | L | 2F93 |
| VLDCR | L | 213F | WAIT | L | 352F | WAIT2 | L | E503 |
| WAIT4 | L | E508 | WAIT5 | L | E50C | X1 | L | 3A38 |
| XFER2 | L | E323 | XFER3 | L | E329 | YOUTL | L | E3D9 |
| ZERO | L | 0323 | ZOVER | L | 093F | ZRAM | L | 1038 |
| ZRR | L | 3EB7 | | | | | | |

| | | | | |
|---|---|---|---|---|
| VFIXL | L | 2FA5 | | |
| WAIT3 | L | E504 | | |
| XFER | L | E503 | | |
| ZBIN | L | 104B | | |
| ZRO | L | 23F4 | | |

D. Components List

FIG. 3

| | |
|---|---|
| CPU 52 | Zilog Z-80 |
| Oscillator 102 | ICM 7209 |
| Decoder 106 | 74LS138 and 6440 |
| PROM 54 | 2532 (two) |
| RAM-1 56A | 5101 (two) |
| RAM-2 56B | 5101 (two) |
| OR gates 108, 110 | 74C32 |

FIG. 4

| | |
|---|---|
| Decoder 124 | 6440 |
| Latch 120, 122, 144, 146 | 74C374 |
| Latch 148 | 74174 |
| Adders 134, 136, 138, 140, 142 | 4008 |
| ROM 150 | 2708 |
| D/A 152 | NE5018 |
| Transmission gate 170 | 4066 |
| Op-amp 160 | NE5534 |
| NOR gates 126, 128 | 4001 |
| Potentiometer 164 | 20K |
| 156 | 500 ohm |
| Resistors - 162 | 1 Meg. |
| 158, 166 | 4.99 K |
| 169 | 5.36 K |
| 154 | 16.5 K |
| Capacitor 168 | 27 pf |

FIG. 5

| | |
|---|---|
| Transmission gates - 178, 180, 278, 280, 282, 284, 287 | DG303 |
| Flip-flop 182, 286 | 4013 |
| Op-amp 184, 288, 290 | TL082 |
| OP-amp 202, 208, 248, 250, 264, 266 | NE5532 |
| FET 198, 222 | VN10KM |
| Diode 187, 189 | IN5242 |
| 234, 236 | IN4148 |
| Battery 188, 190 | 2 each 3.6 V |
| Resistors - 172, 291, 293, 295, 297 | 2K |
| 174, 200, 268, 274, 276 | 10K |
| 210 | 2.43K |
| 212, 214 | 1K |
| 209, 216 | 1.74K |
| 228, 230 | 4.99K |
| 244, 246 | 499K |
| 252 | 34.8K |
| 254 | 549K |
| 270 | 17.4K |
| Potentiometers - 176 | 500 |
| 256, 235 | 1K |
| 272 | 10K |
| Capacitors - 206 | 470 microfarad |
| 224, 226 | 10 microfarad |
| 240, 242 | 2 microfarad |
| 260, 262 | 33 microfarad |
| 285 | Select |

FIG. 6

| | |
|---|---|
| A/D converter 300, 310 | ICL7109 |
| Bus Transceiver 370 | 74C245 |
| Latch 330 | 14175 |
| Decoder 320, 340 | 6440 |
| Counter 350 | 4017 |
| Flip-flop 360 | 4013 |
| Inverter 351, 352, 354, 372 | 4069 |
| NOR gate 332 | 4001 |
| OR gate 374 | 4071 |

FIG. 7

| | |
|---|---|
| Display 22, 24, 26 | LCD, FE206-C |
| Display Driver 402, 404, 406 | ICM7211 |
| Bus Transceiver 412, 462 | 74C245 |
| Latch 408, 410 | 14174 |
| Decoder 400 | 6440 |
| Transmission gates - 418, 420, 436, | 4066 |
| Inverters 416, 440, 422 | 4069 |
| Exclusive-NOR gates - 414, 450, 452 | 4077 |
| Resistors - 432, 434 | 47K |
| 438 | 220K |
| 442 | 4.7K |
| 424 | 27K |
| 426 | 10K |

The foregoing description of the invention has been directed to a particular preferred embodiment for purposes of explanation and illustration. It will be apparent, however, to those skilled in this art that many modifications and changes may be made without departing from the scope and spirit of the invention. It is the Applicants' intention in the following claims to cover such equivalent modifications and changes as fall within the scope of the invention as defined by the following claims.

What is claimed is:

1. Test set apparatus, comprising:
measurement terminals for connection to a circuit under test;
means for measuring at a selected measurement frequency the phasor impedance of a circuit under test;
keyboard input means for entering test parameter information, including a measurement frequency value, into the test set;
a microcomputer interfaced to the keyboard input means and the phasor impedance measuring means, and including a memory;
said memory storing test parameter information entered into the test set by said keyboard input means;
said memory further storing a plurality of keyboard selectable program subroutines, each of the program subroutines comprising an instruction set serving upon command from said keyboard input means to instruct predetermined computation processing by the microcomputer, one of the stored program subroutines comprising an instruction set for calculating return loss at the measurement frequency against a predetermined value of resistance;

one of the stored program subroutines comprising an instruction set for calculating return loss against the impedance at the measurement frequency of a predetermined RC network configuration with predetermined values of resistance and capacitance; and one of the stored program subroutines comprising an instruction set for calculating return loss against the impedance at the measurement frequency of a predetermined RC network configuration with user-selected values of resistance and capacitance entered into the test set by said keyboard input means;

said microcomputer calculating the return loss of a circuit under test based upon the phasor impedance measurement using one of the stored program subroutines in memory; and a display interfaced to the microcomputer for producing a visual readout of the calculated return loss.

2. The test set of claim 1, wherein:
said impedance measuring means comprises:

a signal generator, for generating a test signal of a selected measurement frequency;

a current source coupled to said signal generator and connectable to the measurement terminals, for producing measurement current flow through a circuit under test;

a measurement circuit connected to the measurement terminals, for detecting in-phase and quadrature components of the voltage drop that results from measurement current flow; and an analog-to-digital converter for converting the detected voltage drop components to digital values.

3. The test set of claim 2 wherein said return loss calculation function performed by said microcomputer is in accordance with the expression:

$$\text{Return Loss} = 20 \log \left| \frac{Z + Z_{Ref}}{Z - Z_{Ref}} \right|$$

where Z is the measured phasor impedance of a circuit under test, and $Z_{Ref}$ is a reference phasor impedance value.

4. Test set apparatus for measuring the impedance of a balanced circuit under test, comprising:

measurement terminals for connection to a balanced circuit under test;

a signal generator, for generating a test signal of a selected measurement frequency;

a current source coupled to said signal generator and connectable to the measurement terminals, for producing measurement current flow through a balanced circuit under test;

a battery power source for supplying electrical power individually to said current source;

said battery-powered current source being connectable to the measurement terminals during impedance measurement and isolated from ground to permit test set operation in the presence of externally-induced longitudinal voltages on a balanced circuit under test; and a measurement circuit connected to the measurement terminals, for detecting the voltage drop that results from measurement current flow, and producing signals representative of the resistive and reactive components of the impedance of a balanced circuit under test.

5. Test set apparatus, comprising:
measurement terminals for connection to a circuit under test;

means for measuring at a selected measurement frequency the phasor impedance of a circuit under test;

keyboard input means for entering test parameter information into the test set;

a microcomputer interfaced to the keyboard input means and the impedance measuring means, and including a memory for storing test parameter information entered into the test set by said keyboard input means, for storing phasor impedance measurement values, and for storing reference phasor impedance measurement values;

said microcomputer controlling said phasor impedance measuring means to measure the phasor impedance of a circuit under test at a plurality of measurement frequencies within a range of frequencies, and storing the phasor impedance measurements in memory;

said microcomputer calculating the ratio of return power to incident power at each measurement frequency using the stored phasor impedance measurement values and reference phasor impedance measurement values;

said microcomputer weighting each return power ratio with a weighting factor and summing the weighted return power ratios, said microcomputer summing the weighting factors, said microcomputer dividing the sum of the weighted return power ratios by the sum of the weighting factors to produce a weighted-average return power ratio;

said microcomputer calculating the logarithm of the weighted-average return power ratio and multiplying by −10 to calculate a weighted-average return loss over the range of measurement frequencies for the circuit under test; and a display interfaced to the microcomputer for producing a visual readout of the calculated weighted-average return loss as a test result.

6. Test set apparatus, comprising:
measurement terminals for connection to a circuit under test;

means for measuring at a selected measurement frequency the phasor impedance of a circuit under test;

keyboard input means for entering test parameter information into the test set;

a microcomputer interfaced to the keyboard input means and the impedance measuring means, and including a memory for storing test parameter information entered into the test set by said keyboard input means, for storing phasor impedance measurement values, and for storing reference phasor impedance measurement values;

said microcomputer controlling said phasor impedance measuring means to measure the phasor impedance of a circuit under test at a plurality of measurement frequencies within a range of frequencies, and storing the phasor impedance measurements in memory;

said microcomputer calculating the ratio of return power to incident power at each measurement frequency using the stored phasor impedance measurement values and reference phasor impedance measurement values;

said microcomputer summing the calculated return power ratios;

said microcomputer dividing the sum of the return power ratios by the number of calculated return power ratios summed to produce an average return power ratio;

said microcomputer calculating the logarithm of the average return power ratio and multiplying the result by $-10$ to calculate an average return loss over the range of measurement frequencies for the circuit under test; and a display interfaced to the microcomputer for producing a visual readout of the calculated average return loss as a test result.

* * * * *

UNITED STATES PATENT OFFICE
CERTIFICATE OF CORRECTION

Patent No. 4,404,636            Dated September 13, 1983

Inventor(s) Richard H. Campbell, Jr. and John B. Noyes

It is certified that error appears in the above-identified patent and that said Letters Patent are hereby corrected as shown below:

Abstract, line 17, "to" should read --of--.
Column 1, line 27, "in" should read --is--.
Column 5, line 36, "into memory input" should read
    --into memory, input--.
Column 11, line 6, "NMI" should read --$\overline{\text{NMI}}$--;
Column 11, line 43, "but" should read --bus--.
Column 15, line 14, "0.600" should read --.600--;
Column 15, line 14, "0.072" should read --.072--;
Column 15, line 23, "0.604" should read --.604--
Column 16, line 20, "1-0-1" should read --1-0-1--.
Column 19, line 44, "Swee$\overline{\text{p}}$) "LOS" APRL (average power
    return loss)" should read --sweep)--;
Column 19, line 45, add the following line
    --"LOS" for APRL (average power return loss)--.

Signed and Sealed this

Twenty-third Day of October 1984

[SEAL]

Attest:

GERALD J. MOSSINGHOFF

Attesting Officer    Commissioner of Patents and Trademarks